(12) United States Patent
Seo et al.

(10) Patent No.: US 9,130,184 B2
(45) Date of Patent: Sep. 8, 2015

(54) LIGHT-EMITTING DEVICE, ELECTRONIC DEVICE, AND LIGHTING DEVICE UTILIZING PHOSPHORESCENCE

(75) Inventors: Satoshi Seo, Kanagawa (JP); Hideko Inoue, Kanagawa (JP); Hiromi Seo, Kanagawa (JP); Tomoya Yamaguchi, Kanagawa (JP); Satoko Shitagaki, Kanagawa (JP); Takahiro Ushikubo, Tochigi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 592 days.

(21) Appl. No.: 13/457,877

(22) Filed: Apr. 27, 2012

(65) Prior Publication Data

US 2012/0274201 A1 Nov. 1, 2012

(30) Foreign Application Priority Data

Apr. 29, 2011 (JP) ................. 2011-102566

(51) Int. Cl.
*C09K 11/06* (2006.01)
*H01L 51/50* (2006.01)
(Continued)

(52) U.S. Cl.
CPC ............ *H01L 51/5016* (2013.01); *C09K 11/06* (2013.01); *H01L 51/0085* (2013.01); *C09K 2211/1007* (2013.01);
(Continued)

(58) Field of Classification Search
CPC ................. C09K 2211/185; C09K 2211/1044; C09K 2211/1059; H01L 51/0085; H01L 51/5016

USPC ................. 313/498–512; 252/301.16–301.35
See application file for complete search history.

(56) References Cited

U.S. PATENT DOCUMENTS 6,097,147 A 8/2000 Baldo et al.
6,830,828 B2 12/2004 Thompson et al.
(Continued)

FOREIGN PATENT DOCUMENTS

CN 001791655 A 6/2006
CN 001868240 A 11/2006
(Continued)

OTHER PUBLICATIONS

Inoue, H. et al, "A Reaction of Singlet Oxygen with an Unsaturated Organic Molecule, 6.1.4, Quencher and Photosensitizer," *Basic Chemistry Course Photochemistry I*, Maruzen Co., Ltd., Sep. 30, 1999, pp. 106-110 (with English abstract).
(Continued)

*Primary Examiner* — Karabi Guharay
*Assistant Examiner* — Nathaniel Lee
(74) *Attorney, Agent, or Firm* — Husch Blackwell LLP

(57) ABSTRACT

A new light-emitting device utilizing phosphorescence is provided. Further, an electronic device and a lighting device which utilize phosphorescence are provided. One embodiment of the present invention is a light-emitting device including a phosphorescent organometallic iridium complex comprising iridium and either pyrimidine having an aryl group at the 4-position or 1,3,5-triazine having an aryl group at the 2-position. One of nitrogen in the pyrimidine or 1,3,5-triazine is coordinated to the iridium. Also, each of the pyrimidine and 1,3,5-triazine has a substituent such as an alkyl group or an aryl group. Further the ortho position of the aryl group which is bonded to the 4-position of the pyrimidine or the 2-position of the 1,3,5-triazine is bonded to the iridium.

20 Claims, 27 Drawing Sheets

(51) Int. Cl.
*H01L 51/00* (2006.01)
*C09K 11/00* (2006.01)
*H01L 27/32* (2006.01)
*H01L 51/52* (2006.01)

(52) U.S. Cl.
CPC ............ *C09K 2211/1011* (2013.01); *C09K 2211/1029* (2013.01); *C09K 2211/1044* (2013.01); *C09K 2211/185* (2013.01); *H01L 27/3206* (2013.01); *H01L 27/3209* (2013.01); *H01L 51/5068* (2013.01); *H01L 51/5265* (2013.01); *H01L 51/5278* (2013.01); *H01L 2251/5361* (2013.01); *H01L 2251/5384* (2013.01)

(56) References Cited

U.S. PATENT DOCUMENTS

| | | |
|---|---|---|
| 6,902,830 B2 | 6/2005 | Thompson et al. |
| 7,001,536 B2 | 2/2006 | Thompson et al. |
| 7,220,495 B2 | 5/2007 | Tsuboyama et al. |
| 7,291,406 B2 | 11/2007 | Thompson et al. |
| 7,354,662 B2 | 4/2008 | Tsuboyama et al. |
| 7,537,844 B2 | 5/2009 | Thompson et al. |
| 7,659,010 B2 | 2/2010 | Burn et al. |
| 7,883,787 B2 | 2/2011 | Thompson et al. |
| 7,973,319 B2 | 7/2011 | Kashiwabara et al. |
| 8,053,974 B2 | 11/2011 | Seo et al. |
| 8,164,090 B2 | 4/2012 | Iwasaki et al. |
| 8,216,699 B2 | 7/2012 | Burn et al. |
| 8,389,132 B2 | 3/2013 | Seo et al. |
| 8,415,686 B2 | 4/2013 | Kashiwabara et al. |
| 8,889,266 B2 | 11/2014 | Inoue et al. |
| 2005/0003233 A1 | 1/2005 | Igarashi et al. |
| 2005/0221123 A1 | 10/2005 | Inoue et al. |
| 2006/0134464 A1 | 6/2006 | Nariyuki |
| 2007/0129545 A1 | 6/2007 | Inoue et al. |
| 2007/0244320 A1 | 10/2007 | Inoue et al. |
| 2009/0015143 A1 | 1/2009 | Inoue et al. |
| 2009/0039776 A1 | 2/2009 | Yamada et al. |
| 2009/0295282 A1* | 12/2009 | Yoon et al. .............. 313/504 |
| 2010/0105902 A1 | 4/2010 | Inoue et al. |
| 2010/0113779 A1* | 5/2010 | Stossel et al. ............ 544/181 |
| 2011/0082296 A1 | 4/2011 | Inoue et al. |
| 2011/0112296 A1 | 5/2011 | Thompson et al. |
| 2011/0210316 A1 | 9/2011 | Kadoma et al. |
| 2011/0260140 A1* | 10/2011 | Lecloux et al. .............. 257/40 |
| 2011/0309345 A1 | 12/2011 | Balaganesan et al. |
| 2012/0061707 A1 | 3/2012 | Seo et al. |
| 2012/0098417 A1 | 4/2012 | Inoue et al. |
| 2012/0193613 A1 | 8/2012 | Kadoma et al. |
| 2012/0197020 A1 | 8/2012 | Osaka et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0208999 A1 | 8/2012 | Konno |
| 2012/0217487 A1 | 8/2012 | Yamazaki et al. |
| 2012/0242219 A1 | 9/2012 | Seo et al. |
| 2012/0248421 A1 | 10/2012 | Yamazaki et al. |
| 2012/0256535 A1 | 10/2012 | Seo et al. |
| 2012/0277427 A1 | 11/2012 | Inoue et al. |
| 2013/0165653 A1 | 6/2013 | Inoue et al. |
| 2013/0200340 A1 | 8/2013 | Otsu et al. |
| 2013/0207138 A1 | 8/2013 | Kashiwabara et al. |
| 2014/0332832 A1 | 11/2014 | Kashiwabara et al. |

FOREIGN PATENT DOCUMENTS

| | | |
|---|---|---|
| CN | 101151270 A | 3/2008 |
| CN | 101163711 A | 4/2008 |
| CN | 101270133 A | 9/2008 |
| EP | 1672962 A | 6/2006 |
| EP | 1 873 163 A1 | 1/2008 |
| EP | 2 254 173 A1 | 11/2010 |
| EP | 2509397 A | 10/2012 |
| JP | 2003-109758 A | 4/2003 |
| JP | 2005-255890 | 9/2005 |
| JP | 2006-120905 A | 5/2006 |
| JP | 2010-93070 | 4/2010 |
| JP | 2012-36164 | 2/2012 |
| TW | I231157 B | 4/2005 |
| WO | WO 00/70655 A2 | 11/2000 |
| WO | WO-2004/101707 | 11/2004 |
| WO | WO 2006/098460 A1 | 9/2006 |
| WO | WO 2006/104177 A1 | 10/2006 |

OTHER PUBLICATIONS

Zhang, G-L et al, "Synthesis and Luminescence Property of a New Yellow Phosphorescent Iridium(III) Pyrazine Complex," Chemical Journal of Chinese Universities, vol. 25, No. 3, Mar. 1, 2004, pp. 397-400 (with English translation).

Bredereck et al., "Formamide Reactions, VIII A New Pyrimidine-Synthesis," *Chemische Berichte*, 1957, vol. 90, pp. 942-952 (with English translation).

Bredereck et al., "Formamide Reactions, VIII A New Pyrimidine-Synthesis," *Chemische Berichte*, 1957, vol. 90, pp. 942-952.

Chen et al., "Aggregation-induced emission of ruthenium(II) polypyridyl complex $[Ru(bpy)_2(pzta)]^{2+}$," *Inorganic Chemistry Communications*, Oct. 1, 2010, vol. 13, pp. 1140-1143.

Schwalbe et al., "Ruthenium polypyridine complexes of tris-(2-pyridyl)-1,3,5-triazine—unusual building blocks for the synthesis of photochemical molecular devices," *Dalton Transactions*, 2009, pp. 4012-4022.

Singh et al., "Tuned Helical Array of $Rh^{III}/Ir^{III}$ Cp Complexes with Polypyridyl Ligands," *European Journal of Inorganic Chemistry*, 2006, No. 19, pp. 3954-3961.

Berger et al., "Unusual electrochemical and spectroscopic behavior in a ligand-bridged binuclear complex of ruthenium (II): tetrakis (2,2'-bipyridine)-(μ-2,4,6-tris(2-pyridyl)triazine)diruthenium(II)," *Inorganica Chimica Acta*, 1996, vol. 241, pp. 1-4.

Hino, Y. et al., "Red Phosphorescent Organic Light-Emitting Diodes Using Mixture System of Small-Molecule and Polymer Host," Japanese Journal of Applied Physics, 2005, vol. 44, No. 4B, pp. 2790-2794.

Chinese Office Action re Application No. CN 201210128495.7, dated Nov. 27, 2014.

Niu, Y.-H. et al., "Highly Efficient Red Electrophosphorescent Devices Based on an Iridium Complex with Trifluoromethyl-Substituted Pyrimidine Ligand," Applied Physics Letters, Aug. 30, 2004, vol. 85, No. 9, pp. 1619-1621.

Caygill, G.B. et al., "Cyclometallated Compounds IV. Cyclopalladation of Phenylpyrimidines and X-Ray Structure of a Doubly Cyclopalladated Derivative of 4,6-diphenylpyrimidine," Journal of Organometallic Chemistry, Feb. 13, 1990, vol. 382, No. 3, pp. 455-469.

Kawanishi, Y. et al., "Dependence of Spectroscopic, Electrochemical, and Excited-State Properties of Tris Chelate Ruthenium(II) Complexes on Ligand Structure," Inorganic Chemistry, 1989, vol. 28, No. 15, pp. 2968-2975.

Kozhevnikov, V.N. et al., "Highly Luminescent Mixed-Metal Pt(II)/Ir(III) Complexes: Bis-Cyclometalation of 4,6-Diphenylpyrimidine as a Versatile Route to Rigid Multimetallic Assemblies," Inorganic Chemistry, 2011, vol. 50, No. 13, pp. 6304-6313.

Chinese Office Action (Application No. 201210128495.7) Dated Apr. 3, 2015.

* cited by examiner

LIGHT-EMITTING DEVICE, ELECTRONIC DEVICE, AND LIGHTING DEVICE UTILIZING PHOSPHORESCENCE

BACKGROUND OF THE INVENTION

1. Field of the Invention

One embodiment of the present invention relates to a light-emitting device utilizing phosphorescence. The light-emitting device can emit phosphorescence by including a light-emitting element in which an EL layer contains an organometallic iridium complex capable of converting triplet excited energy into luminescence. Further, one embodiment of the present invention relates to an electronic device and a lighting device which utilize phosphorescence.

2. Description of the Related Art

Organic compounds are brought into an excited state by the absorption of light. Through this excited state, various reactions (photochemical reactions) are caused in some cases, or luminescence is generated in some cases. Therefore, the organic compounds have a wide range of applications.

As one example of the photochemical reactions, a reaction of singlet oxygen with an unsaturated organic molecule (oxygen addition) is known (refer to Non-Patent Document 1). Since the ground state of an oxygen molecule is a triplet state, oxygen in a singlet state (singlet oxygen) is not generated by direct photoexcitation. However, in the presence of another triplet excited molecule, singlet oxygen is generated to cause an oxygen addition reaction. In this case, a compound capable of forming the triplet excited molecule is referred to as a photosensitizer.

As described above, for generation of singlet oxygen, a photosensitizer capable of forming a triplet excited molecule by photoexcitation is needed. However, the ground state of an ordinary organic compound is a singlet state; therefore, photoexcitation to a triplet excited state is forbidden transition and generation of a triplet excited molecule is difficult. A compound that can easily cause intersystem crossing from the singlet excited state to the triplet excited state (or a compound that allows the forbidden transition of photoexcitation directly to the triplet excited state) is thus required as such a photosensitizer. In other words, such a compound can be used as the photosensitizer and is useful.

The above compound often exhibits phosphorescence. Phosphorescence refers to luminescence generated by transition between different energies in multiplicity. In an ordinary organic compound, phosphorescence refers to luminescence generated in returning from the triplet excited state to the singlet ground state (in contrast, fluorescence refers to luminescence in returning from the singlet excited state to the singlet ground state). Application fields of a compound capable of exhibiting phosphorescence, that is, a compound capable of converting the triplet excited state into luminescence (hereinafter, referred to as a phosphorescent compound), include a light-emitting element including an organic compound as a light-emitting substance.

This light-emitting element has a simple structure in which a light-emitting layer including an organic compound that is a light-emitting substance is provided between electrodes. This light-emitting element attracts attention as a next-generation flat panel display element in terms of characteristics such as being thin and light in weight, high speed response, and direct current low voltage driving. Further, a display device including this light-emitting element is superior in contrast, image quality, and wide viewing angle.

The light-emitting element including an organic compound as a light-emitting substance has a light emission mechanism that is of a carrier injection type: voltage is applied between electrodes where a light-emitting layer is interposed, electrons and holes injected from the electrodes are recombined to make the light-emitting substance excited, and then light is emitted in returning from the excited state to the ground state. As in the case of photoexcitation described above, types of the excited state include a singlet excited state (S*) and a triplet excited state (T*). The statistical generation ratio thereof in the light-emitting element is considered to be S*:T*=1:3.

At room temperature, a compound capable of converting a singlet excited state into luminescence (hereinafter, referred to as a fluorescent compound) exhibits only luminescence from the singlet excited state (fluorescence), not luminescence from the triplet excited state (phosphorescence). Accordingly, the internal quantum efficiency (the ratio of the number of generated photons to the number of injected carriers) of a light-emitting element including the fluorescent compound is assumed to have a theoretical limit of 25%, on the basis of S*:T*=1:3.

On the other hand, in a case of a light-emitting element including the phosphorescent compound described above, the internal quantum efficiency thereof can be improved to 75% to 100% in theory; namely, the emission efficiency thereof can be 3 to 4 times as much as that of the light-emitting element including a fluorescent compound. Therefore, the light-emitting element including a phosphorescent compound has been actively developed in recent years in order to achieve a highly-efficient light-emitting element (refer to Non-Patent Document 2). An organometallic complex that contains iridium or the like as a central metal is particularly attracting attention as a phosphorescent compound because of its high phosphorescence quantum yield.

REFERENCE

Non-Patent Document

[Non-Patent Document 1] Inoue, Haruo, and three others, *Basic Chemistry Course PHOTOCHEMISTRY I*, pp. 106-110, Maruzen Co., Ltd.

[Non-Patent Document 2] Zhang, Guo-Lin, and five others, *Gaodeng Xuexiao Huaxue Xuebao* (2004), vol. 25, No. 3, pp. 397-400.

SUMMARY OF THE INVENTION

It is an object of one embodiment of the present invention to provide a novel light-emitting device utilizing phosphorescence. Further, it is another object of one embodiment of the present invention to provide an electronic device and a lighting device which utilize phosphorescence.

One embodiment of the present invention is a light-emitting device which includes a phosphorescent organometallic iridium complex where nitrogen at the 3-position of pyrimidine having an aryl group at the 4-position is coordinated to iridium, the pyrimidine has an alkyl group or an aryl group at any one of the 2-position, the 5-position, and the 6-position, and the aryl group at the 4-position of the pyrimidine has an ortho-metalated structure, in which the ortho position of the aryl group is bonded to the iridium.

Note that a phosphorescent organometallic iridium complex that has the above structure is a phosphorescent organometallic iridium complex that has a structure represented by General Formula (G1) below.

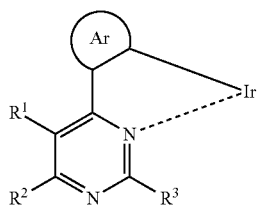

(G1)

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms.)

Another embodiment of the present invention is a light-emitting device which includes a phosphorescent organometallic iridium complex where nitrogen at the 1-position of 1,3,5-triazine having an aryl group at the 2-position is coordinated to iridium, the 1,3,5-triazine has a substituent at the 4-position or the 6-position, and the aryl group has an ortho-metalated structure, in which the ortho position of the aryl group is bonded to the iridium.

Note that a phosphorescent organometallic iridium complex that has the above structure is a phosphorescent organometallic iridium complex that has a structure represented by General Formula (G2) below:

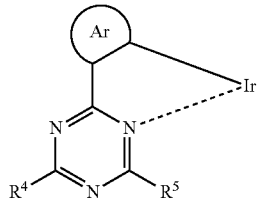

(G2)

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms.)

Note that a phosphorescent organometallic iridium complex having the structure which is represented by General Formula (G1) or (G2) and in which the lowest triplet excited state is formed in the structure is preferable because the phosphorescent organometallic iridium complex can efficiently exhibit phosphorescence.

Here, a phosphorescent organometallic iridium complex having the structure represented by General Formula (G1) above is preferably specifically a phosphorescent organometallic iridium complex represented by General Formula (G3) below.

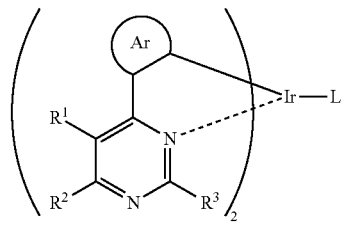

(G3)

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms. L represents a monoanionic ligand.)

Further, a phosphorescent organometallic iridium complex having the structure represented by General Formula (G2) above is preferably specifically a phosphorescent organometallic iridium complex represented by General Formula (G4) below.

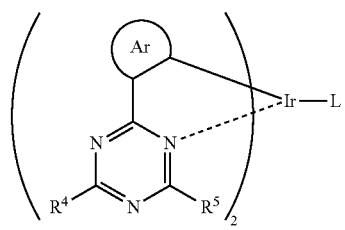

(G4)

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a-substituted or unsubstituted haloalkyl group having 1 to 4 carbon atoms, and a substituted or unsubstituted aryl group having 6 to 10 carbon atoms. L represents a monoanionic ligand.)

Note that the monoanionic ligand L in General Formula (G3) or (G4) is preferably any of a monoanionic bidentate chelate ligand having a beta-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen. Specifically, the monoanionic ligand L is preferably a monoanionic ligand represented by any of Structural Formulae (L1) to (L7) below. Since these ligands have high coordinative ability and can be obtained at low price, they are useful.

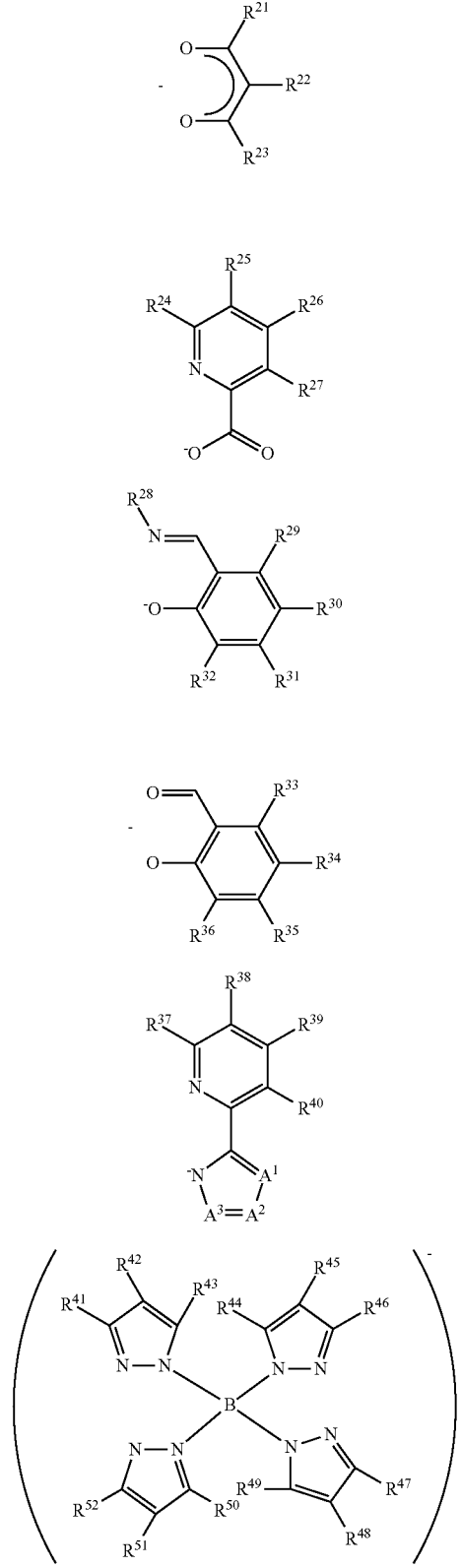

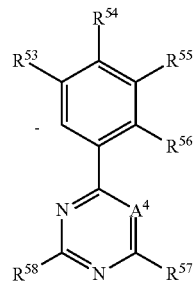

(In the formulae, $R^{21}$ to $R^{58}$ separately represent any of hydrogen, a substituted or unsubstituted alkyl group having 1 to 4 carbon atoms, a halogen group, a vinyl group, a substituted or unsubstituted haloalkyl group having 1 to 4 carbon atoms, a substituted or unsubstituted alkoxy group having 1 to 4 carbon atoms, and a substituted or unsubstituted alkylthio group having 1 to 4 carbon atoms. In addition, $A^1$ to $A^4$ separately represent any of nitrogen, sp² hybridized carbon bonded to hydrogen, and sp² hybridized carbon bonded to a substituent R. The substituent R represents any of an alkyl group having 1 to 4 carbon atoms, a halogen group, a haloalkyl group having 1 to 4 carbon atoms, and a phenyl group.)

Further, a phosphorescent organometallic iridium complex having the structure represented by General Formula (G1) above is preferably specifically a phosphorescent organometallic iridium complex represented by General Formula (G5) below.

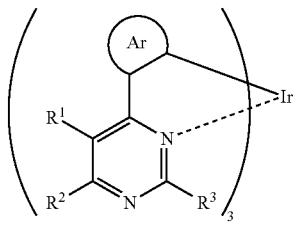

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms.)

Further, a phosphorescent organometallic iridium complex having the structure represented by General Formula (G2) above is preferably specifically a phosphorescent organometallic iridium complex represented by General Formula (G6) below.

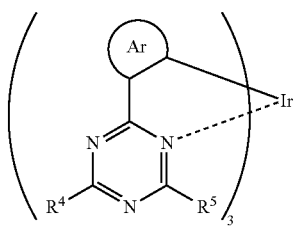

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms.)

Further, a phosphorescent organometallic iridium complex having any of the structures represented by General Formulae (G1) to (G6) above is preferably specifically a phosphorescent organometallic iridium complex represented by any of Structural Formulae (100) to (104) below.

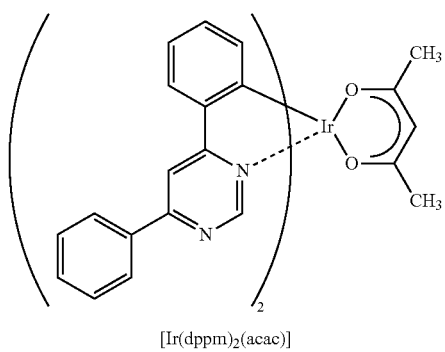

[Ir(dppm)₂(acac)] (100)

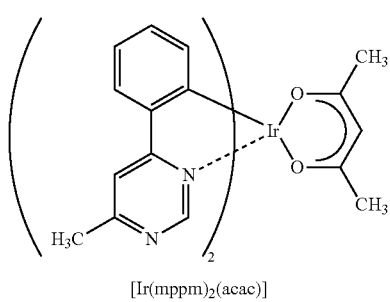

[Ir(mppm)₂(acac)] (101)

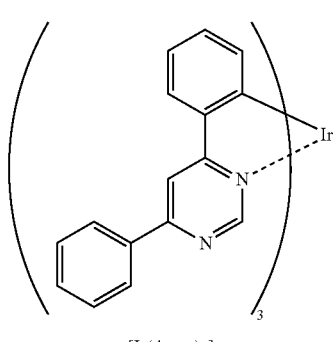

[Ir(dppm)₃] (102)

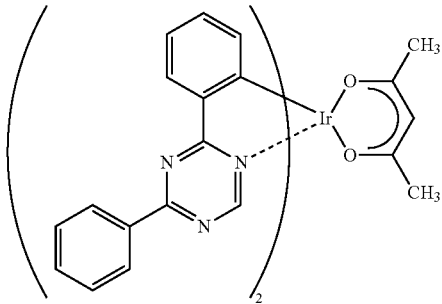

Ir(dptzn)₂(acac) (103)

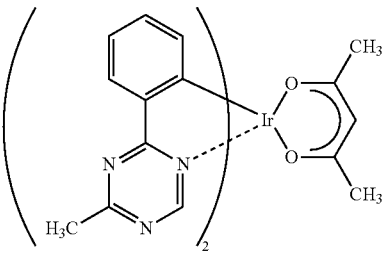

Ir(mptzn)₂(acac) (104)

Further, the phosphorescent organometallic iridium complex is very effective for the following reason: the phosphorescent organometallic iridium complex can emit phosphorescence, that is, it can convert triplet excitation energy into emission and can exhibit emission, and therefore higher efficiency is possible when a light-emitting element including the phosphorescent organometallic iridium complex is applied to a light-emitting device. Thus, the present invention also includes a light-emitting element in which the organometallic complex of one embodiment of the present invention is used.

Further, a light-emitting device that is a further embodiment of the present invention includes a light-emitting element in which an EL layer is interposed between a pair of electrodes. Note that a light-emitting layer included in the EL layer preferably contains the above-described phosphorescent organometallic iridium complex (guest material), a first organic compound, and a second organic compound. In that case, it is possible to improve recombination efficiency in the light-emitting layer and reduce power consumption when, for example, a compound having an electron-trapping property is selected as the first organic compound and a compound having a hole-trapping property is selected as the second organic compound.

Alternatively, the light-emitting layer included in the EL layer preferably contains the above-described phosphorescent organometallic iridium complex (guest material), the first organic compound, and the second organic compound, and a combination of the first organic compound and the second organic compound preferably forms an exciplex. In the light-emitting element, energy transfer efficiency can be improved as a result of energy transfer utilizing an overlap between an emission spectrum of an exciplex and an absorption spectrum of a phosphorescent compound; accordingly, a light-emitting device using the light-emitting element can have lower power consumption.

In other words, the above light-emitting device has the following structure: the EL layer is provided between the pair of electrodes; the EL layer contains the phosphorescent organometallic iridium complex, the first organic compound, and the second organic compound; in the phosphorescent organometallic iridium complex where nitrogen at the 3-position of pyrimidine having an aryl group at the 4-position is coordinated to iridium, the pyrimidine has an alkyl group or an aryl group at any one of the 2-position, the 5-position, and the 6-position, and the aryl group at the 4-position of the pyrimidine has an ortho-metalated structure, in which the ortho position of the aryl group is bonded to the iridium; and the combination of the first organic compound and the second organic compound forms an exciplex.

Further, another mode of the above light-emitting device is a light-emitting device having the following structure: the EL layer is provided between the pair of electrodes; the EL layer contains the phosphorescent organometallic iridium complex, the first organic compound, and the second organic compound; in the phosphorescent organometallic iridium complex, nitrogen at the 1-position of 1,3,5-triazine having an aryl group at the 2-position is coordinated to iridium, the 1,3,5-triazine has a substituent at the 4-position or the 6-position, and the aryl group has an ortho-metalated structure, in which the ortho position of the aryl group is bonded to the iridium; and the combination of the first organic compound and the second organic compound forms an exciplex.

Further, a light-emitting device that is another embodiment of the present invention includes a light-emitting element (so-called tandem light-emitting element) in which between a pair of electrodes a plurality of EL layers containing the above phosphorescent organometallic iridium complex are stacked so as to sandwich a charge-generation layer. Note that a tandem light-emitting element can emit light in a high luminance region with current density kept low. Since current density can be kept low, the light-emitting element can have a long lifetime; thus, a light-emitting device using the light-emitting element can have a low driving voltage and lower power consumption.

In other words, the above light-emitting device has the following structure: the plurality of EL layers are provided between the pair of electrodes; at least one (preferably one, two, or three) of the plurality of EL layers contains the phosphorescent organometallic iridium complex where nitrogen at the 3-position of pyrimidine having an aryl group at the 4-position is coordinated to iridium, the pyrimidine has an alkyl group or an aryl group at any one of the 2-position, the 5-position, and the 6-position, and the aryl group at the 4-position of the pyrimidine has an ortho-metalated structure, in which the ortho position of the aryl group is bonded to the iridium.

Further, another mode of the above light-emitting device is a light-emitting device having the following structure: the plurality of EL layers are provided between the pair of electrodes; at least one (preferably one, two, or three) of the plurality of EL layers contains the phosphorescent organometallic iridium complex where nitrogen at the 1-position of 1,3,5-triazine having an aryl group at the 2-position is coordinated to iridium, the 1,3,5-triazine has a substituent at the 4-position or the 6-position, and the aryl group has an ortho-metalated structure, in which the ortho position of the aryl group is bonded to the iridium.

Note that the present invention includes the light-emitting device including a tandem light-emitting element with any of the following structures: the EL layer containing the phosphorescent organometallic iridium complex emits phosphorescence; the plurality of EL layers include at least one EL layer which does not contain the phosphorescent organometallic iridium complex; the plurality of EL layers include both an EL layer which contains the phosphorescent organometallic iridium complex and which emits phosphorescence, and an EL layer which does not contain the phosphorescent organometallic iridium complex and which emits fluorescence.

Further, a light-emitting device that is a still further embodiment of the present invention includes a light-emitting element in which an EL layer containing the phosphorescent organometallic iridium complex is interposed between a pair of electrodes. Note that one of the pair of electrodes functions as a reflective electrode, the other electrode functions as a semi-transmissive and semi-reflective electrode, and an optical path length between the electrodes is adjusted such that light with wavelengths which differ depending on the light-emitting elements can be emitted. When such a light-emitting element is applied to a light-emitting device (so-called microcavity light-emitting device), emission intensity with a predetermined wavelength in the front direction can be increased, whereby power consumption can be reduced. The above structure is particularly useful in the case of being applied to a color display (image display device) including pixels of three or more colors.

That is, the above light-emitting device includes a first light-emitting element including a reflective electrode, a first transparent conductive layer formed in contact with the reflective electrode, an EL layer formed in contact with the first transparent conductive layer, and a semi-transmissive and semi-reflective electrode formed in contact with the EL layer; a second light-emitting element including the reflective electrode, a second transparent conductive layer formed in contact with the reflective electrode, the EL layer formed in contact with the second transparent conductive layer, and the semi-transmissive and semi-reflective electrode formed in contact with the EL layer; and a third light-emitting element including the reflective electrode, the EL layer formed in contact with the reflective electrode, and the semi-transmissive and semi-reflective electrode formed in contact with the EL layer. The EL layer contains a phosphorescent organometallic iridium complex where nitrogen at the 3-position of pyrimidine having an aryl group at the 4-position is coordinated to iridium, the pyrimidine has an alkyl group or an aryl group at any one of the 2-position, the 5-position, and the 6-position, and the aryl group at the 4-position of the pyrimidine has an ortho-metalated structure, in which the ortho position of the aryl group is bonded to the iridium. Each of the first transparent conductive layer and the second transparent conductive layer has a desired total thickness, so that light emitted from the first light-emitting element has a longer wavelength than light emitted from the second light-emitting element and the light emitted from the second light-emitting element has a longer wavelength than light emitted from the third light-emitting element.

Further, another mode of the above light-emitting device is a light-emitting device having a first light-emitting element including a reflective electrode, a first transparent conductive layer formed in contact with the reflective electrode, an EL layer formed in contact with the first transparent conductive layer, and a semi-transmissive and semi-reflective electrode formed in contact with the EL layer, a second light-emitting element including the reflective electrode, a second transparent conductive layer formed in contact with the reflective electrode, the EL layer formed in contact with the second transparent conductive layer, and the semi-transmissive and semi-reflective electrode formed in contact with the EL layer, and a third light-emitting element including the reflective electrode, the EL layer formed in contact with the reflective electrode, and the semi-transmissive and semi-reflective electrode formed in contact with the EL layer. The EL layer contains a phosphorescent organometallic iridium complex where nitrogen at the 1-position of 1,3,5-triazine having an aryl group at the 2-position is coordinated to iridium, the 1,3,5-triazine has a substituent at the 4-position or the 6-position, and the aryl group has an ortho-metalated structure, in which the ortho position of the aryl group is bonded to the iridium. Each of the first transparent conductive layer and the second transparent conductive layer has a desired total thickness, so that light emitted from the first light-emitting element has a longer wavelength than light emitted from the second light-emitting element and the light emitted from the second light-emitting element has a longer wavelength than light emitted from the third light-emitting element.

Note that the present invention includes a light-emitting device in which the microcavity light-emitting device and the above-described tandem light-emitting element are combined.

Other embodiments of the present invention are not only a light-emitting device including the light-emitting element but also an electronic device and a lighting device each including the light-emitting device. The light-emitting device in this specification refers to an image display device, a light-emitting device, and a light source (e.g., a lighting device). In addition, the light-emitting device includes, in its category, all of a module in which a light-emitting device is connected to a connector such as a flexible printed circuit (FPC), a tape automated bonding (TAB) tape or a tape carrier package (TCP), a module in which a printed wiring board is provided on the tip of a TAB tape or a TCP, and a module in which an integrated circuit (IC) is directly mounted on a light-emitting element by a chip on glass (COG) method.

According to one embodiment of the present invention, a novel light-emitting device utilizing phosphorescence can be provided. Further, according to one embodiment of the present invention, an electronic device and a lighting device which utilize phosphorescence can be provided.

BRIEF DESCRIPTION OF THE DRAWINGS

In the accompanying drawings.

DETAILED DESCRIPTION OF THE INVENTION

Hereinafter, embodiments and examples of the present invention will be described in detail with reference to the accompanying drawings. Note that the present invention is not limited to the description below, and modes and details thereof can be modified in various ways without departing from the spirit and the scope of the present invention. Therefore, the present invention should not be construed as being limited to the description of the following embodiments and examples.

Embodiment 1

In this embodiment, as a light-emitting element which can be applied to a light-emitting device utilizing phosphorescence, a light-emitting element in which a phosphorescent organometallic iridium complex is used in a light-emitting layer is described with reference to FIG. 1.

Figure 1:
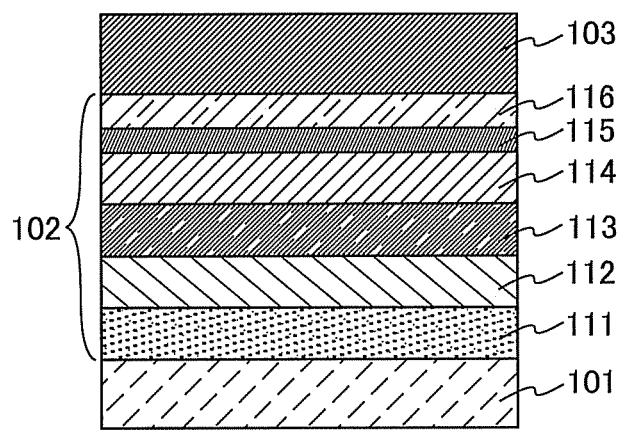
FIG. 1 illustrates a structure of a light-emitting element.

In a light-emitting element described in this embodiment, as illustrated in FIG. 1, an EL layer 102 including a light-emitting layer 113 is provided between a pair of electrodes (a first electrode (anode) 101 and a second electrode (cathode) 103), and the EL layer 102 includes a hole-injection layer 111, a hole-transport layer 112, an electron-transport layer 114, an electron-injection layer 115, a charge-generation layer (E) 116, and the like in addition to the light-emitting layer 113.

By application of a voltage to such a light-emitting element, holes injected from the first electrode 101 side and electrons injected from the second electrode 103 side recombine in the light-emitting layer 113 to raise the phosphorescent organometallic iridium complex to an excited state. Then, light is emitted when the phosphorescent organometallic iridium complex in the excited state returns to the ground state. Thus, the phosphorescent organometallic iridium of one embodiment of the present invention functions as a light-emitting substance in the light-emitting element.

The hole-injection layer 111 included in the EL layer 102 is a layer containing a substance having a high hole-transport property and an acceptor substance. When electrons are extracted from the substance having a high hole-transport property owing to the acceptor substance, holes are generated. Thus, holes are injected from the hole-injection layer 111 into the light-emitting layer 113 through the hole-transport layer 112.

The charge-generation layer (E) 116 is a layer containing a substance having a high hole-transport property and an acceptor substance. Electrons are extracted from the substance having a high hole-transport property owing to the acceptor substance, and the extracted electrons are injected from the electron-injection layer 115 having an electron-injection property into the light-emitting layer 113 through the electron-transport layer 114.

A specific example in which the light-emitting element described in this embodiment is manufactured is described.

As the first electrode (anode) 101 and the second electrode (cathode) 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The first electrode (anode) 101 and the second electrode (cathode) 103 can be formed by, for example, a sputtering method, an evaporation method (including a vacuum evaporation method), or the like.

As the substance having a high hole-transport property used for the hole-injection layer 111, the hole-transport layer 112, and the charge-generation layer (E) 116, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. In addition, the following carbazole derivatives and the like can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or higher. However, substances other than the above-described ones may also be used as long as the substances have higher hole-transport properties than electron-transport properties.

Further, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis (4-butylphenyl)-N,N'-bis(phenyl)benzidine] (abbreviation: Poly-TPD) can be used.

As examples of the acceptor substance that is used for the hole-injection layer 111 and the charge-generation layer (E) 116, a transition metal oxide or an oxide of a metal belonging to any of Group 4 to Group 8 of the periodic table can be given. Specifically, molybdenum oxide is particularly preferable.

The light-emitting layer 113 contains a phosphorescent organometallic iridium complex as a guest material serving as a light-emitting substance and a substance that has higher triplet excitation energy than this phosphorescent organometallic iridium complex as a host material.

Note that the above phosphorescent organometallic iridium complex is a phosphorescent organometallic iridium complex where nitrogen at the 3-position of pyrimidine having an aryl group at the 4-position is coordinated to iridium, the pyrimidine has an alkyl group or an aryl group at any one of the 2-position, the 5-position, and the 6-position, and the aryl group at the 4-position of the pyrimidine has an ortho-metalated structure, in which the ortho position of the aryl group is bonded to the iridium. The structure of the phosphorescent organometallic iridium complex is represented by General Formula (G1) below.

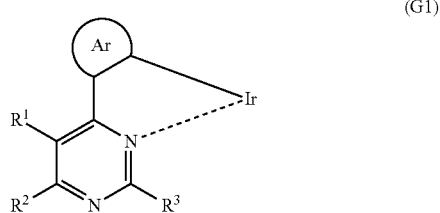

(G1)

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms.)

Further, as the above-described phosphorescent organometallic iridium complex, it is also possible to use a phosphorescent organometallic iridium complex, which is represented by General Formula (G2) below, and in which nitrogen at the 1-position of 1,3,5-triazine having an aryl group at the 2-position is coordinated to iridium, the 1,3,5-triazine has a substituent at the 4-position or the 6-position, and the aryl group has an ortho-metalated structure, in which the ortho position of the aryl group is bonded to the iridium.

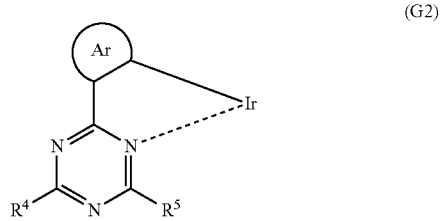

(G2)

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms.)

Here, a phosphorescent organometallic iridium complex having the structure which is represented by General Formula (G1) or (G2) and in which the lowest triplet excited state is formed in the structure is preferable because the phosphorescent organometallic iridium complex can efficiently exhibit phosphorescence. To obtain such a mode, another skeleton (another ligand) which is included in the phosphorescent organometallic iridium complex can be selected such that the lowest triplet excitation energy of the structure is equal to or lower than the lowest triplet excitation energy of the another skeleton (the another ligand), for example. In that case, regardless of what a skeleton (ligand) other than the structure is, the lowest triplet excited state is formed by the structure at last, so that phosphorescence originating from the structure is thus obtained. Therefore, phosphorescence can be highly efficiently obtained. For example, vinyl polymer having the structure as a side chain can be given.

Note that a phosphorescent organometallic iridium complex having the structure represented by General Formula (G1) above is preferably the phosphorescent organometallic iridium complex represented by General Formula (G3) below.

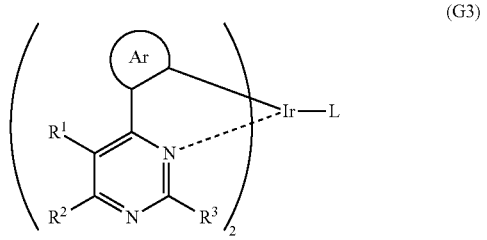

(G3)

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms. L represents a monoanionic ligand.)

Note that a phosphorescent organometallic iridium complex having the structure represented by General Formula (G2) above is preferably the phosphorescent organometallic iridium complex represented by General Formula (G4) below.

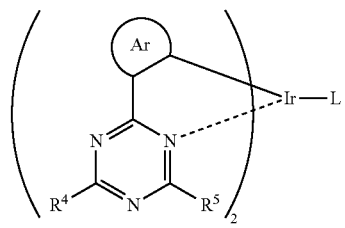

(G4)

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. L represents a monoanionic ligand.)

Note that the monoanionic ligand L in General Formula (G3) or (G4) is preferably any of a monoanionic bidentate chelate ligand having a beta-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen. Specifically, the monoanionic ligand L is preferably a monoanionic ligand represented by any of Structural Formulae (L1) to (L7) below. Since these ligands have high coordinative ability and can be obtained at low price, they are useful.

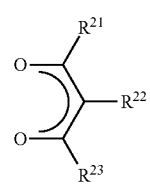

(L1)

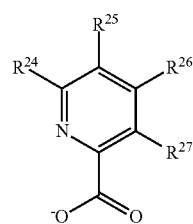

(L2)

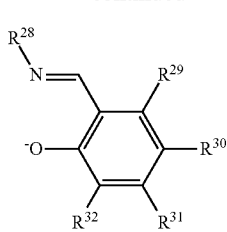
(L3)

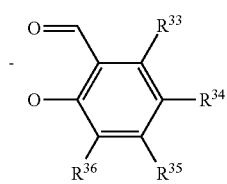
(L4)

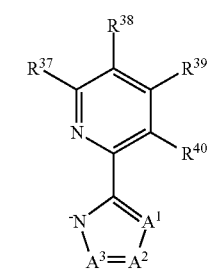
(L5)

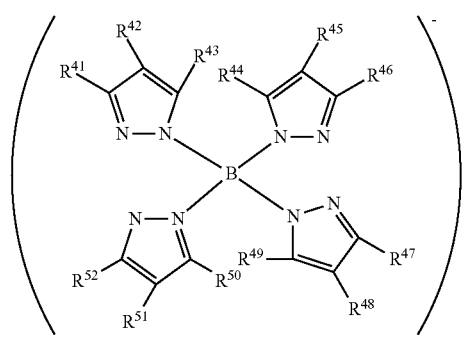
(L6)

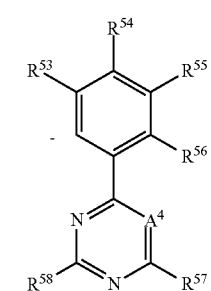
(L7)

(In the formulae, $R^{21}$ to $R^{58}$ separately represent any of hydrogen, a substituted or unsubstituted alkyl group having 1 to 4 carbon atoms, a halogen group, a vinyl group, a substituted or unsubstituted haloalkyl group having 1 to 4 carbon atoms, a substituted or unsubstituted alkoxy group having 1 to 4 carbon atoms, and a substituted or unsubstituted alkylthio group having 1 to 4 carbon atoms. In addition, $A^1$ to $A^4$ separately represent any of nitrogen, sp² hybridized carbon bonded to hydrogen, and sp² hybridized carbon bonded to a substituent R. The substituent R represents any of an alkyl group having 1 to 4 carbon atoms, a halogen group, a haloalkyl group having 1 to 4 carbon atoms, and a phenyl group.)

Further, a phosphorescent organometallic iridium complex having the structure represented by General Formula (G1) above is preferably the phosphorescent organometallic iridium complex represented by General Formula (G5) below.

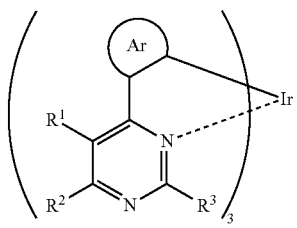
(G5)

(In the formula, Ar represents a substituted or unsubstituted aryl group, and $R^1$ to $R^3$ separately represent any of hydrogen, a substituted or unsubstituted alkyl group having 1 to 4 carbon atoms, and a substituted or unsubstituted aryl group having 6 to 10 carbon atoms. Note that at least one of $R^1$ to $R^3$ represents a substituted or unsubstituted alkyl group having 1 to 4 carbon atoms or a substituted or unsubstituted aryl group having 6 to 10 carbon atoms.)

Further, a phosphorescent organometallic iridium complex having the structure represented by General Formula (G2) above is preferably the phosphorescent organometallic iridium complex represented by General Formula (G6) below.

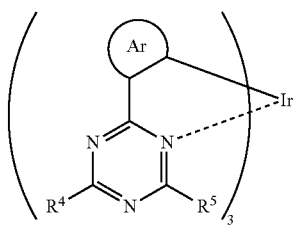
(G6)

(In the formula, Ar represents a substituted or unsubstituted aryl group, and $R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms. Note that at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms.)

Note that a phosphorescent organometallic iridium complex having any of the structures represented by General Formulae (G1) to (G6) above is preferably specifically the phosphorescent organometallic iridium complex represented by any of Structural Formulae (100) to (106) below.

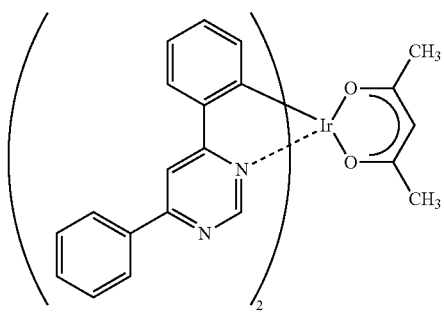

[Ir(dppm)₂(acac)] (100)

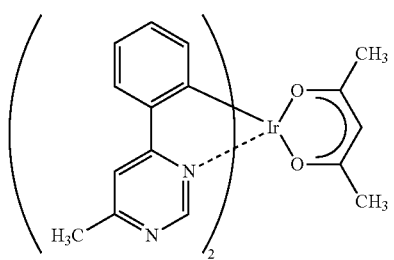

[Ir(mppm)₂(acac)] (101)

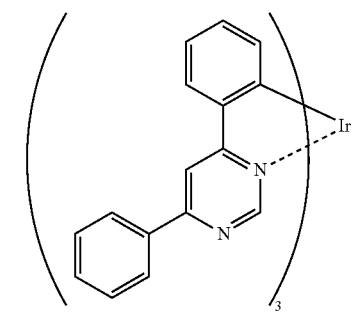

[Ir(dppm)₃] (102)

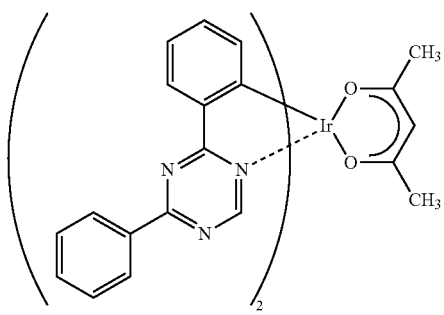

Ir(dptzn)₂(acac) (103)

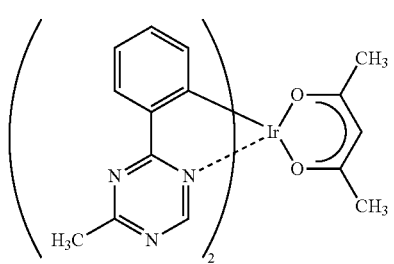

Ir(mptzn)₂(acac) (104)

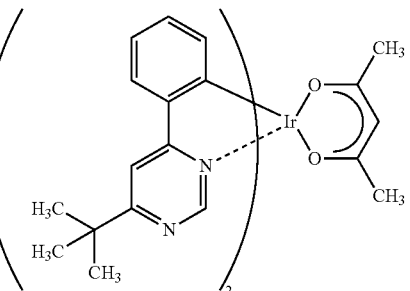

[Ir(tBuppm)₂(acac)] (105)

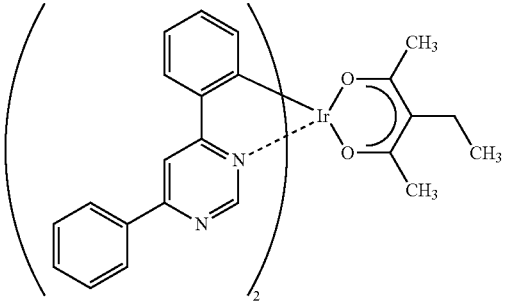

[Ir(dppm)₂(eacac)] (106)

Preferable examples of the substance (i.e., host material) used for dispersing any of the above-described phosphorescent organometallic iridium complexes are as follows: compounds having an arylamine skeleton, such as 4-phenyl-4'-(9-phenyl-9H-carbazol-3-yl)triphenylamine (abbreviation: PCBA1BP), 3-[N-(1-naphthyl)-N-(9-phenylcarbazol-3-yl)amino]-9-phenylcarbazole (abbreviation: PCzPCN1), 2,3-bis(4-diphenylaminophenyl)quinoxaline (abbreviation: TPAQn), and NPB, carbazole derivatives such as CBP and 4,4',4''-tris(carbazol-9-yl)triphenylamine (abbreviation: TCTA), nitrogen-containing heteroaromatic compounds such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), and metal complexes such as bis[2-(2-hydroxyphenyl)pyridinato]zinc (abbreviation: Znpp₂), bis[2-(2-hydroxyphenyl)benzoxazolato]zinc (abbreviation: Zn(BOX)₂), bis(2-methyl-8-quinolinolato)(4-phenylphenolato)aluminum (abbreviation: BAlq), and tris(8-quinolinolato)aluminum (abbreviation: Alq₃). Alternatively, a high molecular compound such as PVK can be used.

Note that in the case where the light-emitting layer 113 contains the above-described phosphorescent organometallic iridium complex (guest material) and the host material, phosphorescence with high emission efficiency can be obtained from the light-emitting layer 113.

The electron-transport layer 114 is a layer containing a substance having a high electron-transport property. For the electron-transport layer 114, metal complexes such as Alq₃, tris(4-methyl-8-quinolinolato)aluminum (abbreviation: Almq₃), bis(10-hydroxybenzo[h]quinolinato)beryllium (abbreviation: BeBq₂), BAlq, Zn(BOX)₂, or bis[2-(2-hydroxyphenyl)benzothiazolato]zinc (abbreviation: Zn(BTZ)₂) can be used. Alternatively, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl)stilbene (abbreviation: BzOs) can be used. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly ones having an electron mobility of $10^{-6}$ cm$^2$/Vs or higher. Note that other than these substances, any substance that has a property of transporting more holes than electrons may be used for the electron-transport layer.

Further, the electron-transport layer 114 is not limited to a single layer, and a stacked layer in which two or more layers containing any of the above-described substances are stacked may be used.

The electron-injection layer 115 is a layer containing a substance having a high electron-injection property. For the electron-injection layer 115, an alkali metal, an alkaline earth metal, or a compound thereof, such as lithium fluoride (LiF), cesium fluoride (CsF), calcium fluoride (CaF$_2$), or lithium oxide (LiOx), can be used. Alternatively, a rare earth metal compound such as erbium fluoride (ErF$_3$) can be used. Further alternatively, the substances for forming the electron-transport layer 114, which are described above, can be used.

Alternatively, a composite material in which an organic compound and an electron donor (donor) are mixed may be used for the electron-injection layer 115. Such a composite material is excellent in an electron-injection property and an electron-transport property because electrons are generated in the organic compound by the electron donor. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, alkali metal oxide or alkaline earth metal oxide such as lithium oxide, calcium oxide, barium oxide, and the like can be given. A Lewis base such as magnesium oxide can alternatively be used. An organic compound such as tetrathiafulvalene (abbreviation: TTF) can alternatively be used.

Note that each of the above-described hole-injection layer 111, hole-transport layer 112, light-emitting layer 113, electron-transport layer 114, electron-injection layer 115, and charge-generation layer (E) 116 can be formed by a method such as an evaporation method (e.g., a vacuum evaporation method), an ink-jet method, or a coating method.

In the above-described light-emitting element, current flows due to a potential difference generated between the first electrode 101 and the second electrode 103 and holes and electrons recombine in the EL layer 102, whereby light is emitted. Then, the emitted light is extracted outside through one or both of the first electrode 101 and the second electrode 103. Therefore, one or both of the first electrode 101 and the second electrode 103 are electrodes having a light-transmitting property.

The above-described light-emitting element can emit phosphorescence originating from the phosphorescent organometallic iridium complex and thus can have higher efficiency than a light-emitting element using a fluorescent compound.

Note that although the light-emitting element described in this embodiment is one structural example of a light-emitting element, a light-emitting element having another structure which is described in another embodiment can also be applied to a light-emitting device that is one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including a light-emitting element which is a different light-emitting element from the above light-emitting elements as described in another embodiment. Each of the above light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed of both an n-type TFT and a p-type TFT or only either an n-type TFT or a p-type TFT. Furthermore, there is also no particular limitation on crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

Embodiment 2

In this embodiment, as one embodiment of the present invention, a light-emitting element in which two or more kinds of organic compounds as well as a phosphorescent organometallic iridium complex are used for a light-emitting layer is described.

Figure 2:
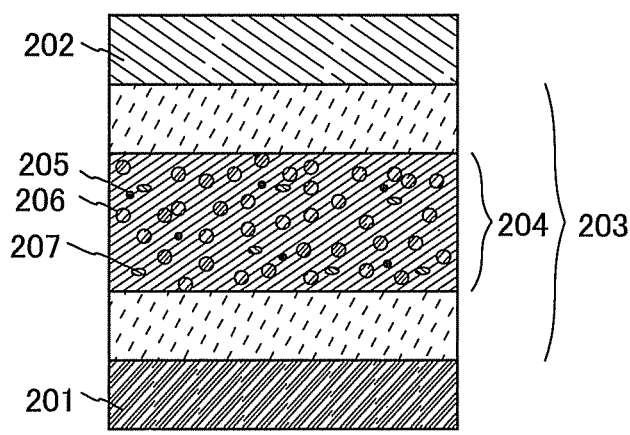
FIG. 2 illustrates a structure of a light-emitting element.

A light-emitting element described in this embodiment includes an EL layer 203 between a pair of electrodes (an anode 201 and a cathode 202) as illustrated in FIG. 2. Note that the EL layer 203 includes at least a light-emitting layer 204 and may include a hole-injection layer, a hole-transport layer, an electron-transport layer, an electron-injection layer, a charge-generation layer (E), and the like. Note that for the hole-injection layer, the hole-transport layer, the electron-transport layer, the electron-injection layer, and the charge-generation layer (E), the substances described in Embodiment 1 can be used.

The light-emitting layer 204 described in this embodiment contains a phosphorescent compound 205 using the phosphorescent organometallic iridium complex described in Embodiment 1, a first organic compound 206, and a second organic compound 207. Note that the phosphorescent compound 205 is a guest material in the light-emitting layer 204. Moreover, one of the first organic compound 206 and the second organic compound 207, the content of which is higher than that of the other in the light-emitting layer 204, is a host material in the light-emitting layer 204.

When the light-emitting layer 204 has the structure in which the guest material is dispersed in the host material, crystallization of the light-emitting layer can be suppressed. Further, it is possible to suppress concentration quenching due to high concentration of the guest material, and thus the light-emitting element can have higher emission efficiency.

Note that it is preferable that a triplet excitation energy level ($T_1$ level) of each of the first organic compound 206 and the second organic compound 207 be higher than that of the phosphorescent compound 205. This is because, when the $T_1$ level of the first organic compound 206 (or the second organic compound 207) is lower than that of the phosphorescent compound 205, the triplet excitation energy of the phosphorescent compound 205, which is to contribute to light emission, is quenched by the first organic compound 206 (or the second organic compound 207) and accordingly the emission efficiency is decreased.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (a fluorescence spectrum in energy transfer from a singlet excited state, and a phosphorescence spectrum in energy transfer from a triplet excited state) largely overlap with an absorption spectrum of a guest material (specifically, a spectrum in an absorption band on the longest wavelength (lowest energy) side). However, in general, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, in this embodiment, a combination of the first organic compound and the second organic compound preferably forms an exciplex (also referred to as excited complex). In that case, the first organic compound 206 and the second organic compound 207 form an exciplex at the time of recombination of carriers (electrons and holes) in the light-emitting layer 204. Thus, in the light-emitting layer 204, a fluorescence spectrum of the first organic compound 206 and that of the second organic compound 207 are converted into an emission spectrum of the exciplex which is located on a longer wavelength side. Moreover, when the first organic compound and the second organic compound are selected in such a manner that the emission spectrum of the exciplex largely overlaps with the absorption spectrum of the guest material, energy transfer from a singlet excited state can be maximized.

Note that also in the case of a triplet excited state, energy transfer from the exciplex, not the host material, is assumed to occur.

For the phosphorescent compound 205, the phosphorescent organometallic iridium complex described in Embodiment 1 is used. Although the combination of the first organic compound 206 and the second organic compound 207 can be determined such that an exciplex is formed, a combination of a compound which is likely to accept electrons (a compound having an electron-trapping property) and a compound which is likely to accept holes (a compound having a hole-trapping property) is preferably employed.

As a compound which is likely to accept electrons, a π-electron deficient heteroaromatic compound such as a nitrogen-containing heteroaromatic compound is preferable. For example, a quinoxaline derivative or a dibenzoquinoxaline derivative can be given and examples thereof include: 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As a compound which is likely to accept holes, a π-electron rich heteroaromatic compound (e.g., a carbazole derivative or an indole derivative) or an aromatic amine compound is preferable. For example, the following can be given: 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-N',N'-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N-(3-methylphenyl)-N-phenylamino]phenyl}-N-phenylamino)biphenyl (abbreviation: DNTPD), 3,6-bis[N-(4-diphenylaminophenye-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

As for the above-described first and second organic compounds 206 and 207, the present invention is not limited to the above examples. The combination is determined so that an exciplex can be formed, the emission spectrum of the exciplex overlaps with the absorption spectrum of the phosphorescent compound 205, and the peak of the emission spectrum of the exciplex has a longer wavelength than the peak of the absorption spectrum of the phosphorescent compound 205.

Note that in the case where a compound which is likely to accept electrons and a compound which is likely to accept holes are used for the first organic compound 206 and the second organic compound 207, carrier balance can be controlled by the mixture ratio of the compounds. Specifically, the ratio of the first organic compound to the second organic compound is preferably 1:9 to 9:1.

In the light-emitting element described in this embodiment, energy transfer efficiency can be improved owing to energy transfer utilizing an overlap between an emission spectrum of an exciplex and an absorption spectrum of a phosphorescent compound; accordingly, it is possible to achieve high external quantum efficiency of a light-emitting element.

Note that in another structure of the present invention, the light-emitting layer 204 can be formed using a host molecule having a hole-trapping property and a host molecule having an electron-trapping property as the two kinds of organic compounds other than the phosphorescent compound 205 (guest material) so that a phenomenon (guest coupled with complementary hosts: GCCH) occurs in which holes and electrons are introduced to guest molecules existing in the two kinds of host molecules and the guest molecules are brought into an excited state.

At this time, the host molecule having a hole-trapping property and the host molecule having an electron-trapping property can be respectively selected from the above-described compounds which are likely to accept holes and the above-described compounds which are likely to accept electrons.

Note that the light-emitting element described in this embodiment is an example of a structure of a light-emitting element; it is possible to apply a light-emitting element having another structure, which is described in another embodiment, to a light-emitting device that is one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including the above light-emitting element, whose structure is changed as described in another embodiment. Each of the above light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed of both an n-type TFT and a p-type TFT or only either an n-type TFT or a p-type TFT. Furthermore, there is also no particular limitation on crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

Embodiment 3

In this embodiment, as one embodiment of the present invention, a light-emitting element (hereinafter referred to as tandem light-emitting element) in which a plurality of EL layers are included so as to sandwich a charge-generation layer will be described.

Figure 3A:
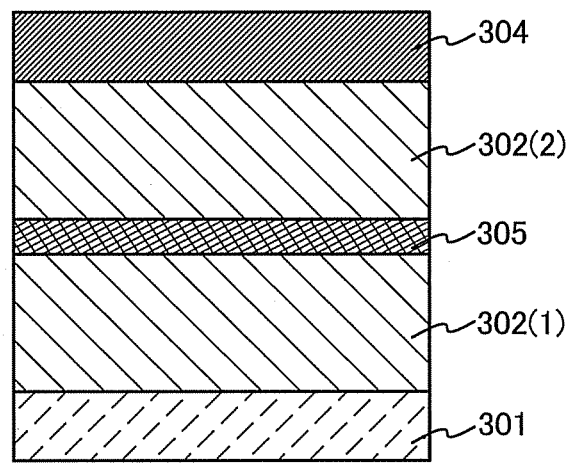
FIGS. 3A and 3B illustrate structures of light-emitting elements.

A light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 3A.

In this embodiment, the first electrode 301 functions as an anode, and the second electrode 304 functions as a cathode. Note that the first electrode 301 and the second electrode 304 can have structures similar to those described in Embodiment 1. In addition, although the plurality of EL layers (the first EL layer 302(1) and the second EL layer 302(2)) may have structures similar to those described in Embodiment 1 or 2, any of the EL layers may have a structure similar to that described in Embodiment 1 or 2. In other words, the structures of the first EL layer 302(1) and the second EL layer 302(2) may be the same or different from each other and can be similar to those described in Embodiment 1 or 2.

Further, a charge-generation layer (I) 305 is provided between the plurality of EL layers (the first EL layer 302(1) and the second EL layer 302(2)). The charge-generation layer (I) 305 has a function of injecting electrons into one of the EL layers and injecting holes into the other of the EL layers when a voltage is applied between the first electrode 301 and the second electrode 304. In this embodiment, when a voltage is applied such that the potential of the first electrode 301 is higher than that of the second electrode 304, the charge-generation layer (I) 305 injects electrons into the first EL layer 302(1) and injects holes into the second EL layer 302(2).

Note that in terms of light extraction efficiency, the charge-generation layer (I) 305 preferably has a light-transmitting property with respect to visible light (specifically, the charge-generation layer (I) 305 has a visible light transmittance of 40% or more). Further, the charge-generation layer (I) 305 functions even if it has lower conductivity than the first electrode 301 or the second electrode 304.

The charge-generation layer (I) 305 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(Spiro-9,9'-bifluoren-2-yl)-N-phenylamino]biphenyl (abbreviation: BSPB), or the like can be used. The substances mentioned here are mainly ones that have a hole mobility of $10^{-6}$ cm$^2$/Vs or higher. However, another substance may be used as long as the substance is an organic compound having a higher hole-transport property than an electron-transport property.

Further, as the electron acceptor, 7,7,8,8-tetracyano-2,3,5,6-tetrafluoroquinodimethane (abbreviation: F$_4$-TCNQ), chloranil, or the like can be used. Alternatively, a transition metal oxide can be used. Further alternatively, an oxide of metals that belong to Group 4 to Group 8 of the periodic table can be used. Specifically, it is preferable to use vanadium oxide, niobium oxide, tantalum oxide, chromium oxide, molybdenum oxide, tungsten oxide, manganese oxide, or rhenium oxide because the electron-accepting property is high. Among these, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property for example, a metal complex having a quinoline skeleton or a benzoquinoline skeleton, such as Alq, Almq$_3$, BeBq$_2$, or BAlq, or the like can be used. Alternatively, it is possible to use a metal complex having an oxazole-based ligand or a thiazole-based ligand, such as Zn(BOX)$_2$ or Zn(BTZ)$_2$. Further alternatively, instead of a metal complex, it is possible to use PBD, OXD-7, TAZ, Bphen, BCP, or the like. The substances mentioned here are mainly ones that have an electron mobility of $10^{-6}$ cm$^2$/Vs or higher. Note that another substance may be used as long as the substance is an organic compound having a higher electron-transport property than a hole-transport property.

As the electron donor, it is possible to use an alkali metal, an alkaline earth metal, a rare earth metal, a metal belonging to Group 2 or 13 of the periodic table, or an oxide or carbonate thereof. Specifically, it is preferable to use lithium (Li), cesium (Cs), magnesium (Mg), calcium (Ca), ytterbium (Yb), indium (In), lithium oxide, cesium carbonate, or the like. Alternatively, an organic compound such as tetrathianaphthacene may be used as the electron donor.

Note that forming the charge-generation layer (I) 305 by using-any of the above materials can suppress an increase in drive voltage caused by the stack of the EL layers.

Figure 3B:
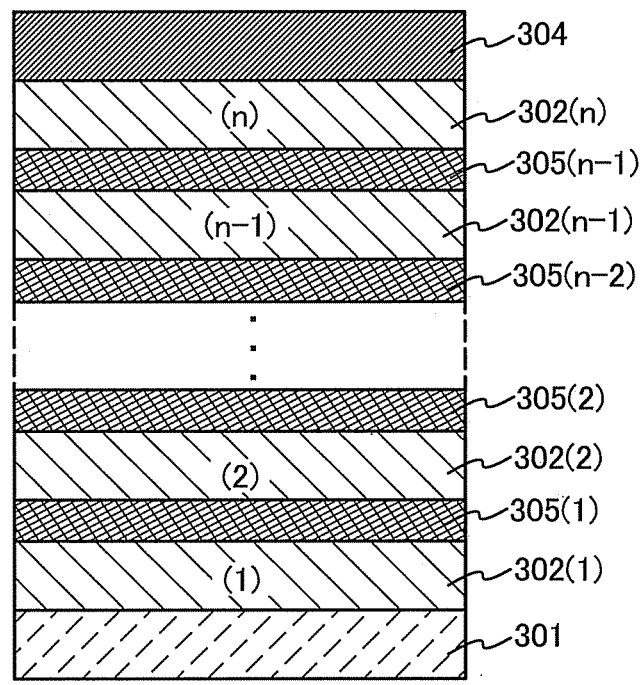

Although this embodiment shows the light-emitting element having two EL layers, the present invention can be similarly applied to a light-emitting element in which n EL layers (n is three or more) are stacked as illustrated in FIG. 3B. In the case where a plurality of EL layers are included between a pair of electrodes as in the light-emitting element according to this embodiment, by provision of a charge-generation layer (I) between the EL layers, light emission in a high luminance region can be obtained with current density kept low. Since the current density can be kept low, the element can have a long lifetime. When the light-emitting element is applied for lighting, voltage drop due to resistance of an electrode material can be reduced, thereby achieving homogeneous light emission in a large area. Moreover, it is possible to achieve a light-emitting device of low power consumption, which can be driven at a low voltage.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, when lights obtained from substances which emit light of complementary colors are mixed, white emission can be obtained.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

Embodiment 4

In this embodiment, as a light-emitting device utilizing phosphorescence which is one embodiment of the present invention, a light-emitting device using a phosphorescent organometallic iridium complex is described.

Figure 4:
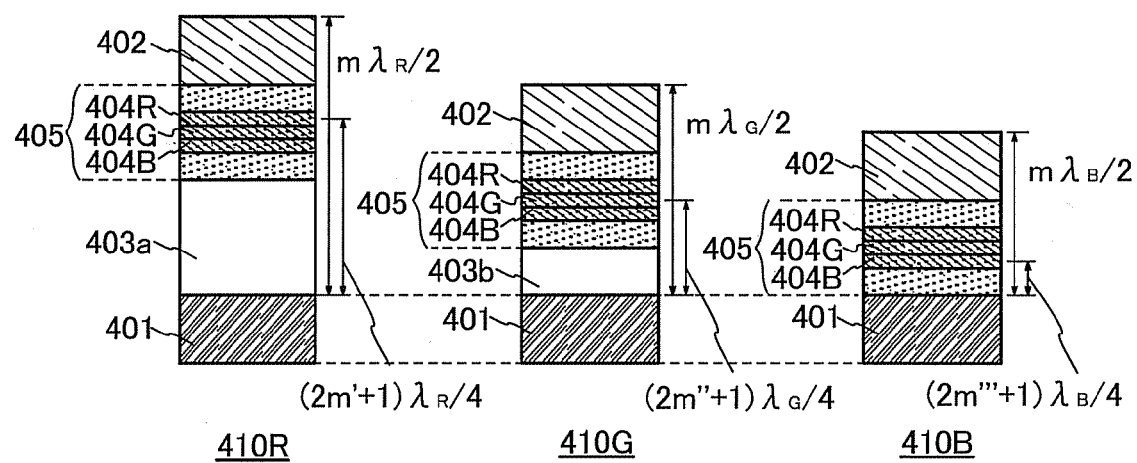
FIG. 4 illustrates a light-emitting device.

A light-emitting device described in this embodiment has a micro optical resonator (microcavity) structure in which a light resonant effect between a pair of electrodes is utilized. The light-emitting device includes a plurality of light-emitting elements each of which has at least an EL layer 405 between a pair of electrodes (a reflective electrode 401 and a semi-transmissive and semi-reflective electrode 402) as illustrated in FIG. 4. Further, the EL layer 405 includes at least a light-emitting layer 404 serving as a light-emitting region and may further include a hole-injection layer, a hole-transport layer, an electron-transport layer, an electron-injection layer, a charge-generation layer (E), and the like. Note that the light-emitting layer 404 contains a phosphorescent organometallic iridium complex that is one embodiment of the present invention.

In this embodiment, a light-emitting device is described which includes light-emitting elements (a first light-emitting element (R) 410R, a second light-emitting element (G) 410G, and a third light-emitting element (B) 410B) having different structures as illustrated in FIG. 4.

The first light-emitting element (R) 410R has a structure in which a first transparent conductive layer 403a; an EL layer 405 including a first light-emitting layer (B) 404B, a second light-emitting layer (G) 404G, and a third light-emitting layer (R) 404R; and a semi-transmissive and semi-reflective electrode 402 are sequentially stacked over a reflective electrode 401. The second light-emitting element (G) 410G has a structure in which a second transparent conductive layer 403b, the EL layer 405, and the semi-transmissive and semi-reflective electrode 402 are sequentially stacked over the reflective electrode 401. The third light-emitting element (B) 410B has a structure in which the EL layer 405 and the semi-transmissive and semi-reflective electrode 402 are sequentially stacked over the reflective electrode 401.

Note that the reflective electrode 401, the EL layer 405, and the semi-transmissive and semi-reflective electrode 402 are common to the light-emitting elements (the first light-emitting element (R) 410R, the second light-emitting element (G) 410G, and the third light-emitting element (B) 410B). The first light-emitting layer (B) 404B emits light ($\lambda_B$) having a peak in a wavelength range from 420 nm to 480 nm. The second light-emitting layer (G) 404G emits light ($\lambda_G$) having a peak in a wavelength range from 500 nm to 550 nm. The third light-emitting layer (R) 404R emits light ($\lambda_R$) having a peak in a wavelength range from 600 nm to 760 nm. Thus, in each of the light-emitting elements (the first light-emitting element (R) 410R, the second light-emitting element (G) 410G, and the third light-emitting element (B) 410B), light emitted from the first light-emitting layer (B) 404B, light emitted from the second light-emitting layer (G) 404G, and light emitted from the third light-emitting layer (R) 404R overlap with each other; accordingly, light having a broad emission spectrum that covers a visible light range can be emitted. Note that the above wavelengths satisfy the relation of $\lambda_B < \lambda_G < \lambda_R$.

Each of the light-emitting elements described in this embodiment has a structure in which the EL layer 405 is interposed between the reflective electrode 401 and the semi-transmissive and semi-reflective electrode 402. Light emitted in all directions from the light-emitting layers included in the EL layer 405 is resonated by the reflective electrode 401 and the semi-transmissive and semi-reflective electrode 402 which function as a micro optical resonator (microcavity). Note that the reflective electrode 401 is formed using a conductive material having reflectivity, and a film whose visible light reflectivity is 40% to 100%, preferably 70% to 100%, and whose resistivity is $1\times10^{-2}$ Ωcm or lower is used. In addition, the semi-transmissive and semi-reflective electrode 402 is formed using a conductive material having reflectivity and a conductive material having a light-transmitting property, and a film whose visible light reflectivity is 20% to 80%, preferably 40% to 70%, and whose resistivity is $1\times10^{-2}$ Ωcm or lower is used.

In this embodiment, the thicknesses of the transparent conductive layers (the first transparent conductive layer 403a and the second transparent conductive layer 403b) provided in the first light-emitting element (R) 410R and the second light-emitting element (G) 410G, respectively, are varied between the light-emitting elements, whereby the light-emitting elements differ in the optical path length from the reflective electrode 401 to the semi-transmissive and semi-reflective electrode 402. In other words, in light having a broad emission spectrum, which is emitted from the light-emitting layers of each of the light-emitting elements, light with a wavelength that is resonated between the reflective electrode 401 and the semi-transmissive and semi-reflective electrode 402 can be enhanced while light with a wavelength that is not resonated therebetween can be attenuated. Thus, when the elements differ in the optical path length from the reflective electrode 401 to the semi-transmissive and semi-reflective electrode 402, light with different wavelengths can be extracted.

Note that the total thickness from the reflective electrode 401 to the semi-transmissive and semi-reflective electrode 402 is set to $m\lambda_R/2$ (m is a natural number) in the first light-emitting element (R) 410R; the total thickness from the reflective electrode 401 to the semi-transmissive and semi-reflective electrode 402 is set to $m\lambda_G/2$ (m is a natural number) in the second light-emitting element (G) 410G; and the total thickness from the reflective electrode 401 to the semi-transmissive and semi-reflective electrode 402 is set to $m\lambda_B/2$ (m is a natural number) in the third light-emitting element (B) 410B.

In this manner, the light ($\lambda_R$) emitted from the third light-emitting layer (R) 404R included in the EL layer 405 is mainly extracted from the first light-emitting element (R) 410R, the light ($\lambda_G$) emitted from the second light-emitting layer (G) 404G included in the EL layer 405 is mainly extracted from the second light-emitting element (G) 410G, and the light ($\lambda_B$) emitted from the first light-emitting layer (B) 404B included in the EL layer 405 is mainly extracted from the third light-emitting element (B) 410B. Note that the light extracted from each of the light-emitting elements is emitted from the semi-transmissive and semi-reflective electrode 402 side.

Further, strictly speaking, the total thickness from the reflective electrode 401 to the semi-transmissive and semi-reflective electrode 402 can be the total thickness from a reflection region in the reflective electrode 401 to a reflection region in the semi-transmissive and semi-reflective electrode 402. However, it is difficult to precisely determine the positions of the reflection regions in the reflective electrode 401 and the semi-transmissive and semi-reflective electrode 402; therefore, it is assumed that the above effect can be sufficiently obtained wherever the reflection regions may be set in the reflective electrode 401 and the semi-transmissive and semi-reflective electrode 402.

Next, in the first light-emitting element (R) 410R, the optical path length from the reflective electrode 401 to the third light-emitting layer (R) 404R is adjusted to a desired thickness $((2m'+1)\lambda_R/4$, where m' is a natural number); thus, light emitted from the third light-emitting layer (R) 404R can be amplified. Light (first reflected light) that is reflected by the reflective electrode 401 of the light emitted from the third light-emitting layer (R) 404R interferes with light (first incident light) that directly enters the semi-transmissive and semi-reflective electrode 402 from the third light-emitting layer (R) 404R. Therefore, by adjusting the optical path length from the reflective electrode 401 to the third light-emitting layer (R) 404R to the desired value $((2m'+1))\lambda_R/4$, where m' is a natural number), the phases of the first reflected light and the first incident light can be aligned with each other and the light emitted from the third light-emitting layer (R) 404R can be amplified.

Note that, strictly speaking, the optical path length from the reflective electrode 401 to the third light-emitting layer (R) 404R can be the optical path length from a reflection region in the reflective electrode 401 to a light-emitting region in the third light-emitting layer (R) 404R. However, it is difficult to precisely determine the positions of the reflection region in the reflective electrode 401 and the light-emitting region in the third light-emitting layer (R) 404R; therefore, it is assumed that the above effect can be sufficiently obtained wherever the reflection region and the light-emitting region may be set in the reflective electrode 401 and the third light-emitting layer (R) 404R, respectively.

Next, in the second light-emitting element (G) 410G, the optical path length from the reflective electrode 401 to the second light-emitting layer (G) 404G is adjusted to a desired thickness $((2m''+1)\lambda_G/4$, where m'' is a natural number); thus, light emitted from the second light-emitting layer (G) 404G can be amplified. Light (second reflected light) that is reflected by the reflective electrode 401 of the light emitted from the second light-emitting layer (G) 404G interferes with light (second incident light) that directly enters the semi-transmissive and semi-reflective electrode 402 from the second light-emitting layer (G) 404G. Therefore, by adjusting the optical path length from the reflective electrode 401 to the second light-emitting layer (G) 404G to the desired value $((2m''+1)\lambda_G/4$, where m'' is a natural number), the phases of the second reflected light and the second incident light can be aligned with each other and the light emitted from the second light-emitting layer (G) 404G can be amplified.

Note that, strictly speaking, the optical path length from the reflective electrode 401 to the second light-emitting layer (G) 404G can be the optical path length from a reflection region in the reflective electrode 401 to a light-emitting region in the second light-emitting layer (G) 404G. However, it is difficult to precisely determine the positions of the reflection region in the reflective electrode 401 and the light-emitting region in the second light-emitting layer (G) 404G; therefore, it is assumed that the above effect can be sufficiently obtained wherever the reflection region and the light-emitting region may be set in the reflective electrode 401 and the second light-emitting layer (G) 404G, respectively.

Next, in the third light-emitting element (B) 410B, the optical path length from the reflective electrode 401 to the first light-emitting layer (B) 404B is adjusted to a desired thickness $((2m'''+1)\lambda_B/4$, where m''' is a natural number); thus, light emitted from the first light-emitting layer (B) 404B can be amplified. Light (third reflected light) that is reflected by the reflective electrode 401 of the light emitted from the first light-emitting layer (B) 404B interferes with light (third incident light) that directly enters the semi-transmissive and semi-reflective electrode 402 from the first light-emitting layer (B) 404B. Therefore, by adjusting the optical path length from the reflective electrode 401 to the first light-emitting layer (B) 404B to the desired value $((2m'''+1)\lambda_B/4$, where m''' is a natural number), the phases of the third reflected light and the third incident light can be aligned with each other and the light emitted from the first light-emitting layer (B) 404B can be amplified.

Note that, strictly speaking, the optical path length from the reflective electrode 401 to the first light-emitting layer (B) 404B in the third light-emitting element can be the optical path length from a reflection region in the reflective electrode 401 to a light-emitting region in the first light-emitting layer (B) 404B. However, it is difficult to precisely determine the positions of the reflection region in the reflective electrode 401 and the light-emitting region in the first light-emitting layer (B) 404B; therefore, it is assumed that the above effect can be sufficiently obtained wherever the reflection region and the light-emitting region may be set in the reflective electrode 401 and the first light-emitting layer (B) 404B, respectively.

Note that although each of the light-emitting elements in the above-described structure includes a plurality of light-emitting layers in the EL layer, the present invention is not limited thereto; for example, the structure of the tandem light-emitting element which is described in Embodiment 3 can be combined, in which case a plurality of EL layers are provided so as to sandwich a charge-generation layer in one light-emitting element and one or more light-emitting layers are formed in each of the EL layers.

The light-emitting device described in this embodiment has a microcavity structure, in which light with wavelengths which differ depending on the light-emitting elements can be extracted even when they include the same EL layers, so that it is not needed to form light-emitting elements for the colors of R, G, and B. Therefore, the above structure is advantageous for full color display owing to easiness in achieving higher resolution display or the like. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Embodiment 5

In this embodiment, as a light-emitting device utilizing phosphorescence, which is one embodiment of the present invention, a light-emitting device including a light-emitting element in which a phosphorescent organometallic iridium complex is used in a light-emitting layer is described.

The light-emitting device utilizing phosphorescence, which is one embodiment of the present invention, can be either a passive matrix light-emitting device or an active matrix light-emitting device. Note that any of the light-emitting elements described in the other embodiments can be applied to the light-emitting device described in this embodiment.

In this embodiment, as a light-emitting device utilizing phosphorescence which is one embodiment of the present invention, an active matrix light-emitting device is described with reference to FIGS. 5A and 5B.

Figure 5A:
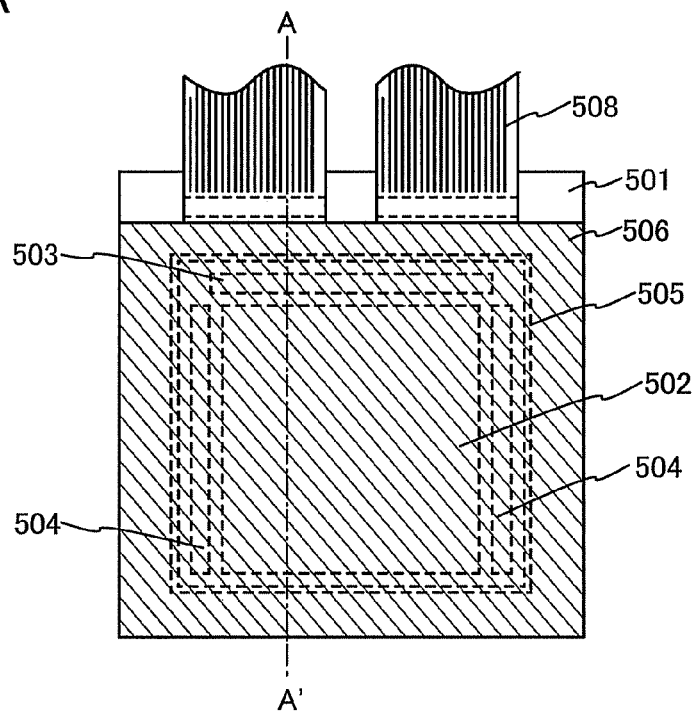
FIGS. 5A and 5B illustrate a light-emitting device.
Figure 5B:
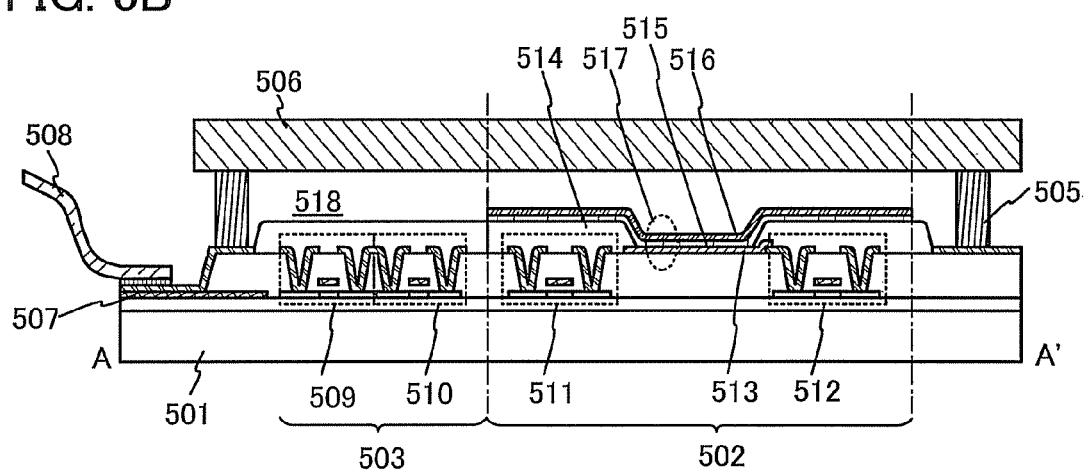

Note that FIG. 5A is a top view illustrating a light-emitting device and FIG. 5B is a cross-sectional view taken along the chain line A-A' in FIG. 5A. The active matrix light-emitting device according to this embodiment includes a pixel portion 502 provided over an element substrate 501, a driver circuit portion (a source line driver circuit) 503, and a driver circuit portion (a gate line driver circuit) 504. The pixel portion 502, the driver circuit portion 503, and the driver circuit portion 504 are sealed between the element substrate 501 and the sealing substrate 506 by a sealant 505.

In addition, there is provided a lead wiring 507 over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portion 504. Here is shown an example in which a flexible printed circuit (FPC) 508 is provided as the external input terminal. Although the FPC 508 is illustrated alone, this FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501; here are illustrated the driver circuit portion 503 which is the source line driver circuit and the pixel portion 502.

The driver circuit portion 503 is an example where a CMOS circuit is formed, which is a combination of an n-channel TFT 509 and a p-channel TFT 510. Note that the driver circuit portion may be formed using various circuits including TFTs, such as a CMOS circuit, a PMOS circuit, or an NMOS circuit. Although this embodiment shows a driver integrated type in which the driver circuit is formed over the substrate, the driver circuit is not necessarily formed over the substrate, and the driver circuit can be formed outside, not over the substrate.

The pixel portion 502 is formed of a plurality of pixels each of which includes a switching TFT 511, a current control TFT 512, and a first electrode (anode) 513 which is electrically connected to a wiring (a source electrode or a drain electrode) of the current control TFT 512. Note that an insulator 514 is formed to cover end portions of the first electrode (anode) 513. In this embodiment, the insulator 514 is formed using a positive photosensitive acrylic resin.

The insulator 514 preferably has a curved surface with curvature at an upper end portion or a lower end portion thereof in order to obtain favorable coverage by a film which is to be stacked over the insulator 514. For example, in the case of using a positive photosensitive acrylic resin as a material for the insulator 514, the insulator 514 preferably has a curved surface with a curvature radius (0.2 µm to 3 µm) at the upper end portion. Note that the insulator 514 can be formed using either a negative photosensitive material that becomes insoluble in an etchant by light irradiation or a positive photosensitive material that becomes soluble in an etchant by light irradiation. It is possible to use, without limitation to an organic compound, either an organic compound or an inorganic compound such as silicon oxide or silicon oxynitride.

An EL layer 515 and a second electrode (cathode) 516 are stacked over the first electrode (anode) 513. In the EL layer 515, at least a light-emitting layer which contains a phosphorescent organometallic iridium complex is provided. Further, in the EL layer 515, a hole-injection layer, a hole-transport layer, an electron-transport layer, an electron-injection layer, a charge-generation layer, and the like can be provided as appropriate in addition to the light-emitting layer.

A light-emitting element 517 is formed of a stacked structure of the first electrode (anode) 513, the EL layer 515, and the second electrode (cathode) 516. For the first electrode (anode) 513, the EL layer 515, and the second electrode (cathode) 516, the materials described in Embodiment 1 can be used. Although not illustrated, the second electrode (cathode) 516 is electrically connected to an FPC 508 which is an external input terminal.

Although the cross-sectional view of FIG. 5B illustrates only one light-emitting element 517, a plurality of light-emitting elements are arranged in matrix in the pixel portion 502. Light-emitting elements which provide three kinds of light emission (R, G, and B) are selectively formed in the pixel portion 502, whereby a light-emitting device capable of full color display can be fabricated. Alternatively, a light-emitting device which is capable of full color display may be fabricated by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. The space 518 may be filled with an inert gas (such as nitrogen or argon), or the sealant 505.

An epoxy-based resin is preferably used for the sealant 505. It is preferable that such a material do not transmit moisture or oxygen as much as possible. As the sealing substrate 506, a glass substrate, a quartz substrate, or a plastic substrate formed of fiberglass reinforced plastic (FRP), polyvinyl fluoride (PVF), polyester, acrylic, or the like can be used.

As described above, an active matrix light-emitting device utilizing phosphorescence can be obtained.

Note that the structure described in this embodiment can be combined as appropriate with any of the structures described in the other embodiments.

Embodiment 6

In this embodiment, examples of a variety of electronic devices which are completed using a light-emitting device will be described with reference to FIGS. 6A to 6D. The light-emitting device utilizes phosphorescence and is one embodiment of the present invention.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices are illustrated in FIGS. 6A to 6D.

Figure 6A:
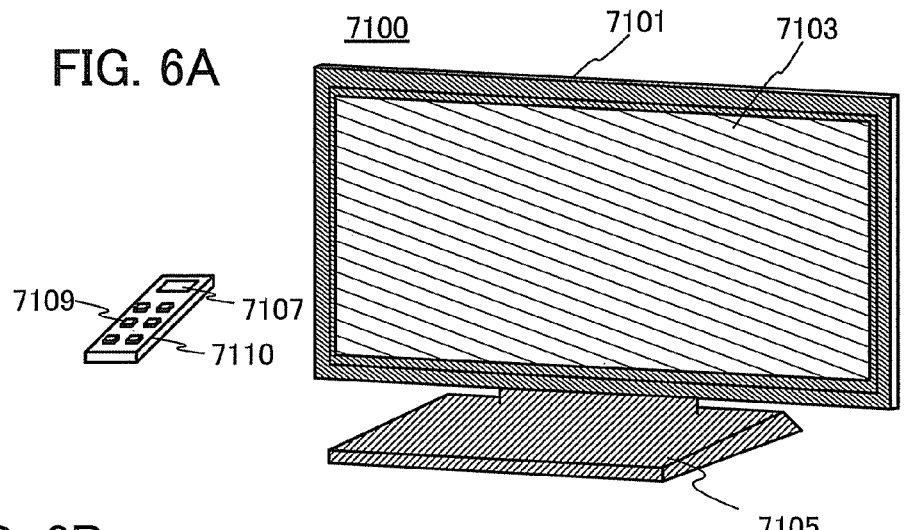
FIGS. 6A to 6D illustrate electronic devices.

FIG. 6A illustrates an example of a television set. In a television set 7100, a display portion 7103 is incorporated in a housing 7101. Images can be displayed on the display portion 7103, and the light-emitting device can be used for the display portion 7103. In addition, here, the housing 7101 is supported by a stand 7105.

Operation of the television set 7100 can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

Figure 6B:
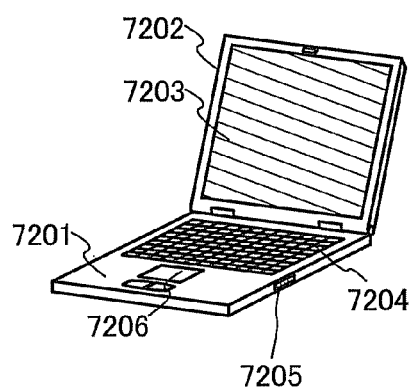

FIG. 6B illustrates a computer having a main body 7201, a housing 7202, a display portion 7203, a keyboard 7204, an external connection port 7205, a pointing device 7206, and the like. Note that this computer is manufactured using the light-emitting device for the display portion 7203.

Figure 6C:
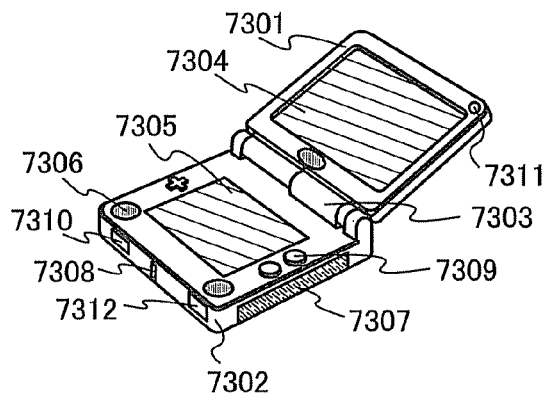

FIG. 6C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 6C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device is used for at least one of the display portion 7304 and the display portion 7305, and may include other accessories as appropriate. The portable game machine illustrated in FIG. 6C has a function of reading out a program or data stored in a storage medium to display it on the display portion, and a function of sharing information with another portable game machine by wireless communication. The portable game machine illustrated in FIG. 6C can have a variety of functions without limitation to the above.

Figure 6D:
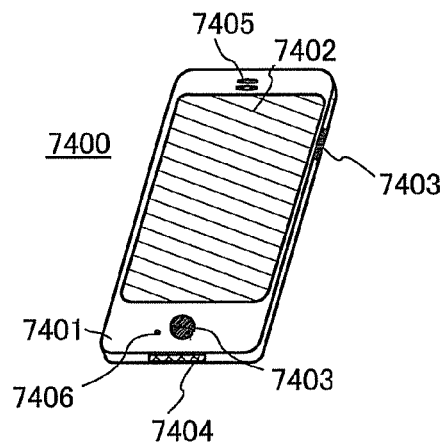

FIG. 6D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 6D is touched with a finger or the like, data can be input to the mobile phone 7400. Further, operations such as making a call and composing an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

As described above, the electronic devices can be obtained by application of the light-emitting device according to one embodiment of the present invention. The light-emitting device has a remarkably wide application range, and can be applied to electronic devices in a variety of fields.

Note that the structure described in this embodiment can be combined as appropriate with any of the structures described in the other embodiments.

Embodiment 7

In this embodiment, examples of a lighting device to which a light-emitting device utilizing phosphorescence which is one embodiment of the present invention is applied will be described with reference to FIG. 7.

Figure 7:
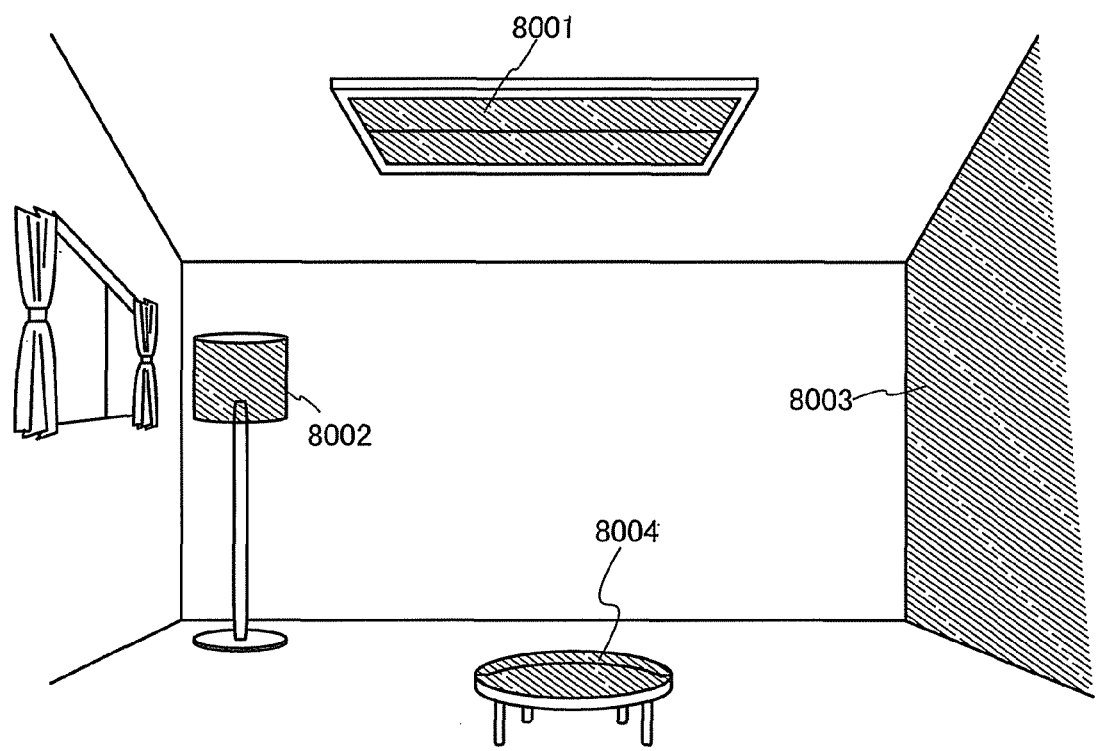
FIG. 7 illustrates lighting devices.

FIG. 7 illustrates an example in which the light-emitting device is used as an indoor lighting device 8001. Since the light-emitting device can have a larger area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

Example 1

Figure 8:
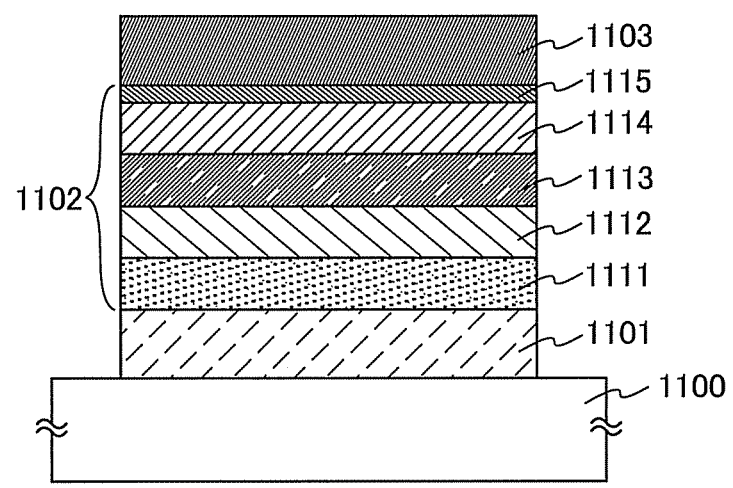
FIG. 8 illustrates a light-emitting element.

In this example, Light-emitting Element in which the phosphorescent organometallic iridium complex [Ir(dptzn)$_2$(acac)] (Structural Formula (103)) is used for a light-emitting layer is described with reference to FIG. 8. Chemical formulae of materials used in this example are shown below.

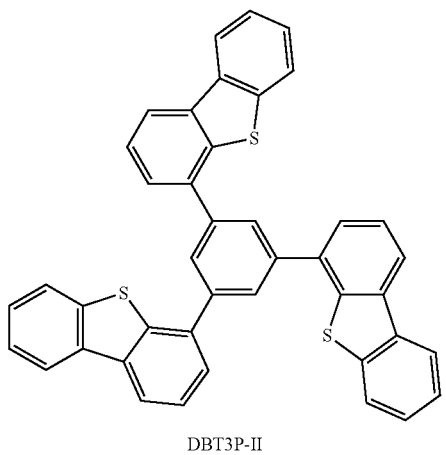

DBT3P-II

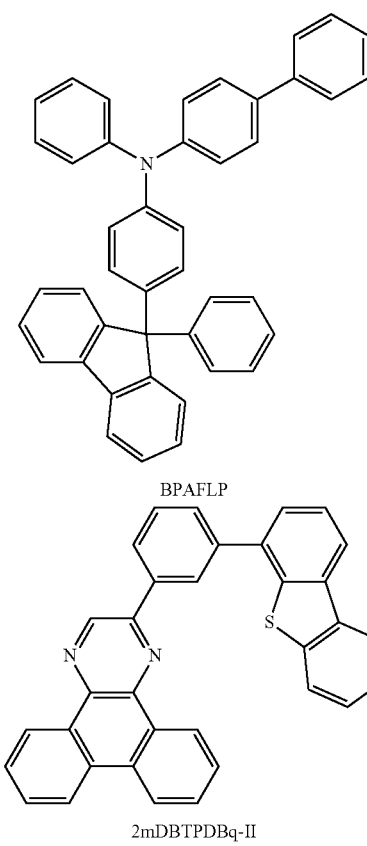

BPAFLP

2mDBTPDBq-II

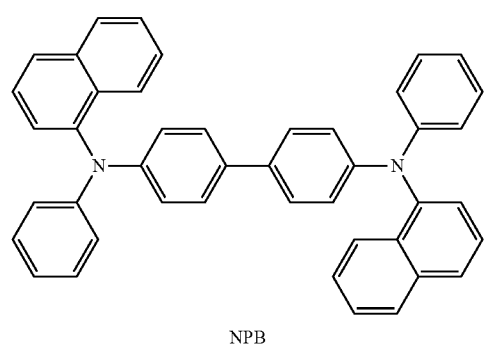

NPB

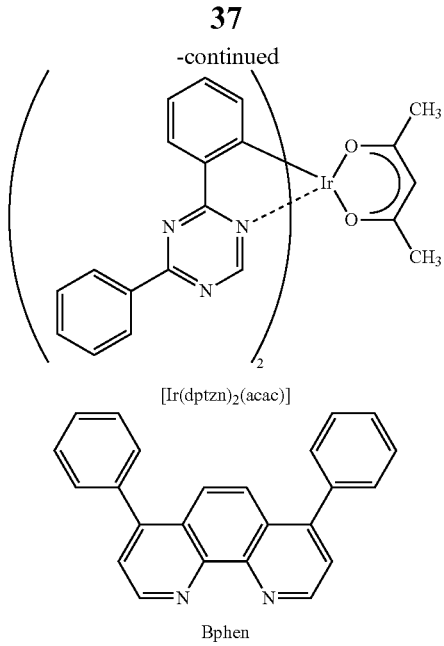

[Ir(dptzn)₂(acac)]

Bphen

<<Manufacture of Light-Emitting Element 1>>

First, indium tin oxide containing silicon oxide (ITSO) was deposited over a glass substrate 1100 by a sputtering method, so that a first electrode 1101 which functions as an anode was formed. The thickness was 110 nm and the electrode area was 2 mm×2 mm.

Then, as pretreatment for forming Light-emitting Element 1 over the substrate 1100, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 1100 was cooled down for about 30 minutes.

Next, the substrate 1100 was fixed to a holder provided in the vacuum evaporation apparatus so that a surface of the substrate 1100 over which the first electrode 1101 was formed faced downward. In this example, a case will be described in which a hole-injection layer 1111, a hole-transport layer 1112, a light-emitting layer 1113, an electron-transport layer 1114, and an electron-injection layer 1115 which are included in an EL layer 1102 are sequentially formed by a vacuum evaporation method.

After reducing the pressure of the vacuum evaporation apparatus to $10^{-4}$ Pa, 1,3,5-tri(dibenzothiophen-4-yl)benzene (abbreviation: DBT3P-II) and molybdenum(VI) oxide were co-evaporated with a mass ratio of DBT3P-II (abbreviation) to molybdenum oxide being 4:2, whereby the hole-injection layer 1111 was formed over the first electrode 1101. The thickness of the hole-injection layer 1111 was 40 nm. Note that the co-evaporation is an evaporation method in which some different substances are evaporated from some different evaporation sources at the same time.

Then, 4-phenyl-4'-(9-phenylfluoren-9-yl)triphenylamine (abbreviation: BPAFLP) was evaporated to a thickness of 20 nm, so that the hole-transport layer 1112 was formed.

Next, the light-emitting layer 1113 was formed over the hole-transport layer 1112. Co-evaporated were 2-[3-(dibenzothiophen-4-yl)phenyl]dibenzo[f,h]quinoxaline (abbreviation: 2mDBTPDBq-II), 4,4'-bis[N-(1-naphthyl)-N-phenylamino]biphenyl (abbreviation: NPB), and (acetylacetonato)bis(2,4-diphenyl-1,3,5-triazinato)iridium(III) (abbreviation: [Ir(dptzn)₂(acac)]) with a mass ratio of 2mDBTPDBq-II (abbreviation) to NPB (abbreviation) and [Ir(dptzn)₂(acac)] (abbreviation) being 0.8:0.2:0.01, whereby the light-emitting layer 1113 was formed. The thickness of the light-emitting layer 1113 was 40 nm.

Then, 2-[3-(dibenzothiophen-4-yl)phenyl]dibenzo[f,h]quinoxaline (abbreviation: 2mDBTPDBq-II) was evaporated to a thickness of 10 nm over the light-emitting layer 1113 and bathophenanthroline (abbreviation: Bphen) was evaporated to a thickness of 20 nm, whereby the electron-transport layer 1114 was formed. Furthermore, lithium fluoride was evaporated to a thickness of 1 nm over the electron-transport layer 1114, whereby the electron-injection layer 1115 was formed.

Finally, aluminum was evaporated to a thickness of 200 nm over the electron-injection layer 1115 to form the second electrode 1103 serving a cathode; thus, Light-emitting Element 1 was obtained. Note that in all the above evaporation steps, evaporation was performed by a resistance-heating method.

An element structure of Light-emitting Element 1 obtained as described above is shown in Table 1.

TABLE 1

| | First Electrode | Hole-injection Layer | Hole-transport Layer | Light-emitting Layer | Electron-transport Layer | | Electron-injection Layer | Second Electrode |
|---|---|---|---|---|---|---|---|---|
| Light-emitting Element 1 | ITSO (110 nm) | DBT3P-II: MoOx (4:2 40 nm) | BPAFLP (20 nm) | 2mDBTPDBq-II: NPB:[Ir(dptzn)₂(acac)] (0.8:0.2:0.01 40 nm) | 2mDBTPDBq-II (10 nm) | Bphen (20 nm) | LiF (1 nm) | Al (200 nm) |

Further, the manufactured Light-emitting Element 1 was sealed in a glove box containing a nitrogen atmosphere so as not to be exposed to the air (specifically, a sealant was applied onto an outer edge of the element and heat treatment was performed at 80° C. for 1 hour at the time of sealing).

<<Operation Characteristics of Light-Emitting Element 1>>

Operation characteristics of the manufactured Light-emitting Element 1 were measured. Note that the measurement was carried out at room temperature (under an atmosphere in which the temperature was kept at 25° C.).

Figure 9:
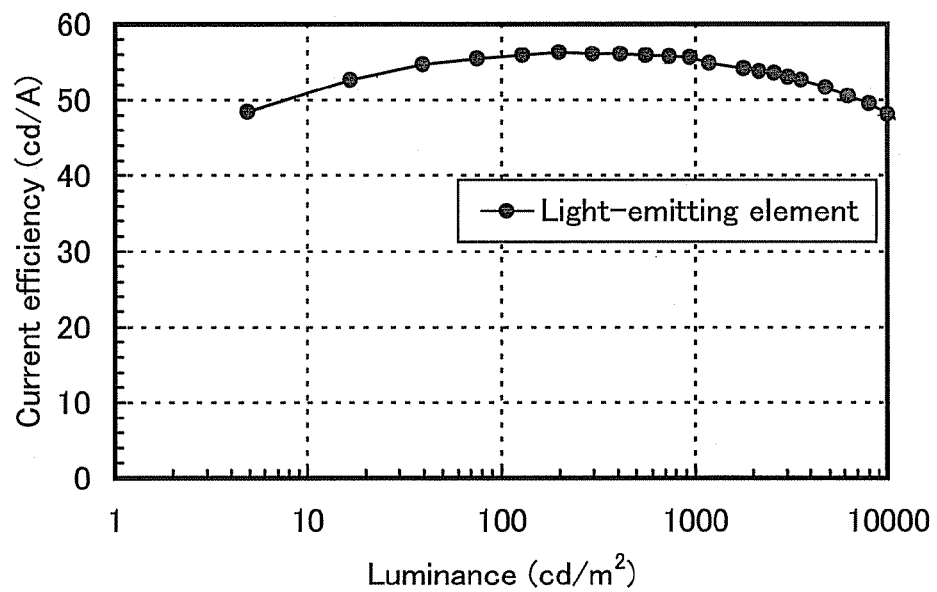
FIG. 9 shows luminance vs. current efficiency characteristics of Light-emitting Element 1.
Figure 10:
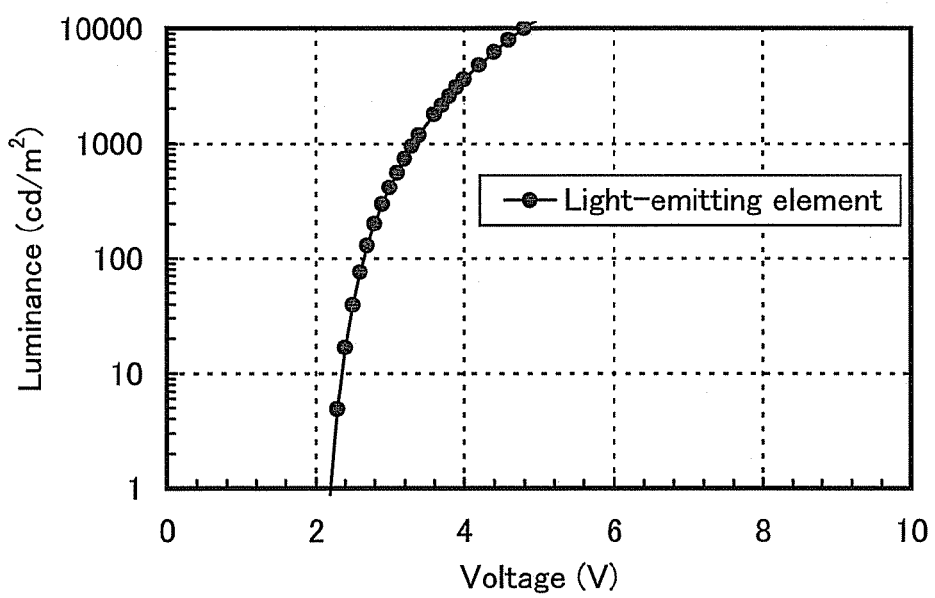
FIG. 10 shows voltage vs. luminance characteristics of Light-emitting Element 1.

FIG. 9 shows luminance vs. current efficiency characteristics of Light-emitting Element 1. In FIG. 9, the vertical axis represents current efficiency (cd/A) and the horizontal axis represents luminance (cd/m²). FIG. 10 shows voltage vs. luminance characteristics of Light-emitting Element 1. In FIG. 10, the vertical axis represents luminance (cd/m²) and the horizontal axis represents voltage (V). Table 2 below shows initial values of main characteristics of Light-emitting Element 1 at a luminance of about 1000 cd/m².

TABLE 2

| | Voltage (V) | Current (mA) | Current Density (mA/cm$^2$) | Chromaticity (x, y) | Luminance (cd/m$^2$) | Power Efficienty (lm/W) | External Quantum Efficiency (%) |
|---|---|---|---|---|---|---|---|
| Light-emitting Element 1 | 3.3 | 0.07 | 1.7 | (0.55, 0.44) | 940 | 52.9 | 22 |

From the above results, Light-emitting Element 1 manufactured in this example has high external quantum efficiency, which means its high emission efficiency. Moreover, as for color purity, it can be found that the light-emitting element exhibits orange emission with excellent color purity.

Figure 11:
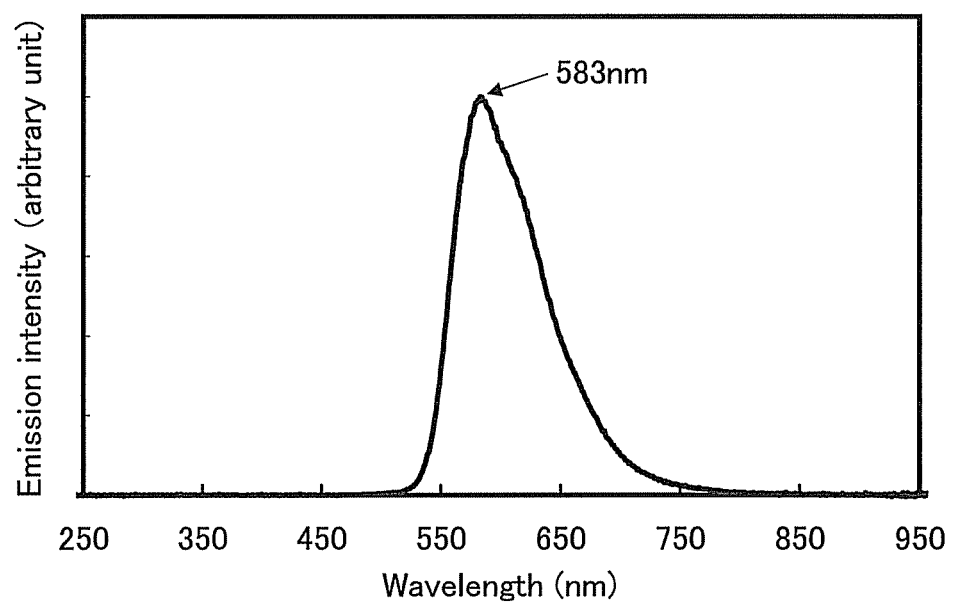
FIG. 11 shows an emission spectrum of Light-emitting Element 1.

FIG. 11 shows an emission spectrum when a current at a current density of 25 mA/cm$^2$ was supplied to the light-emitting element. As shown in FIG. 11, the emission spectrum of Light-emitting Element 1 has a peak at 583 nm and it is indicated that the emission spectrum is derived from emission of the phosphorescent organometallic iridium complex [Ir(dptzn)$_2$(acac)] (abbreviation).

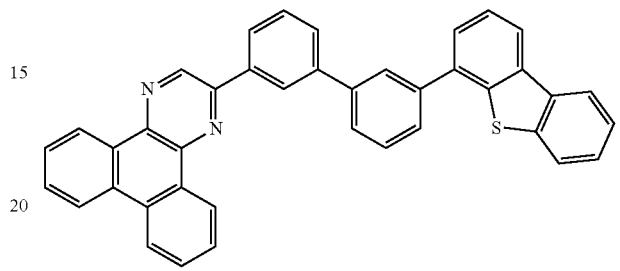

2mDBTBPDBq-II

Example 2

In this example, Light-emitting Element 2 in which a phosphorescent organometallic iridium complex [Ir(dppm)$_2$(acac)] (Structural Formula (100)) is used in a light-emitting layer was manufactured and the operation characteristics and reliability thereof were measured. Note that Light-emitting Element 2 in this example can be manufactured in a similar manner to Light-emitting Element 1 manufactured in Example 1 except that 2-[3'-(dibenzothiophen-4-yl)biphenyl-3-yl]dibenzo[f,h]quinoxaline (abbreviation: 2mDBTBP-DBq-II) was used in place of 2mDBTPDBq-II which was used in the light-emitting layer and the electron-transport layer in Example 1, 4,4'-di(1-naphthyl)-4"-(9-phenyl-9H-carbazol-3-yl)triphenylamine (abbreviation: PCBNBB) was used in place of NPB which was used in the light-emitting layer in Example 1, and the mass ratio in the light-emitting layer partly differed from that in the case of Light-emitting Element 1. Therefore, Example 1 is to be referred to for a manufacturing method of Light-emitting Element 2, description of which is omitted here. Further, structural formulae of the substances which were additionally used in this example are shown below.

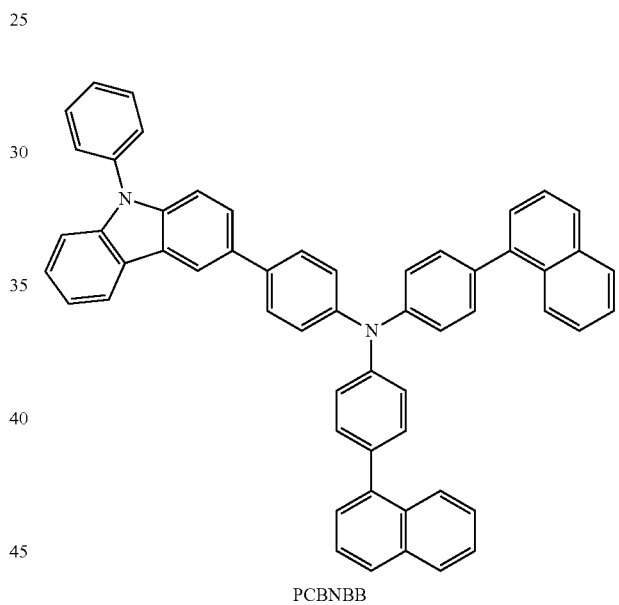

PCBNBB

An element structure of Light-emitting Element 2 manufactured in this example is shown in Table 3 below.

TABLE 3

| | First Electrode | Hole-injection Layer | Hole-transport Layer | Light-emitting Layer | Electron-transport Layer | Electron-injection Layer | Second Electrode |
|---|---|---|---|---|---|---|---|
| Light-emitting Element 2 | ITSO (110 nm) | DBT3P-II: MoOx (4:2 40 nm) | BPAFLP (20 nm) | 2mDBTBPDBq-II: PCBNBB: [Ir(dppm)$_2$(acac)] (0.8:0.2:0.05 40 nm) | 2mDBTBPDBq-II (10 nm) | Bphen (20 nm) | LiF (1 nm) | Al (200 nm) |

<<Operation Characteristics of Light-Emitting Element 2>>

Operation characteristics of the manufactured Light-emitting Element 1 were measured. Note that the measurement was carried out at room temperature (under an atmosphere in which the temperature was kept at 25° C.).

Figure 16:
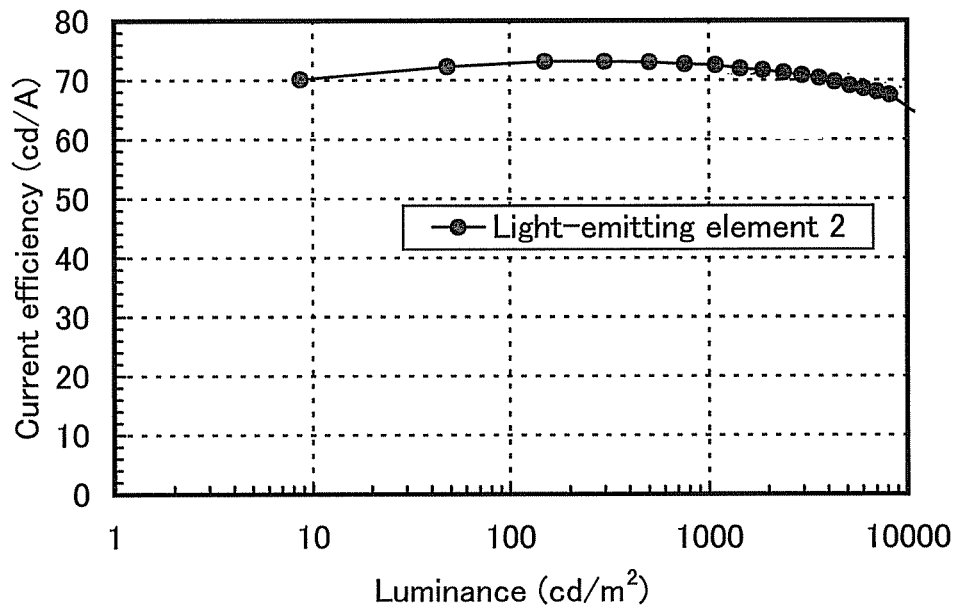
FIG. 16 shows luminance vs. current efficiency characteristics of Light-emitting Element 2.
Figure 17:
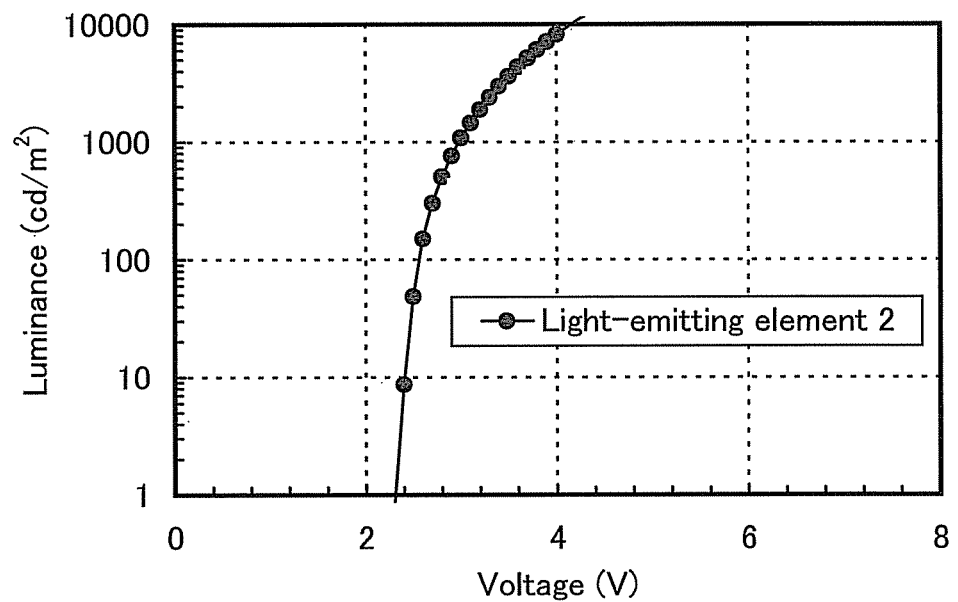
FIG. 17 shows voltage vs. luminance characteristics of Light-emitting Element 2.

FIG. 16 shows luminance vs. current efficiency characteristics of Light-emitting Element 2. In FIG. 16, the vertical axis represents current efficiency (cd/A) and the horizontal axis represents luminance (cd/m$^2$). FIG. 17 shows voltage vs. luminance characteristics of Light-emitting Element 2. In FIG. 17, the vertical axis represents luminance (cd/m$^2$) and the horizontal axis represents voltage (V). Table 4 below shows initial values of main characteristics of Light-emitting Element 2 at a luminance of about 1000 cd/m$^2$.

TABLE 4

|  | Voltage (V) | Current (mA) | Current Density (mA/cm$^2$) | Chromaticity (x, y) | Luminance (cd/m$^2$) | Power Efficiency (lm/W) | External Quantum Efficiency (%) |
|---|---|---|---|---|---|---|---|
| Light-emitting Element 2 | 3 | 0.060 | 1.5 | (0.57, 0.43) | 1100 | 76 | 30 |

From the above results, Light-emitting Element 2 manufactured in this example has high external quantum efficiency, which means its high emission efficiency. Moreover, as for color purity, it can be found that the light-emitting element exhibits orange emission with excellent color purity.

Figure 18:
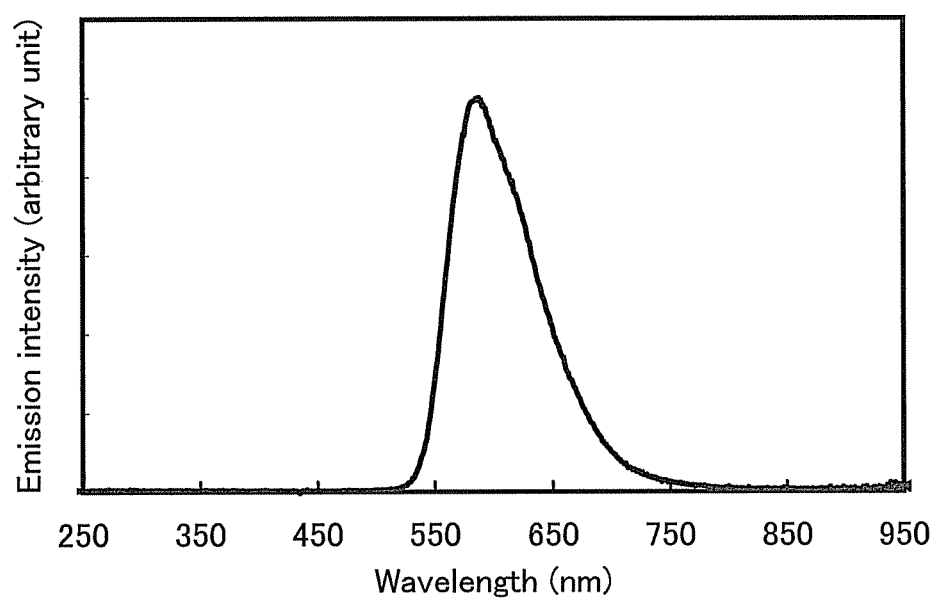
FIG. 18 shows an emission spectrum of Light-emitting Element 2.

FIG. 18 shows an emission spectrum when a current at a current density of 25 mA/cm$^2$ was supplied to Light-emitting Element 2. As shown in FIG. 18, the emission spectrum of Light-emitting Element 2 has a peak at 591 nm and it is indicated that the emission spectrum is derived from emission of the phosphorescent organometallic iridium complex [Ir(dppm)$_2$(acac)].

Figure 19:
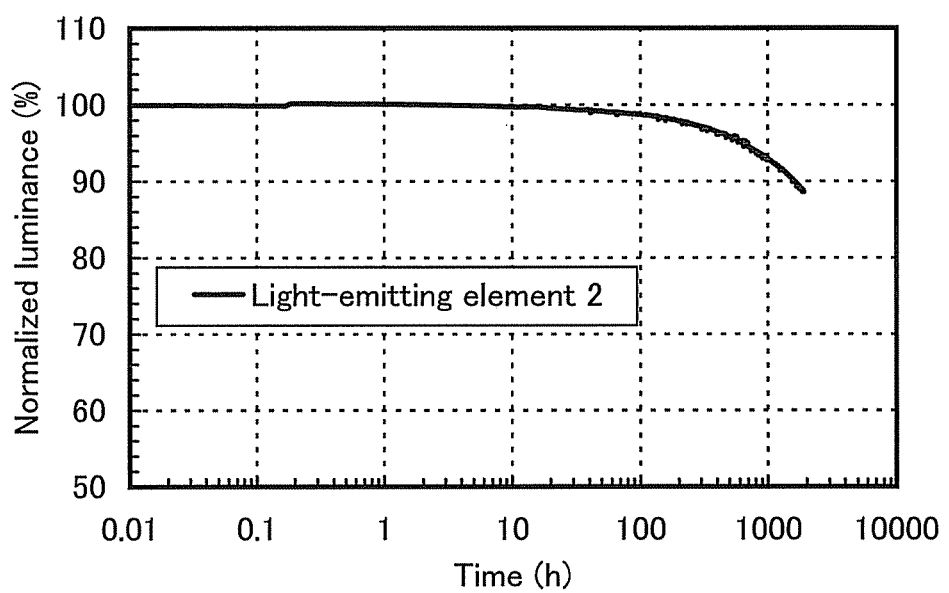
FIG. 19 shows reliability of Light-emitting Element 2.

FIG. 19 shows results obtained by reliability testing of Light-emitting Element 2. In FIG. 19, the vertical axis represents normalized luminance (%) with an initial luminance of 100% and the horizontal axis represents driving time (h) of the element. Note that in the reliability test, Light-emitting Element 2 was driven under the conditions where the initial luminance was set to 5000 cd/m$^2$ and the current density was constant. Light-emitting Element 2 kept about 90% of the initial luminance after 1700 hours elapsed.

The results showed high reliability of Light-emitting Element 2. In addition, it was confirmed that with the use of the phosphorescent organometallic iridium complex of one embodiment of the present invention, a light-emitting element with long lifetime can be obtained.

Example 3

In this example, Light-emitting Element 3 in which a phosphorescent organometallic iridium complex [Ir(tBuppm)$_2$(acac)] (Structural Formula (105)) is used in a light-emitting layer was manufactured and the operation characteristics and reliability thereof were measured. Note that Light-emitting Element 3 in this example can be manufactured in a similar manner to Light-emitting Element 1 manufactured in Example 1 except that Light-emitting Element 3 differed from Light-emitting Element 1 in part of the kinds, mass ratio, thickness, and the like of materials used in the light-emitting layer and the electron-transport layer. Therefore, Example 1 is to be referred to for a manufacturing method of Light-emitting Element 3, description of which is omitted here.

An element structure of Light-emitting Element 3 manufactured in this example is shown in Table 5 below.

TABLE 5

|  | First Electrode | Hole-injection Layer | Hole-transport Layer | Light-emitting Layer | Electron-transport Layer | Electron-injection Layer | Second Electrode |
|---|---|---|---|---|---|---|---|
| Light-emitting Element 3 | ITSO (110 nm) | DBT3P-II: MoOx (4:2 40 nm) | BPAFLP (20 nm) | 2mDBTBPDBq-II: PCBNBB: [Ir(tBuppm)$_2$(acac)] (0.8:0.2:0.05 40 nm) | 2mDBTBPDBq-II (10 nm) Bphen (20 nm) | LiF (1 nm) | Al (200 nm) |

<<Operation Characteristics of Light-Emitting Element 3>>

Operation characteristics of the manufactured Light-emitting Element 3 were measured. Note that the measurement was carried out at room temperature (under an atmosphere in which the temperature was kept at 25° C.).

Figure 20:
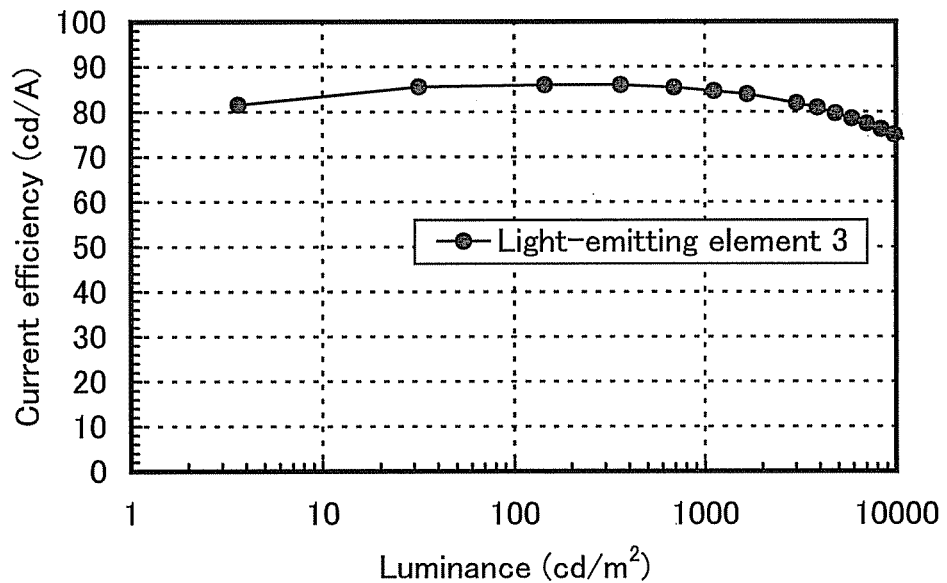
FIG. 20 shows luminance vs. current efficiency characteristics of Light-emitting Element 3.
Figure 21:
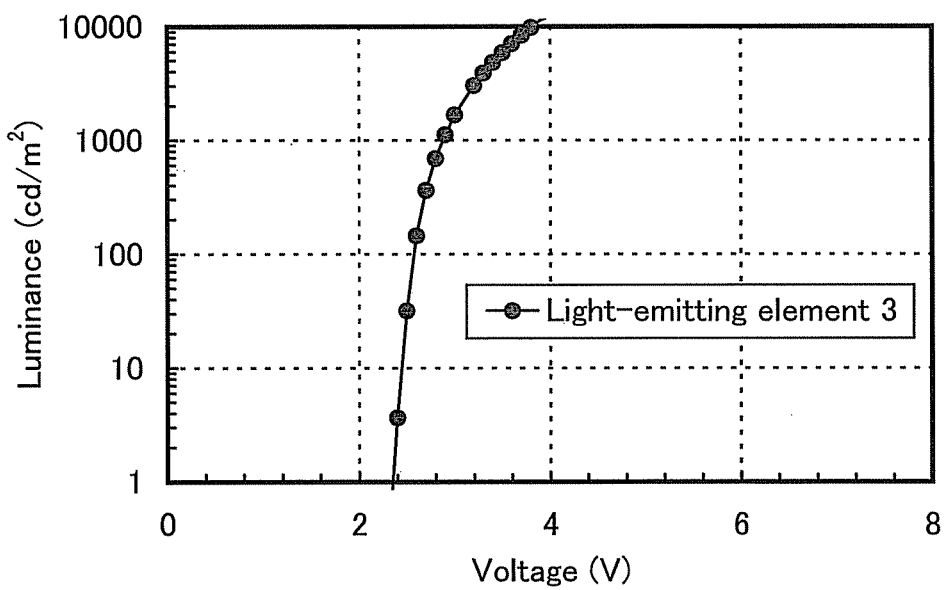
FIG. 21 shows voltage vs. luminance characteristics of Light-emitting Element 3.

FIG. 20 shows luminance vs. current efficiency characteristics of Light-emitting Element 3. In FIG. 20, the vertical axis represents current efficiency (cd/A) and the horizontal axis represents luminance (cd/m$^2$). FIG. 21 shows voltage vs. luminance characteristics of Light-emitting Element 3. In FIG. 21, the vertical axis represents luminance (cd/m$^2$) and the horizontal axis represents voltage (V). Table 6 below shows initial values of main characteristics of Light-emitting Element 3 at a luminance of about 1000 cd/m$^2$.

TABLE 6

|  | Voltage (V) | Current (mA) | Current Density (mA/cm$^2$) | Chromaticity (x, y) | Luminance (cd/m$^2$) | Power Efficienty (lm/W) | External Quantum Efficiency (%) |
|---|---|---|---|---|---|---|---|
| Light-emitting Element 3 | 2.9 | 0.053 | 1.3 | (0.43, 0.56) | 1100 | 92 | 24 |

From the above results, Light-emitting Element 3 manufactured in this example has high external quantum efficiency, which means its high emission efficiency. Moreover, as for color purity, it can be found that the light-emitting element exhibits green emission with excellent color purity.

Figure 22:
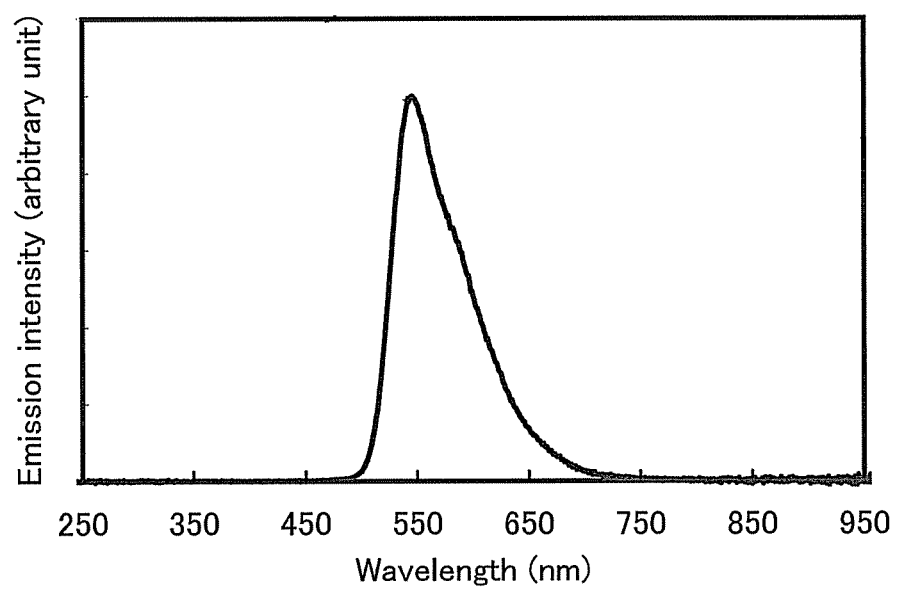
FIG. 22 shows an emission spectrum of Light-emitting Element 3.

FIG. 22 shows an emission spectrum when a current at a current density of 25 mA/cm$^2$ was supplied to Light-emitting Element 3. As shown in FIG. 22, the emission spectrum of Light-emitting Element 3 has a peak at 548 nm and it is indicated that the emission spectrum is derived from emission of the phosphorescent organometallic iridium complex [Ir(tBuppm)$_2$(acac)].

Figure 23:
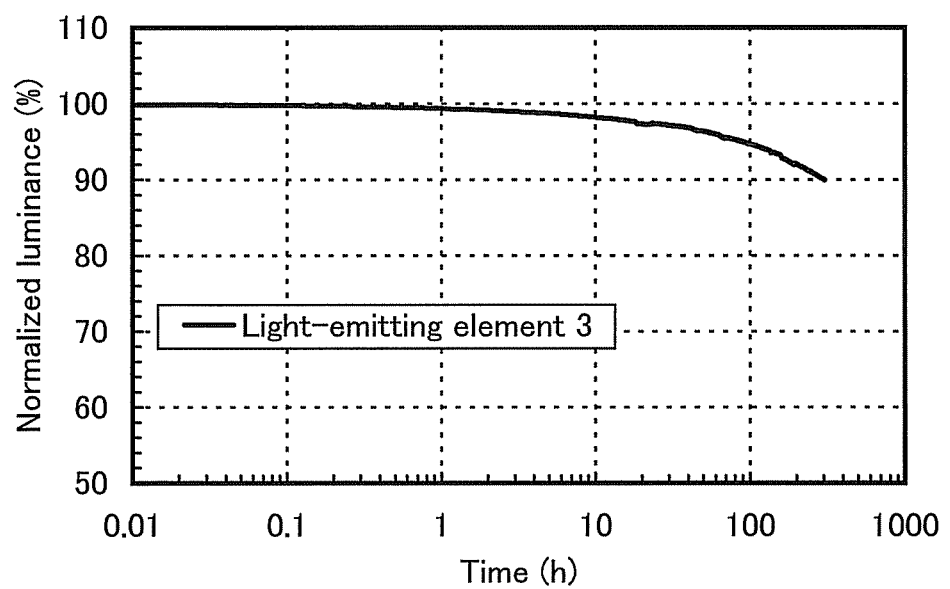
FIG. 23 shows reliability of Light-emitting Element 3.

FIG. 23 shows results obtained by reliability testing of Light-emitting Element 3. In FIG. 23, the vertical axis represents normalized luminance (%) with an initial luminance of 100% and the horizontal axis represents driving time (h) of the element. Note that in the reliability test, Light-emitting Element 3 was driven under the conditions where the initial luminance was set to 5000 cd/m$^2$ and the current density was constant. Light-emitting Element 3 kept about 90% of the initial luminance after 300 hours elapsed.

The results showed high reliability of Light-emitting Element 3. In addition, it was confirmed that with the use of the phosphorescent organometallic iridium complex of one embodiment of the present invention, a light-emitting element with long lifetime can be obtained.

Example 4

Figure 30:
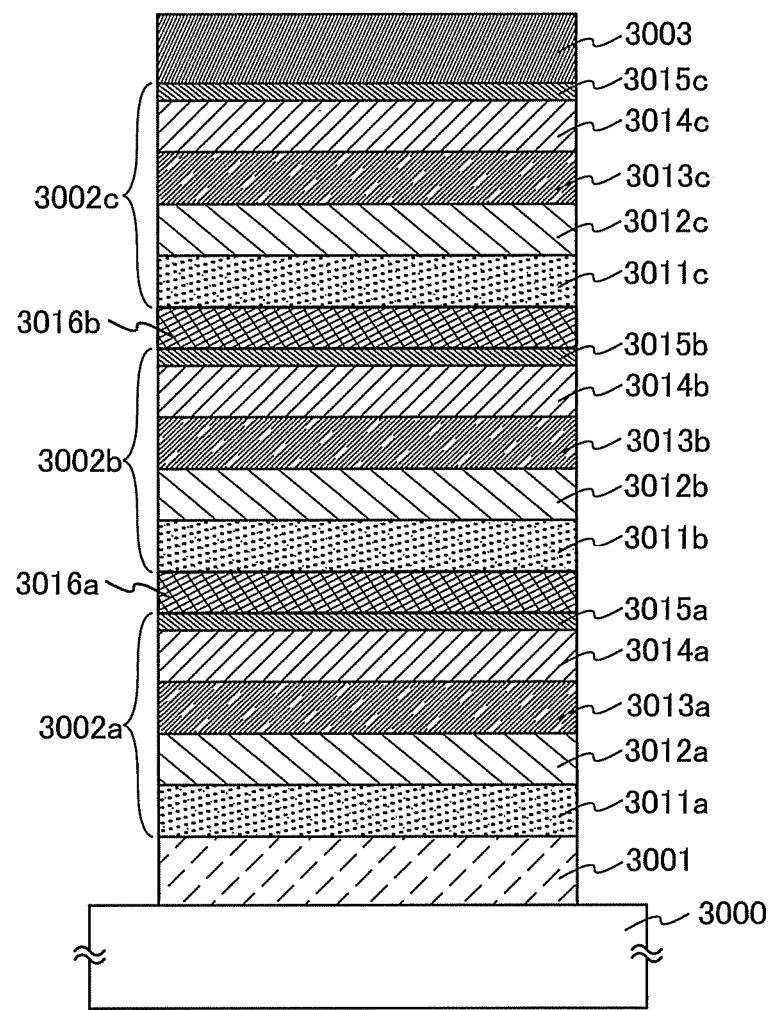
FIG. 30 illustrates a light-emitting element.

In this example, Light-emitting Element 4 which is illustrated in FIG. 30 and in which a phosphorescent organometallic iridium complex [Ir(tBuppm)$_2$(acac)] (Structural Formula (105)) is used in a light-emitting layer was manufactured and the operation characteristics and reliability thereof were measured. Note that Light-emitting Element 4 manufactured in this example is a light-emitting element (hereinafter referred to as tandem light-emitting element) which is described in Embodiment 3 and in which a plurality of EL layers are included so as to sandwich a charge-generation layer. Chemical formulae of materials used in this example are shown below.

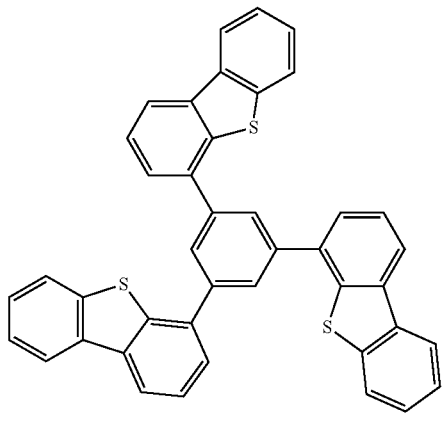

DBT3P-II

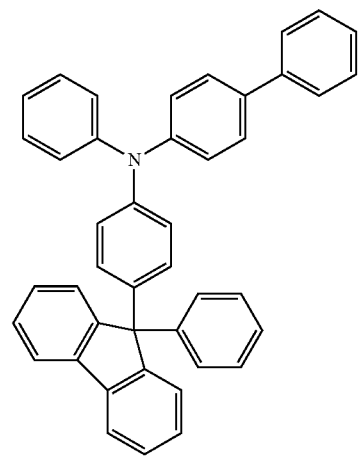

BPAFLP

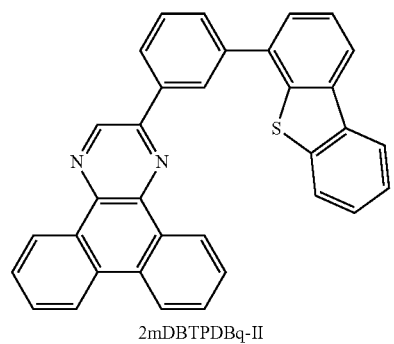

2mDBTPDBq-II

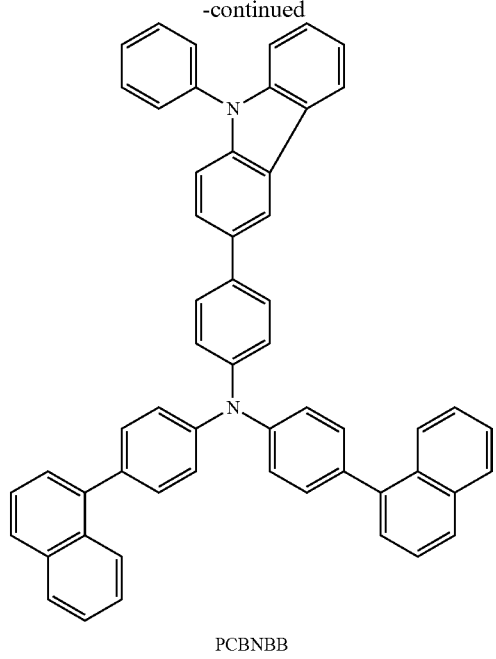
PCBNBB
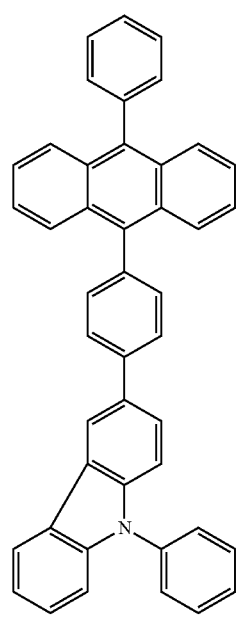
PCzPA
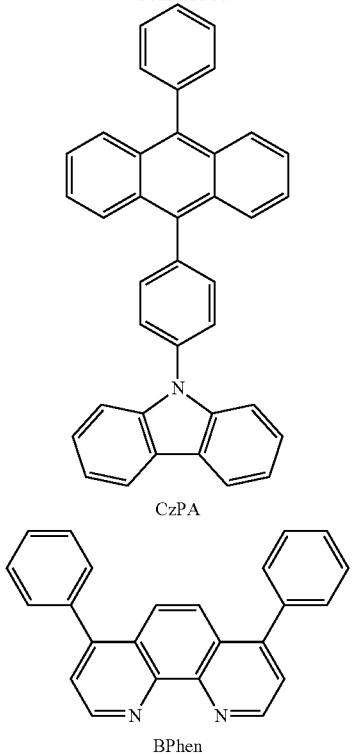
CzPA
BPhen
1,6mMEmFLPAPm
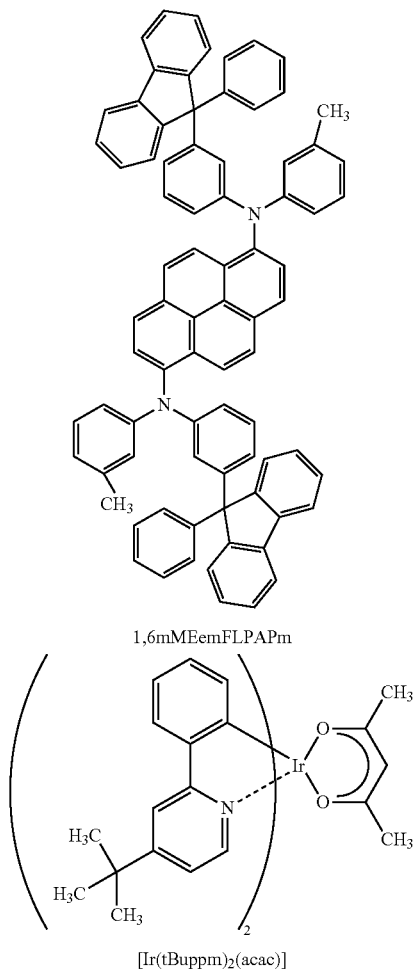
[Ir(tBuppm)₂(acac)]

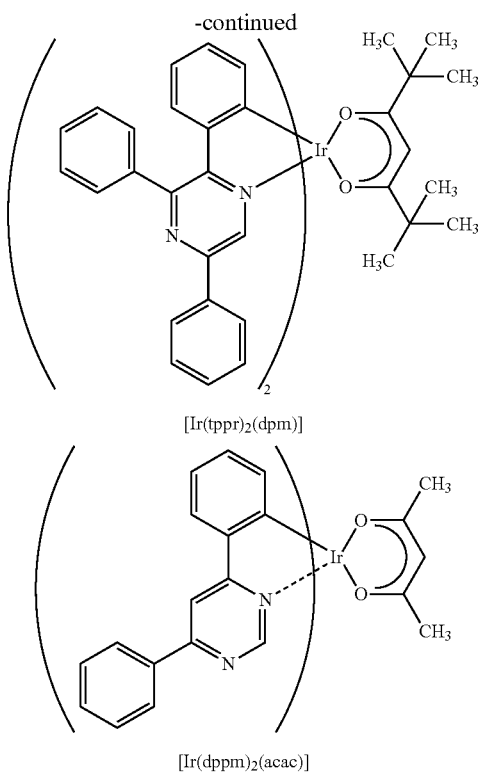

[Ir(tppr)₂(dpm)]

[Ir(dppm)₂(acac)]

<<Manufacture of Light-Emitting Element 4>>

First, indium tin oxide containing silicon oxide (ITSO) was deposited over a glass substrate 3000 by a sputtering method, so that a first electrode 3001 which functions as an anode was formed. The thickness was 110 nm and the electrode area was 2 mm×2 mm.

Then, as pretreatment for forming Light-emitting Element 4 over the substrate 3000, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 3000 was cooled down for about 30 minutes.

Next, the substrate 3000 was fixed to a holder provided in the vacuum evaporation apparatus so that a surface of the substrate 3000 over which the first electrode 3001 was formed faced downward. In this example, a case is described in which the following layers are sequentially formed by a vacuum evaporation method: a first hole-injection layer 3011a, a first hole-transport layer 3012a, a first light-emitting layer 3013a, a first electron-transport layer 3014a, and a first electron-injection layer 3015a which are included in a first EL layer 3002a; a first charge-generation layer; a second hole-injection layer 3011b, a second hole-transport layer 3012b, a second light-emitting layer 3013b, a second electron-transport layer 3014b, and a second electron-injection layer 3015b which are included in a second EL layer 3002b; a second charge-generation layer; and a third hole-injection layer 3011c, a third hole-transport layer 3012c, a third light-emitting layer 3013c, a third electron-transport layer 3014c, and a third electron-injection layer 3015c which are included in a third EL layer 3002c.

After reducing the pressure of the vacuum evaporation apparatus to $10^{-4}$ Pa, 1,3,5-tri(dibenzothiophen-4-yl)benzene (abbreviation: DBT3P-II) and molybdenum(VI) oxide were co-evaporated with a mass ratio of DBT3P-II (abbreviation) to molybdenum oxide being 1:0.5, whereby the first hole-injection layer 3011a was formed over the first electrode 3001. The thickness of the first hole-injection layer 3011a was 26.6 nm. Note that the co-evaporation is an evaporation method in which some different substances are evaporated from some different evaporation sources at the same time.

Then, 4-phenyl-4'-(9-phenylfluoren-9-yl)triphenylamine (abbreviation: BPAFLP) was evaporated to a thickness of 20 nm, so that the first hole-transport layer 3012a was faulted.

Next, the first light-emitting layer 3013a was formed over the first hole-transport layer 3012a. Co-evaporated were 2-[3'-(dibenzothiophen-4-yl)biphenyl-3-yl]dibenzo[f,h]quinoxaline (abbreviation: 2mDBTBPDBq-II), 4,4'-di(1-naphthyl)-4''-(9-phenyl-9H-carbazol-3-yl)triphenylamine (abbreviation: PCBNBB), and bis(2,3,5-triphenylpyrazinato)(dipivaloylmethanato)iridium(III) (abbreviation: [Ir(tppr)₂(dpm)]) with a mass ratio of 2mDBTBPDBq-II (abbreviation) to PCBNBB (abbreviation) and [Ir(tppr)₂(dpm)] (abbreviation) being 0.8:0.2:0.06, whereby the first light-emitting layer 3013a was formed. The thickness of the first light-emitting layer 3013a was 40 nm.

Then, 2mDBTPDBq-II (abbreviation) was evaporated to a thickness of 5 nm over the first light-emitting layer 3013a and bathophenanthroline (abbreviation: Bphen) was evaporated to a thickness of 10 nm, so that the first electron-transport layer 3014a was formed. Furthermore, lithium oxide (Li₂O) was evaporated to a thickness of 0.1 nm over the first electron-transport layer 3014a, whereby the first electron-injection layer 3015a was formed.

Then, copper phthalocyanine (abbreviation: CuPc) was evaporated to a thickness of 2 nm over the first electron-injection layer 3015a, whereby the first charge-generation layer 3016a was formed.

After that, over the first charge-generation layer 3016a, DBT3P-II (abbreviation) and molybdenum oxide(IV) were co-evaporated with a mass ratio of DBT3P-II (abbreviation) to molybdenum oxide being 0.5:0.5, so that the second hole-injection layer 3011b was formed. The thickness of the second hole-injection layer 3011b was 3.3 nm.

Then, 9-[4-(9-phenylcarbazol-3-yl)]phenyl-10-phenylanthracene (abbreviation: PCzPA) was evaporated to a thickness of 10 nm, whereby the second hole-transport layer 3012b was formed.

Next, the second light-emitting layer 3013b was formed over the second hole-transport layer 3012b. CzPA (abbreviation) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) were co-evaporated with a mass ratio of CzPA (abbreviation) to 1,6mMemFLPAPrn (abbreviation) being 1:0.05, whereby the second light-emitting layer 3013b was formed. The thickness of the second light-emitting layer 3013b was 30 nm.

After that, over the second light-emitting layer 3013b, CzPA (abbreviation) was evaporated to a thickness of 5 nm and then Bphen (abbreviation) was evaporated to a thickness of 10 nm, so that the second electron-transport layer 3014b was formed. Furthermore, lithium oxide (Li₂O) was evaporated to a thickness of 0.1 nm over the second electron-transport layer 3014b, whereby the second electron-injection layer 3015b was formed.

Then, copper phthalocyanine (abbreviation: CuPc) was evaporated to a thickness of 2 nm over the second electron-injection layer 3015b, whereby the second charge-generation layer 3016b was formed.

After that, over the second charge-generation layer 3016b, DBT3P-II (abbreviation) and molybdenum oxide(IV) were co-evaporated with a mass ratio of DBT3P-II (abbreviation)

to molybdenum oxide being 1:0.5, so that the third hole-injection layer 3011c was formed. The thickness of the third hole-injection layer 3011c was 50 nm.

Then, BPAFLP (abbreviation) was evaporated to a thickness of 20 nm, so that the third hole-transport layer 3012c was formed.

Next, the third light-emitting layer 3013c was formed over the third hole-transport layer 3012c. The third light-emitting layer 3013c was formed in the following manner: 2mDBTB-PDBq-II (abbreviation), PCBNBB (abbreviation), and (acetylacetonato)bis(6-tert-butyl-4-phenylpyrimidinato)iridium(III) (abbreviation: [Ir(tBuppm)$_2$(acac)]) were co-evaporated to a thickness of 30 nm with a mass ratio of 2mDBTBPDBq-II (abbreviation) to PCBNBB (abbreviation) and [Ir(tBuppm)$_2$(acac)] being 0.8:0.2:0.06, and then 2mDBTBPDBq-II (abbreviation), PCBNBB (abbreviation), and [Ir(dppm)$_2$(acac)] (abbreviation) were co-evaporated to a thickness of 10 nm with a mass ratio of 2mDBTBPDBq-II (abbreviation) to PCBNBB (abbreviation) and [Ir(dppm)$_2$(acac)] being 0.8:0.2:0.06.

Then, 2mDBTPDBq-II (abbreviation) was evaporated to a thickness of 15 nm over the third light-emitting layer 3013c and Bphen (abbreviation) was evaporated to a thickness of 15 nm, so that the third electron-transport layer 3014c was formed. Furthermore, lithium fluoride (LiF) was evaporated to a thickness of 1 nm over the third electron-transport layer 3014c, whereby the third electron-injection layer 3015c was formed.

Finally, aluminum was evaporated to a thickness of 200 nm over the third electron-injection layer 3015c to form the second electrode 3003 serving a cathode; thus, Light-emitting Element 4 was obtained. Note that in all the above evaporation steps, evaporation was performed by a resistance-heating method.

An element structure of Light-emitting Element 4 obtained as described above is shown in Table 7.

TABLE 7

| | First Electrode | First Hole-injection Layer | First Hole-transport Layer | First Light-emitting Layer | First Electron-transport Layer | First Electron-injection Layer | First Charge generation layer |
|---|---|---|---|---|---|---|---|
| Light-emitting Element 4 | ITSO (110 nm) | DBT3P-II: MoOx (1:0.5 26.6 nm) | BPAFLP (20 nm) | 2mDBTBPDBq-II: PCBNBB: [Ir(tppr)$_2$(dpm)] (0.8:0.2:0.06 40 nm) | 2mDBTPDBq-II (5 nm)    Bphen (10 nm) | Li$_2$O (0.1 nm) | CuPc (2 nm) |

| | First Electrode | Second Hole-injection layer | Second Hole-Transport Layer | Second Light-emitting Layer | Second Electron-transport Layer | Second Electron-injection Layer | Second Charge-generation Layer |
|---|---|---|---|---|---|---|---|
| Light-emitting Element 4 | ITSO (110 nm) | DBT3P-II: MoOx (0.5:0.5 3.3 nm) | PCzPA (10 nm) | CzPA: 1,6mMemFLPAPrn (1:0.05 30 nm) | CzPA (5 nm)    Bphen (10 nm) | Li$_2$O (0.1 nm) | CuPc (2 nm) |

| | First Electrode | Third Hole-injection Layer | Third Hole-transport Layer | Third Light-emitting Layer | Third Electron-transport Layer | Third Electron-injection Layer | Second Electrode |
|---|---|---|---|---|---|---|---|
| Light-emitting Element 4 | ITSO (110 nm) | DBT3P-II: MoOx (1:0.5 50 nm) | BPAFLP (20 nm) | * | 2mDBTPDBq-II (15 nm)    Bphen (15 nm) | LiF (1 nm) | Al (200 nm) |

*2mDBTBPDBq-II:PCBNBB:[Ir(tBuppm)$_2$(acac)] (0.8:0.2:0.06 30 nm)\2mDBTBPDBq-II:PCBNBB:[Ir(dppm)$_2$(acac)] (0.8:0.2:0.06 10 nm)

Further, the manufactured Light-emitting Element 4 was sealed in a glove box containing a nitrogen atmosphere so as not to be exposed to the air (specifically, a sealant was applied onto an outer edge of the element and heat treatment was performed at 80° C. for 1 hour at the time of sealing).

<<Operation Characteristics of Light-Emitting Element 4>>

Operation characteristics of the manufactured Light-emitting Element 4 were measured. Note that the measurement was carried out at room temperature (under an atmosphere in which the temperature was kept at 25° C.).

Figure 24:
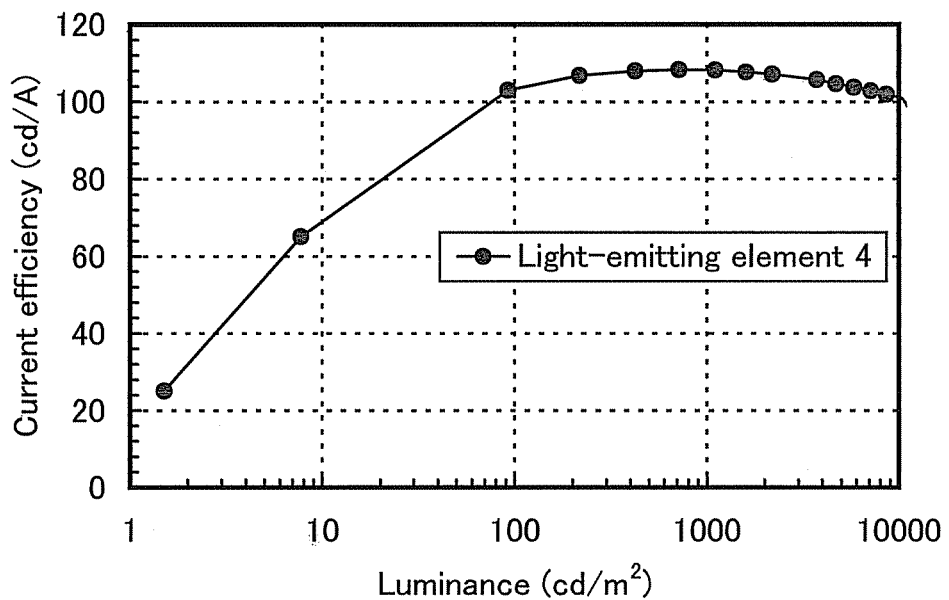
FIG. 24 shows luminance vs. current efficiency characteristics of Light-emitting Element 4.
Figure 25:
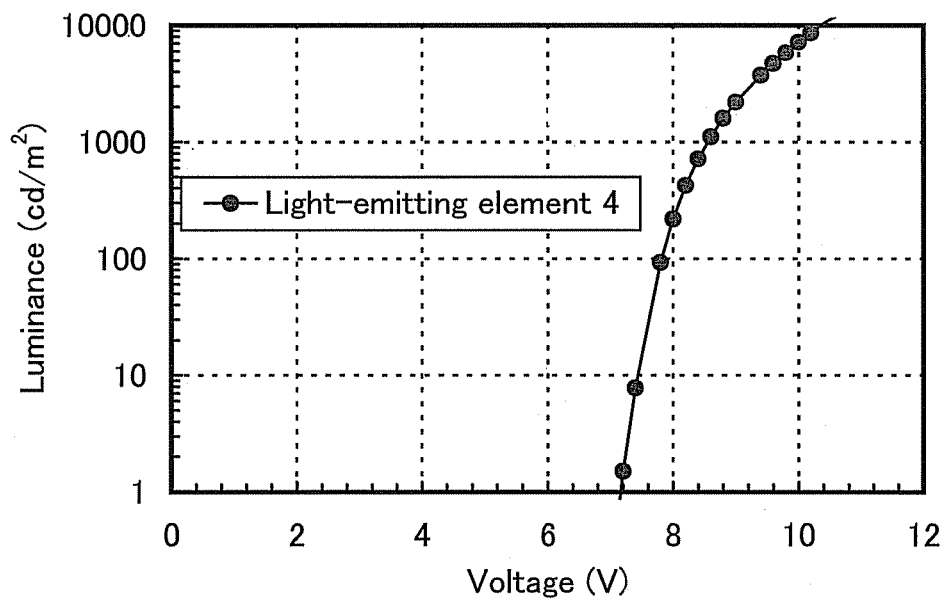
FIG. 25 shows voltage vs. luminance characteristics of Light-emitting Element 4.

FIG. 24 shows luminance vs. current efficiency characteristics of Light-emitting Element 4. In FIG. 24, the vertical axis represents current efficiency (cd/A) and the horizontal axis represents luminance (cd/m$^2$). FIG. 25 shows voltage vs. luminance characteristics of Light-emitting Element 4. In FIG. 25, the vertical axis represents luminance (cd/m$^2$) and the horizontal axis represents voltage (V). Table 8 below shows initial values of main characteristics of Light-emitting Element 4 at a luminance of about 1000 cd/m$^2$.

TABLE 8

|  | Voltage (V) | Current (mA) | Current Density (mA/cm$^2$) | Chromaticity (x, y) | Luminance (cd/m$^2$) | Power Efficiency (lm/W) | External Quantum Efficiency (%) |
|---|---|---|---|---|---|---|---|
| Light-emitting Element 4 | 8.4 | 0.031 | 0.77 | (0.44, 0.42) | 790 | 38 | 50 |

From the above results, Light-emitting Element 4 manufactured in this example has high external quantum efficiency, which means its high emission efficiency. Moreover, the chromaticity (x,y) shows that Light-emitting Element 4 emits yellow white light (incandescent color) having a color temperature of around 3000 K.

Figure 26:
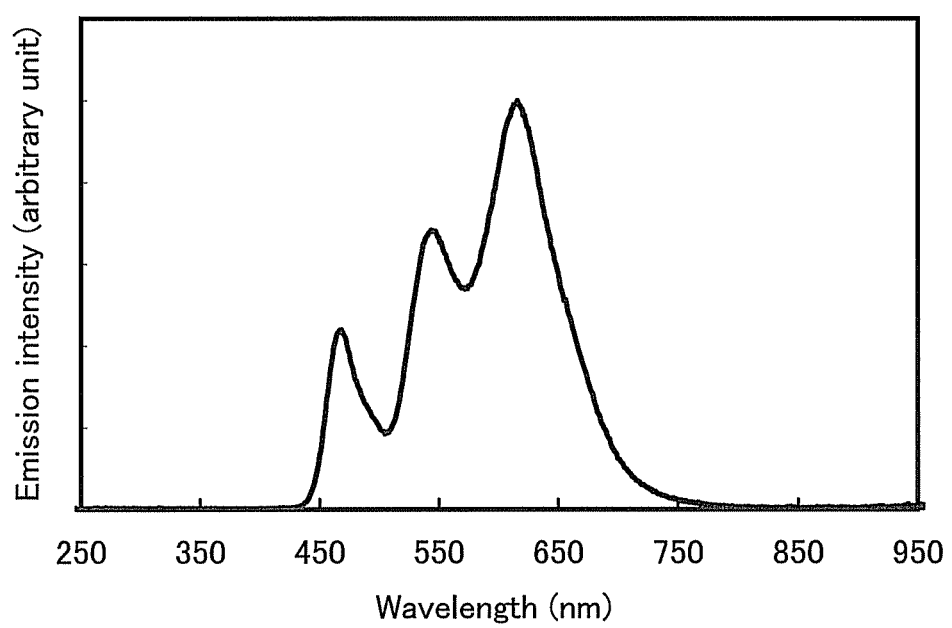
FIG. 26 shows an emission spectrum of Light-emitting Element 4.

FIG. 26 shows an emission spectrum when a current at a current density of 25 mA/cm$^2$ was supplied to Light-emitting Element 4. As shown in FIG. 26, the emission spectrum of Light-emitting Element 4 has peaks at 470 nm, 549 μm, and 618 nm and it is indicated that the emission spectrum is derived from emission of the phosphorescent organometallic iridium complexes which are contained in the light-emitting layers. Note that a general color rendering index (Ra) which is calculated from this spectrum is 90, which means an extremely high color rendering property.

Figure 27:
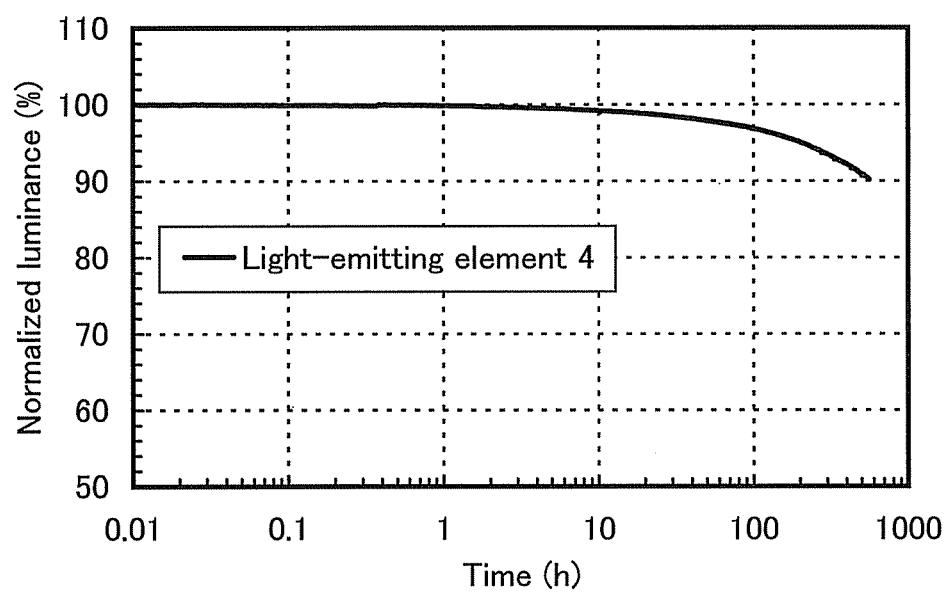
FIG. 27 shows reliability of Light-emitting Element 4.

FIG. 27 shows results obtained by reliability testing of Light-emitting Element 4. In FIG. 27, the vertical axis represents normalized luminance (%) with an initial luminance of 100% and the horizontal axis represents driving time (h) of the element. Note that in the reliability test, Light-emitting Element 4 was driven under the conditions where the initial luminance was set to 5000 cd/m$^2$ and the current density was constant. Light-emitting Element 4 kept about 96% of the initial luminance after 120 hours elapsed.

The results showed high reliability of Light-emitting Element 4. In addition, it was confirmed that with the use of the phosphorescent organometallic iridium complex of one embodiment of the present invention, a light-emitting element with long lifetime can be obtained.

Reference Example

A synthesis method of the phosphorescent organometallic iridium complex which was used in this example will be described below.

Synthesis Example 1

In Synthesis Example 1, a synthesis example of an organometallic complex (acetylacetonato)bis(4,6-diphenylpyrimidinato)iridium(II) (abbreviation: [Ir(dppm)$_2$(acac)]), which is one embodiment of the present invention represented by Structural Formula (100) in Embodiment 1, is specifically described. A structure of [Ir(dppm)$_2$(acac)] is shown below.

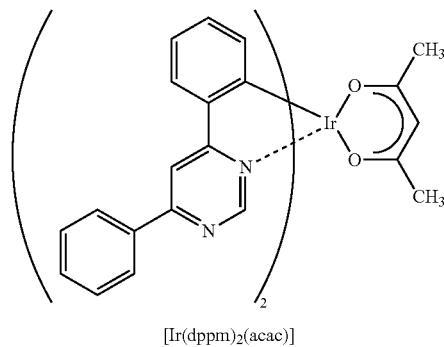

[Ir(dppm)$_2$(acac)]

Step 1: Synthesis of 4,6-Diphenylpyrimidine (abbreviation: Hdppm)

First, 5.02 g of 4,6-dichloropyrimidine, 8.29 g of phenylboronic acid, 7.19 g of sodium carbonate, 0.29 g of bis(triphenylphosphine)palladium(II) dichloride (abbreviation: Pd(PPh$_3$)$_2$Cl$_2$), 20 mL of water, and 20 mL of acetonitrile were put into a recovery flask equipped with a reflux pipe, and the air in the flask was replaced with argon. This reaction container was heated by irradiation with microwaves (2.45 GHz, 100 W) for 60 minutes. Here, there were further put 2.08 g of phenylboronic acid, 1.79 g of sodium carbonate, 0.070 g of Pd(PPh$_3$)$_2$Cl$_2$, 5 mL of water, and 5 mL of acetonitrile into the flask, and the mixture was heated again by irradiation with microwaves (2.45 GHz, 100 W) for 60 minutes. After that, water was added to this solution and an organic layer was extracted with dichloromethane. The obtained solution of the extract was washed with water and dried with magnesium sulfate. The solution after drying was filtered. The solvent of this solution was distilled off, and then the obtained residue was purified by silica gel column chromatography using dichloromethane as a developing solvent, so that a pyrimidine derivative Hdppm (yellow white powder, 38% in yield) was obtained. Note that for the irradiation with microwaves, a microwave synthesis system (Discover, manufactured by CEM Corporation) was used. A synthesis scheme (a-1) of Step 1 is shown below.

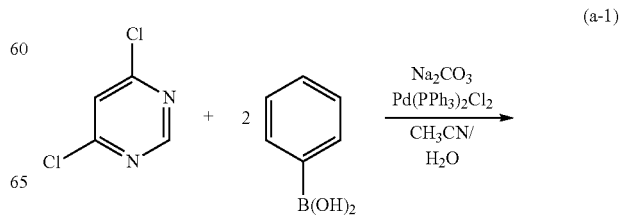

(a-1)

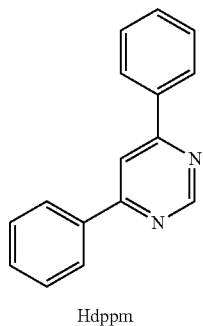

Hdppm

Step 2: Synthesis of Di-µ-chloro-bis[bis(4,6-diphenylpyrimidinato)iridium(III)] (abbreviation: [Ir(dppm)₂Cl]₂)

Next, 15 mL of 2-ethoxyethanol, 5 mL of water, 1.10 g of Hdppm obtained in Step 1, and 0.69 g of iridium chloride hydrate (IrCl₃·H₂O) were put into a recovery flask equipped with a reflux pipe, and the air in the recovery flask was replaced with argon. After that, irradiation with microwaves (2.45 GHz, 100 W) was performed for 1 hour to cause a reaction. The solvent was distilled off, and then the obtained residue was filtered and washed with ethanol to give a dinuclear complex [Ir(dppm)₂Cl]₂ (reddish brown powder, 88% in yield). A synthesis scheme (a-2) of Step 2 is shown below.

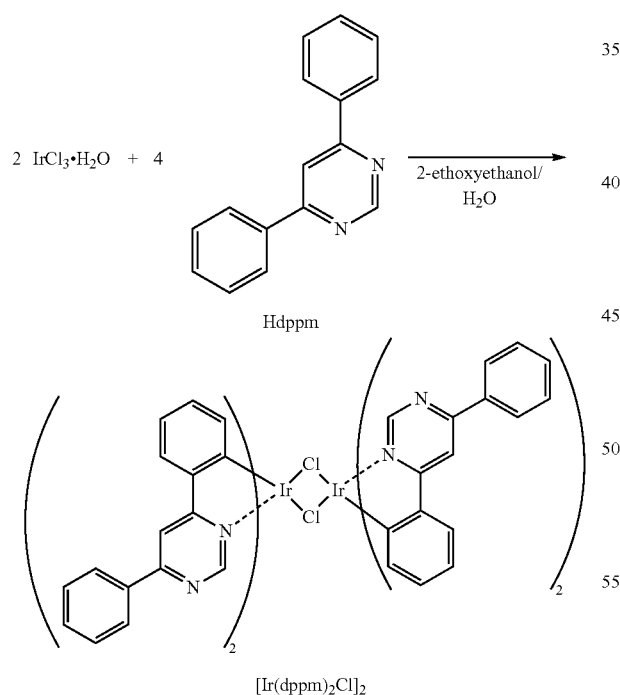

[Ir(dppm)₂Cl]₂

Step 3: Synthesis of (Acetylacetonato)bis(4,6-diphenylpyrimidinato)iridium(III) (abbreviation: [Ir(dppm)₂(acac)])

Furthermore, 40 mL of 2-ethoxyethanol, 1.44 g of [Ir(dppm)₂Cl]₂ obtained in Step 2, 0.30 g of acetylacetone, and 1.07 g of sodium carbonate were put into a recovery flask equipped with a reflux pipe, and the air in the recovery flask was replaced with argon. After that, irradiation with microwaves (2.45 GHz, 100 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. The solution after drying was filtered. The solvent of this solution was distilled off, and then the obtained residue was purified by silica gel column chromatography using dichloromethane and ethyl acetate as a developing solvent in a volume ratio of 50:1. After that, recrystallization was carried out with a mixed solvent of dichloromethane and hexane, so that the objective orange powder (65% in yield) was obtained. A synthesis scheme (a-3) of Step 3 is shown below.

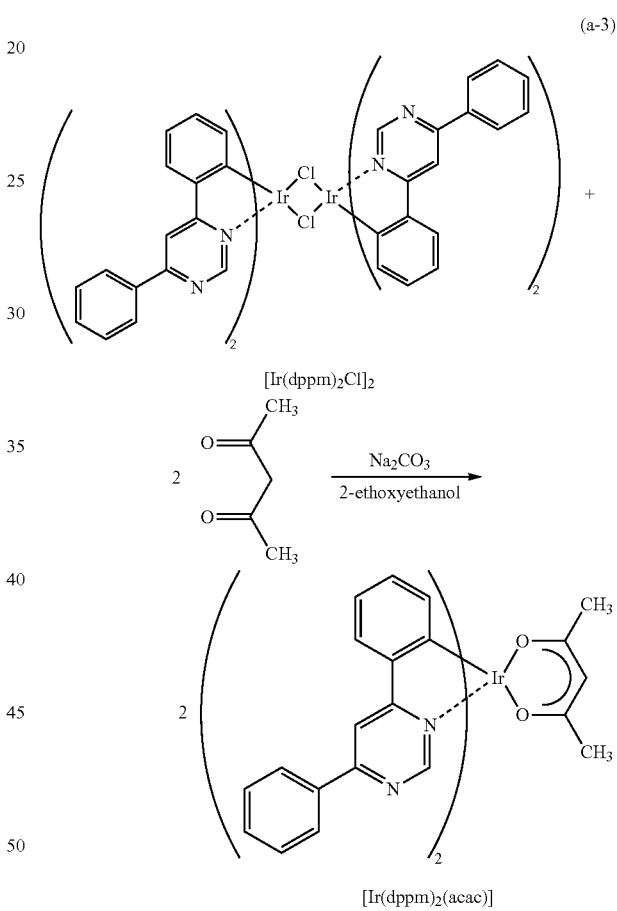

[Ir(dppm)₂(acac)]

Figure 12:
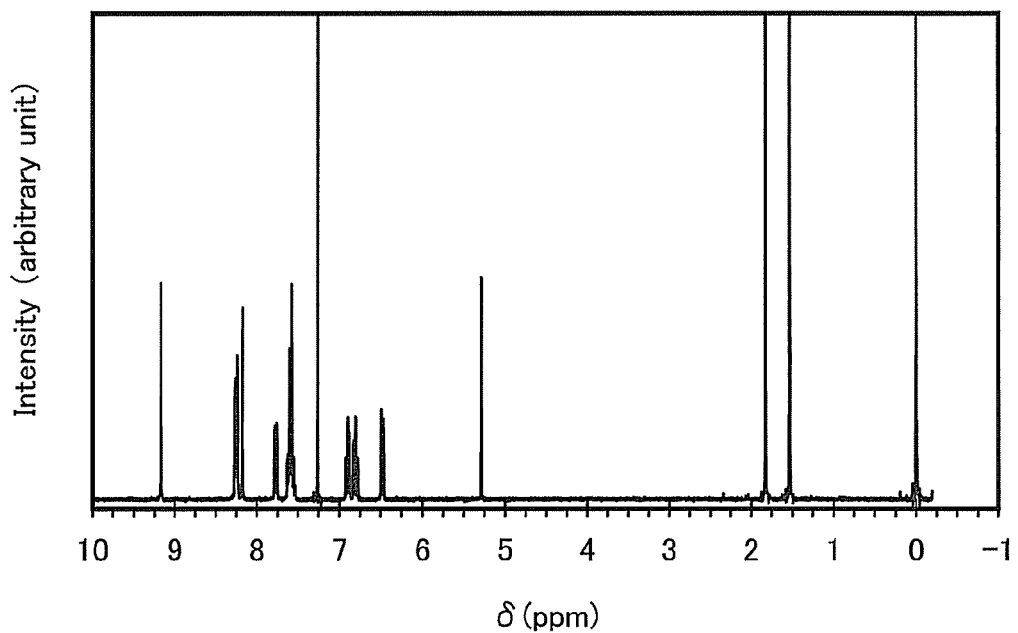
FIG. 12 shows a $^1$H NMR chart of a phosphorescent organometallic iridium complex represented by Structural Formula (100)

An analysis result by nuclear magnetic resonance spectrometry (¹H NMR) of the orange powder obtained in Step 3 is described below. FIG. 12 shows the ¹H NMR chart. These results revealed that the phosphorescent organometallic iridium complex represented by Structural Formula (100), i.e., [Ir(dppm)₂(acac)], was obtained in Synthesis Example 1.

$^1$H NMR. δ (CDCl₃): 1.83 (s, 6H), 5.29 (s, 1H), 6.48 (d, 2H), 6.80 (t, 2H), 6.90 (t, 2H), 7.55-7.63 (m, 6H), 7.77 (d, 2H), 8.17 (s, 2H), 8.24 (d, 4H), 9.17 (s, 2H).

Synthesis Example 2

In Synthesis Example 2, a synthesis example of (acetylacetonato)bis(6-methyl-4-phenylpyrimidinato)iridium(III)

(abbreviation: [Ir(mppm)₂(acac)]), which is the phosphorescent organometallic iridium complex represented by Structural Formula (101) in Embodiment 1, is specifically described. A structure of [Ir(mppm)₂(acac)] is shown below.

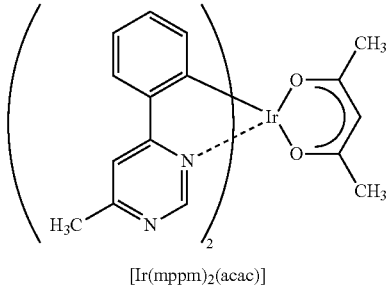

[Ir(mppm)₂(acac)]

Step 1: Synthesis of 4-Methyl-6-phenylpyrimidine (abbreviation: Hmppm)

First, 4.90 g of 4-chloro-6-methylpyrimidine, 4.80 g of phenylboronic acid, 4.03 g of sodium carbonate, 0.16 g of bis(triphenylphosphine)palladium(II)dichloride (abbreviation: Pd(PPh₃)₂Cl₂), 20 mL of water, and 10 mL of acetonitrile were put into a recovery flask equipped with a reflux pipe, and the air in the flask was replaced with argon. This reaction container was heated by irradiation with microwaves (2.45 GHz, 100 W) for 60 minutes. Here, there were further put 2.28 g of phenylboronic acid, 2.02 g of sodium carbonate, 0.082 g of Pd(PPh₃)₂Cl₂, 5 mL of water, and 10 mL of acetonitrile into the flask, and the mixture was heated again by irradiation with microwaves (2.45 GHz, 100 W) for 60 minutes. After that, water was added to this solution and extraction with dichloromethane was carried out. The obtained solution of the extract was washed with a saturated sodium carbonate aqueous solution, water, and saturated saline in this order and dried with magnesium sulfate. The solution after drying was filtered. The solvent of this solution was distilled off, and then the obtained residue was purified by silica gel column chromatography using dichloromethane and ethyl acetate as a developing solvent in a volume ratio of 9:1, so that an objective pyrimidine derivative Hmppm (orange oily substance, 46% in yield) was obtained. Note that for the irradiation with microwaves, a microwave synthesis system (Discover, manufactured by CEM Corporation) was used. A synthesis scheme (b-1) of Step 1 is shown below.

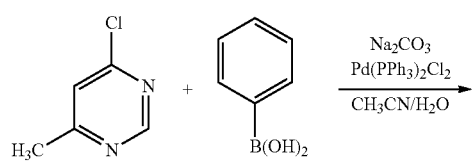

(b-1)

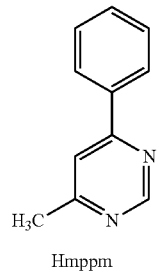

Hmppm

Step 2: Synthesis of Di-μ-chloro-bis[bis(6-methyl-4-phenylpyrimidinato)iridium(III)] (abbreviation: [Ir(mppm)₂Cl]₂)

Next, 15 mL of 2-ethoxyethanol, 5 mL of water, 1.51 g of Hmppm obtained in Step 1, and 1.26 g of iridium chloride hydrate (IrCl₃.H₂O) were put into a recovery flask equipped with a reflux pipe, and the air in the recovery flask was replaced with argon. After that, irradiation with microwaves (2.45 GHz, 100 W) was performed for 1 hour to cause a reaction. After the solvent was distilled off, and the obtained residue was washed with ethanol and filtered to give a dinuclear complex [Ir(mppm)₂Cl]₂ was obtained (dark green powder, 77% in yield). A synthesis scheme (b-2) of Step 2 is shown below.

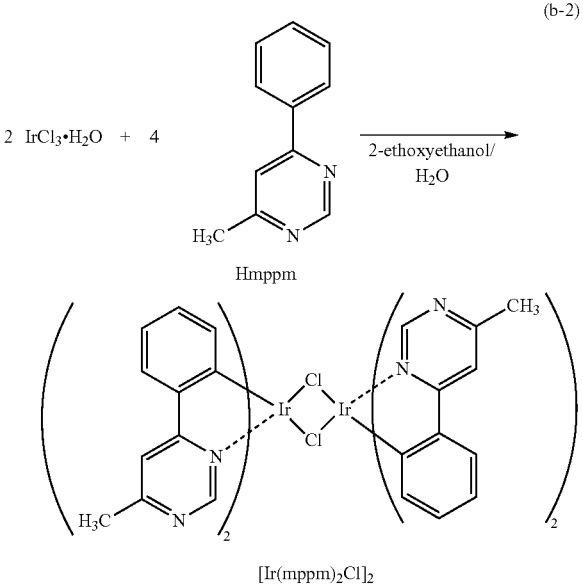

(b-2)

[Ir(mppm)₂Cl]₂

Step 3: Synthesis of (Acetylacetonato)bis(6-methyl-4-phenylpyrimidinato)iridium(III) (abbreviation: [Ir(mppm)₂(acac)])

Furthermore, 40 mL of 2-ethoxyethanol, 1.84 g of the dinuclear complex [Ir(mppm)₂Cl]₂ obtained in Step 2, 0.48 g of acetylacetone, and 1.73 g of sodium carbonate were put into a recovery flask equipped with a reflux pipe, and the air in the recovery flask was replaced with argon. After that, irradiation with microwaves (2.45 GHz, 100 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. The solution after drying was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane to give a yellow powder that was the object of the synthesis (44% in yield). A synthesis scheme (b-3) of Step 3 is shown below.

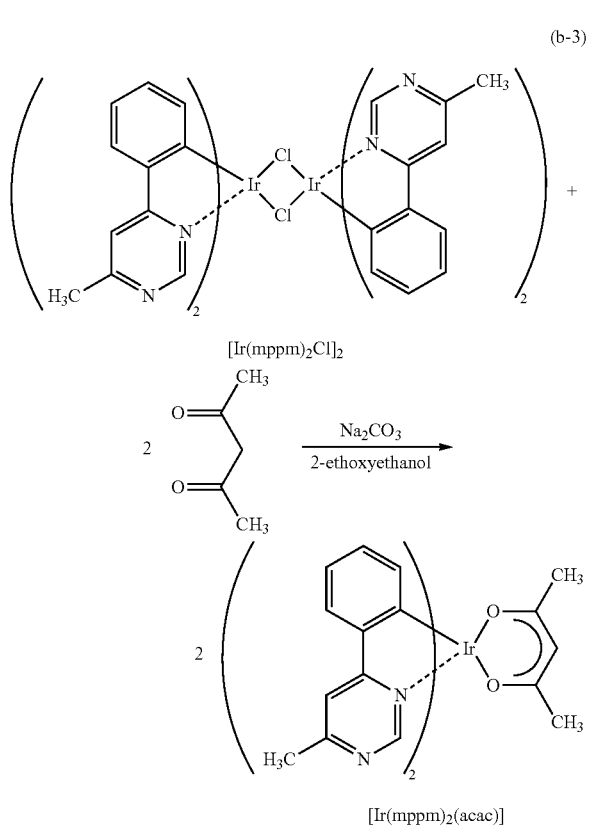

(b-3)

Figure 13:
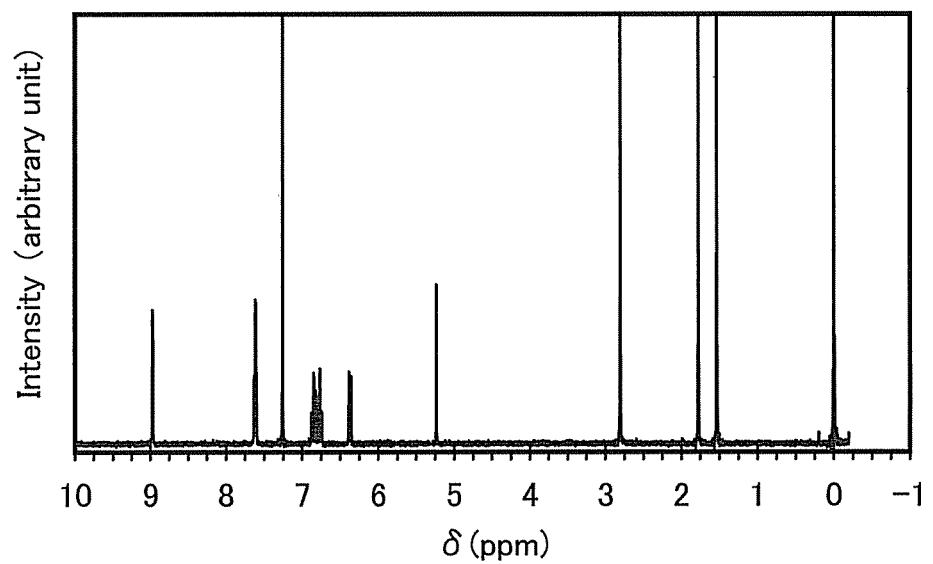
FIG. 13 shows a $^1$H NMR chart of a phosphorescent organometallic iridium complex represented by Structural Formula (101)

An analysis result by nuclear magnetic resonance spectrometry ($^1$H NMR) of the yellow powder obtained in Step 3 is described below. FIG. 13 shows the $^1$H NMR chart. These results revealed that the phosphorescent organometallic iridium complex represented by Structural Formula (101), i.e., [Ir(mppm)$_2$(acac)], was obtained in Synthesis Example 2.

$^1$H NMR. δ (CDCl$_3$): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

Synthesis Example 3

In Synthesis Example 3, a synthesis example of tris(4,6-diphenylpyrimidinato)iridium(III) (abbreviation: [Ir(dppm)$_3$]), which is the phosphorescent organometallic iridium complex represented by Structural Formula (102) in Embodiment 1, is specifically described. A structure of [Ir(dppm)$_3$] is shown below.

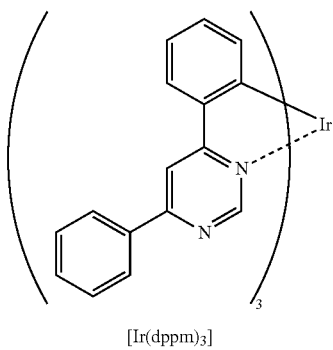

[Ir(dppm)$_3$]

Into a reaction container provided with a three-way cock were put 1.17 g of the ligand Hdppm obtained in Step 1 in Synthesis Example 1 and 0.49 g of tris(acetylacetonato)iridium(III), and the air in the reaction container was replaced with argon. After that, the mixture was heated at 250° C. for 45.5 hours to be reacted. The reactant was dissolved in dichloromethane, and this solution was filtered. The solvent of the obtained filtrate was distilled off and purification was conducted by silica gel column chromatography. As developing solvents, first, dichloromethane was used, and then ethyl acetate was used. The solvent of the resulting fraction was distilled off, so that a red solid was obtained (41% in yield). The obtained solid was recrystallized with a mixed solvent of dichloromethane and hexane to give red powder that was the objective substance (11% in yield). A synthesis scheme (c-1) of Synthesis Example 3 is shown below.

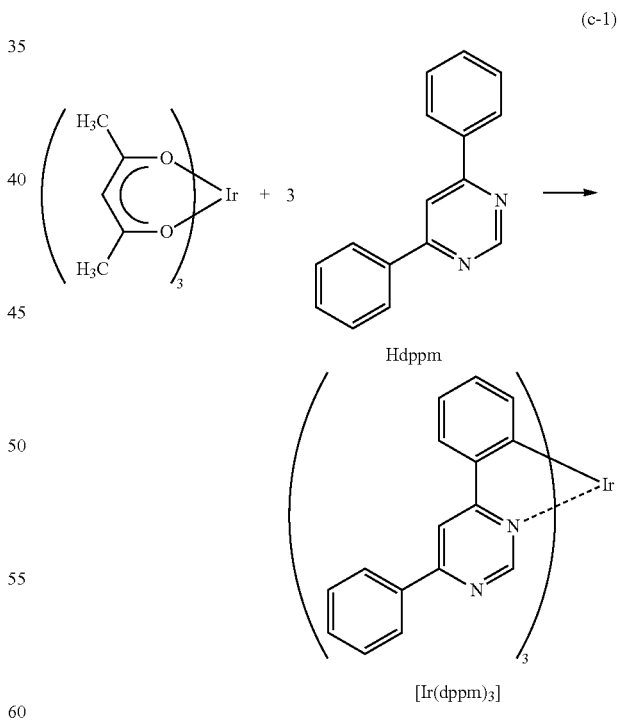

(c-1)

Figure 14:
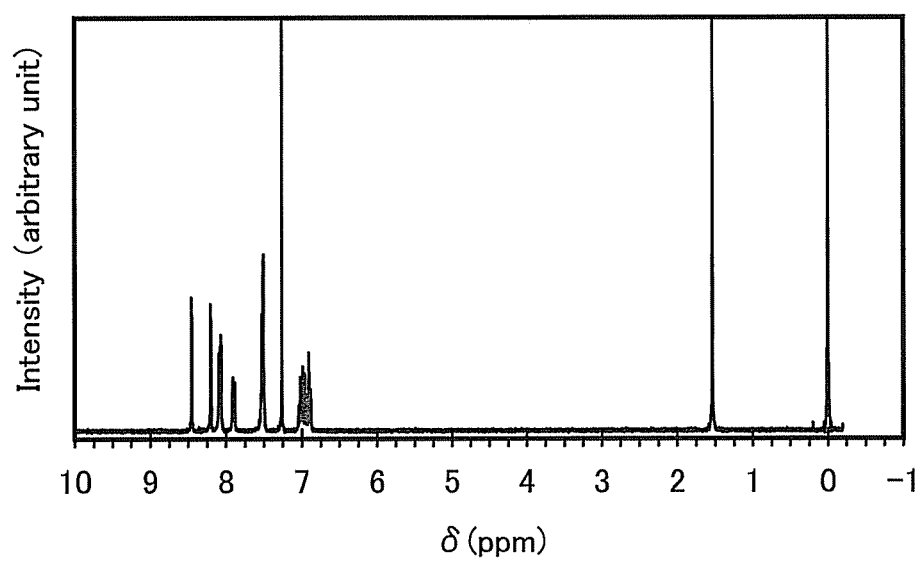
FIG. 14 shows a $^1$H NMR chart of a phosphorescent organometallic iridium complex represented by Structural Formula (102)

An analysis result by nuclear magnetic resonance spectrometry ($^1$H NMR) of the red powder obtained is described below. FIG. 14 shows the $^1$H NMR chart. These results revealed that the phosphorescent organometallic iridium complex represented by Structural Formula (102), i.e., [Ir(dppm)$_3$], was obtained in Synthesis Example 3.

$^1$H NMR. δ (CDCl$_3$): 6.88-7.04 (m, 9H), 7.51-7.54 (m, 9H), 7.90 (d, 3H), 8.07 (d, 3H), 8.09 (d, 3H), 8.21 (s, 3H), 8.46 (s, 3H).

Synthesis Example 4

In Synthesis Example 4, a synthesis method is specifically described of (acetylacetonato)bis(2,4-diphenyl-1,3,5-triazinato)iridium(III) (abbreviation: [Ir(dptzn)$_2$(acac)]) which is the phosphorescent organometallic iridium complex represented by Structural Formula (103) in Embodiment 1. The structure of [Ir(dptzn)$_2$(acac)] (abbreviation) is shown below.

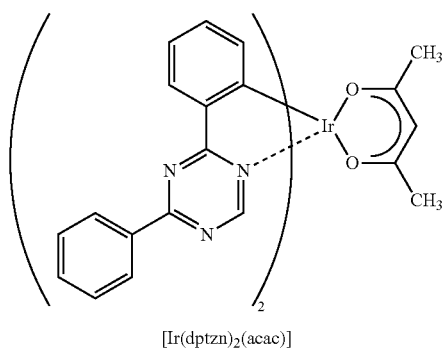

[Ir(dptzn)$_2$(acac)]

Step 1: Synthesis of 2,4-Diphenyl-1,3,5-triazine (Abbreviation: Hdptzn)

First, 9.63 g of benzamidine hydrochloride and 10.19 g of Gold's Reagent (another name: (dimethylaminomethyleneaminomethylene)dimethylammonium chloride, produced by Sigma-Aldrich Inc.) were put in a flask and the air in the flask was replaced with nitrogen. This reaction container was heated at 120° C. for 3 hours to cause a reaction. Water was added to the reacted solution and filtration was performed. The obtained residue was washed with methanol to give an objective triazine derivative Hdptzn (abbreviation) (white powder, 30% in yield). The synthesis scheme of Step 1 is shown by (d-1) below.

(d-1)

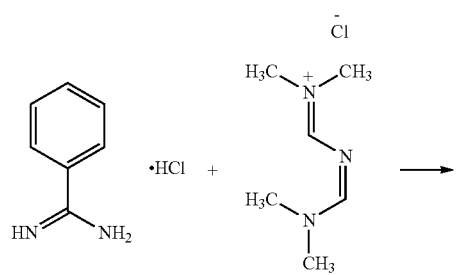

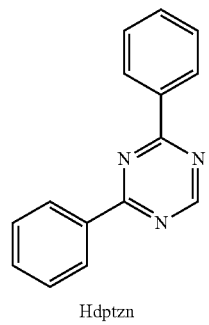

Hdptzn

Step 2: Synthesis of Di-μ-chloro-bis[bis(2,4-diphenyl-1,3,5-triazinato)iridium(III)] (Abbreviation: [Ir(dptzn)$_2$Cl]$_2$)

Next, in a flask equipped with a reflux pipe were put 15 mL of 2-ethoxyethanol, 5 mL of water, 2.51 g of Hdptzn obtained in Step 1 above, and 1.18 g of iridium chloride hydrate (IrCl$_3$.H$_2$O), and the air in the flask was replaced with argon. Then, irradiation with microwaves (2.45 GHz, 100 W) for 30 minutes was performed to cause a reaction. The reacted solution was filtered and the obtained residue was washed with ethanol to give a dinuclear complex [Ir(dptzn)$_2$Cl]$_2$ (abbreviation) (brown powder, 44% in yield). The synthesis scheme of Step 2 is shown by (d-2) below.

(d-2)

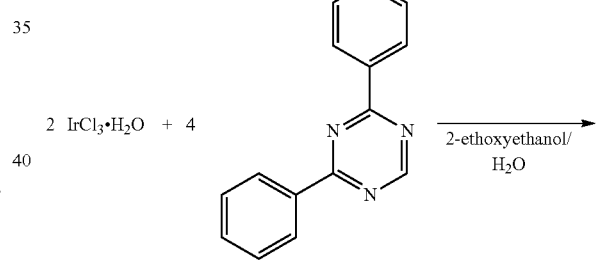

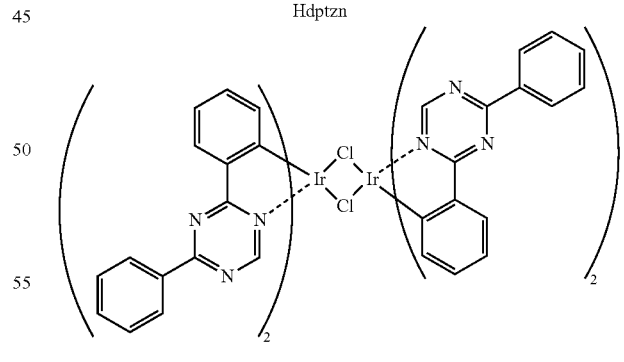

[Ir(dptzn)$_2$Cl]$_2$

Step 3: Synthesis of (Acetylacetonato)bis(2,4-diphenyl-1,3,5-triazinato)iridium(III) (Abbreviation: [Ir(dptzn)$_2$(acac)])

Further, 20 mL of 2-ethoxyethanol, 1.21 g of the dinuclear complex [Ir(dptzn)$_2$Cl]$_2$ (abbreviation) obtained in Step 2 above, 0.27 mL of acetylacetone, and 0.92 g of sodium carbonate were put in a recovery flask equipped with a reflux pipe, and the air in the flask was replaced with argon. Then, irradiation with microwaves (2.45 GHz, 100 W) for 30 minutes was performed to cause a reaction. Dichloromethane was added to the reacted solution and filtration was performed. The solvent of the filtrate was distilled off, and then the obtained residue was purified by flash column chromatography (silica gel) using a mixed solvent of hexane and dichloromethane as a developing solvent in a volume ratio of 1:25, to give the phosphorescent organometallic iridium complex [Ir(dptzn)$_2$(acac)] (abbreviation) as orange powder (10% in yield). The synthesis scheme of Step 3 is shown by (d-3) below.

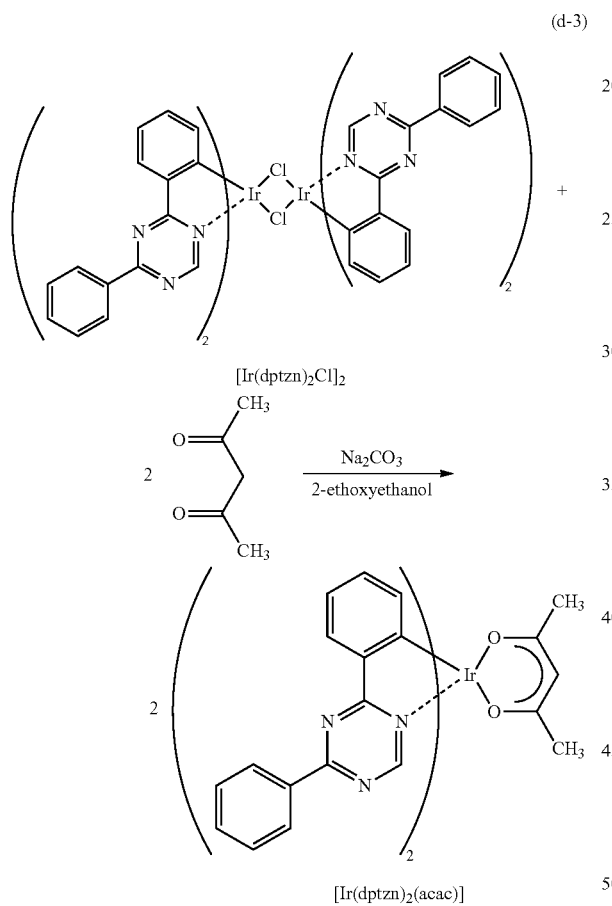

(d-3)

Figure 15:
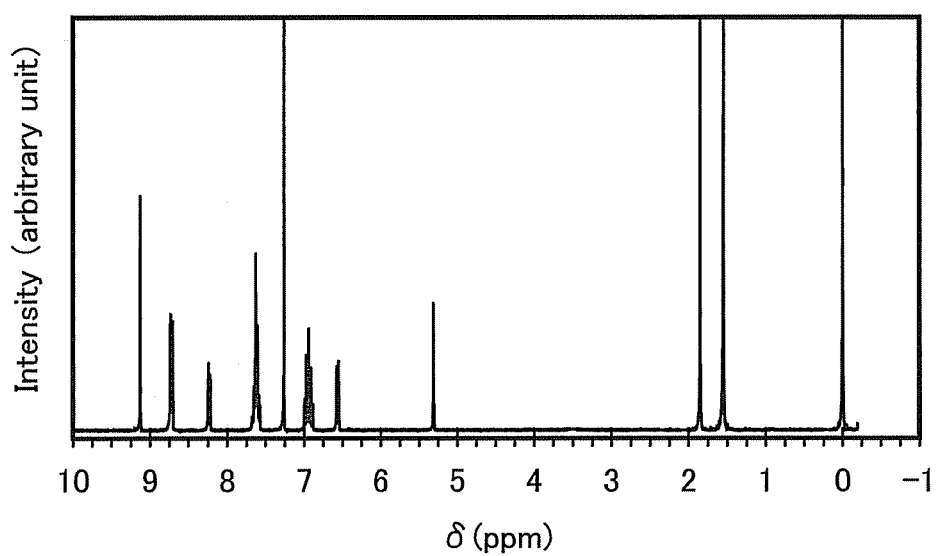
FIG. 15 shows a $^1$H NMR chart of a phosphorescent organometallic iridium complex represented by Structural Formula (103)

An analysis result by nuclear magnetic resonance ($^1$H NMR) spectroscopy of the orange powder obtained in Step 3 above is described below. FIG. 15 shows the $^1$H NMR chart. These results revealed that [Ir(dptzn)$_2$(acac)], which is the phosphorescent organometallic iridium complex represented by Structural Formula (103) above, was obtained in Synthesis Example 4.

$^1$H NMR. δ(CDCl$_3$): 1.85 (s, 6H), 5.31 (s, 1H), 6.56 (dd, 2H), 6.88-6.99 (m, 4H), 7.58-7.68 (m, 6H), 8.23 (dd, 2H), 8.72 (dd, 4H), 9.13 (s, 2H).

Synthesis Example 5

In Synthesis Example 5, a synthesis example of (acetylacetonato)bis(6-tert-butyl-4-phenylpyrimidinato)iridium(III) (abbreviation: [Ir(tBuppm)$_2$(acac)]), which is the phosphorescent organometallic iridium complex represented by Structural Formula (105) in Embodiment 1, is specifically described. A structure of [Ir(tBuppm)$_2$(acac)] (abbreviation) is shown below.

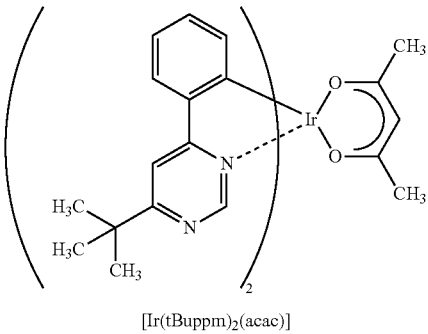

[Ir(tBuppm)$_2$(acac)]

Step 1: Synthesis of 4-tert-butyl-6-phenylpyrimidine (abbreviation: HtBuppm)

First, into a recovery flask equipped with a reflux pipe were put 22.5 g of 4,4-dimethyl-1-phenylpentane-1,3-dione and 50 g of formamide, and the air in the flask was replaced with nitrogen. This reaction container was heated, so that the reacted solution was refluxed for 5 hours. After that, this solution was poured into an aqueous sodium hydroxide solution, and an organic layer was extracted with dichloromethane. The obtained organic layer was washed with water and saturated saline, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, 14% in yield) was obtained. A synthesis scheme (e-1) of Step 1 is shown below.

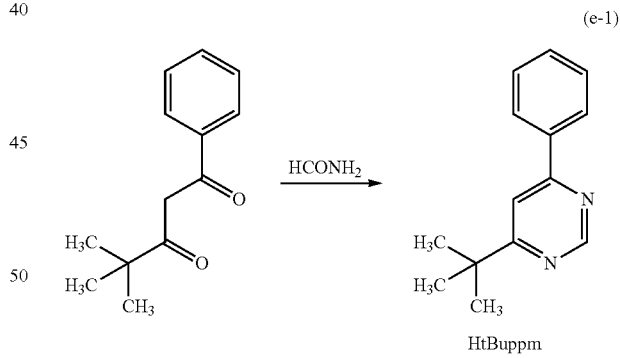

(e-1)

HtBuppm

Step 2: Synthesis of di-μ-chloro-bis[bis(6-tert-butyl-4-phenylpyrimidinato)iridium(III)] (abbreviation: [Ir(tBuppm)$_2$Cl]$_2$)

Next, into a recovery flask equipped with a reflux pipe were put 15 mL of 2-ethoxyethanol, 5 mL of water, 1.49 g of HtBuppm obtained in Step 1, and 1.04 g of iridium chloride hydrate (IrCl$_3$.H$_2$O), and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol to give a dinuclear complex

[Ir(tBuppm)₂Cl]₂ (yellow green powder, 73% in yield). A synthesis scheme (e-2) of Step 2 is shown below.

(e-2)

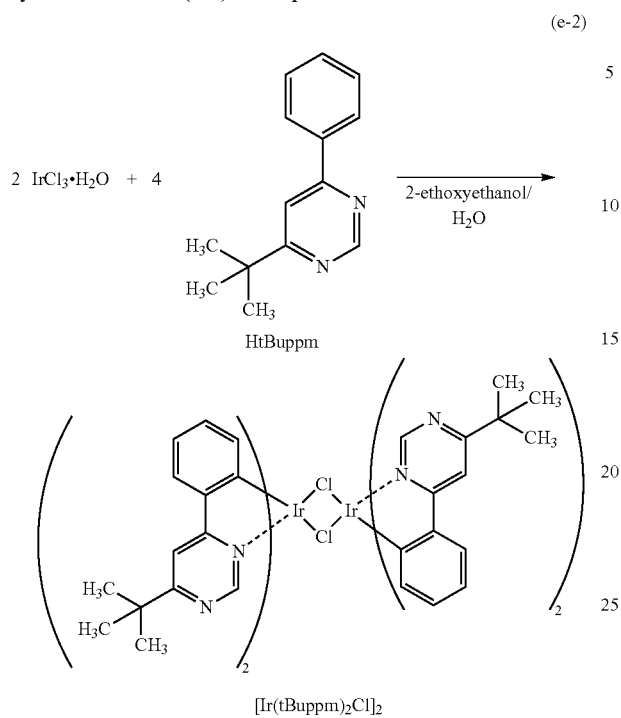

[Ir(tBuppm)₂Cl]₂

Step 3: Synthesis of (acetylacetonato)bis(6-tert-butyl-4-phenylpyrimidinato)iridium(III) (abbreviation: [Ir(tBuppm)₂(acac)])

Further, into a recovery flask equipped with a reflux pipe were put 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate, and the air in the flask was replaced with argon. After that, irradiation with microwaves (2.45 GHz, 100 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 537-02305), alumina, and Celite were stacked in this order. The solvent was distilled off, and the obtained solid was recrystallized with a mixed solvent of dichloromethane and hexane, so that the objective substance was obtained as yellow powder (68% in yield). A synthesis scheme (e-3) of Step 3 is shown below.

(e-3)

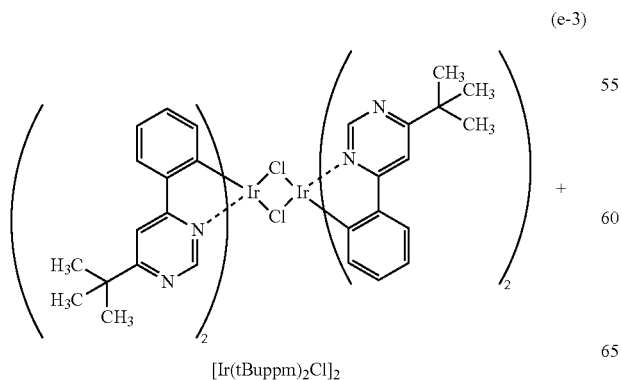

[Ir(tBuppm)₂Cl]₂

-continued

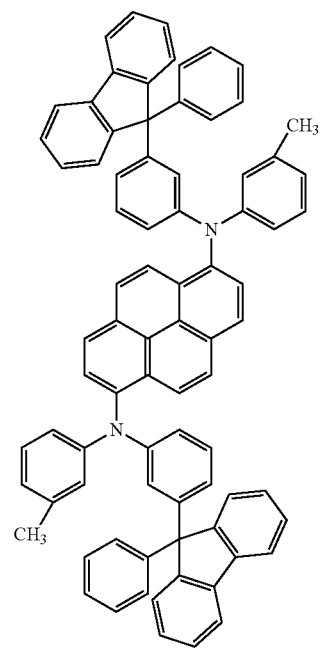

[Ir(tBuppm)₂(acac)]

Figure 28:
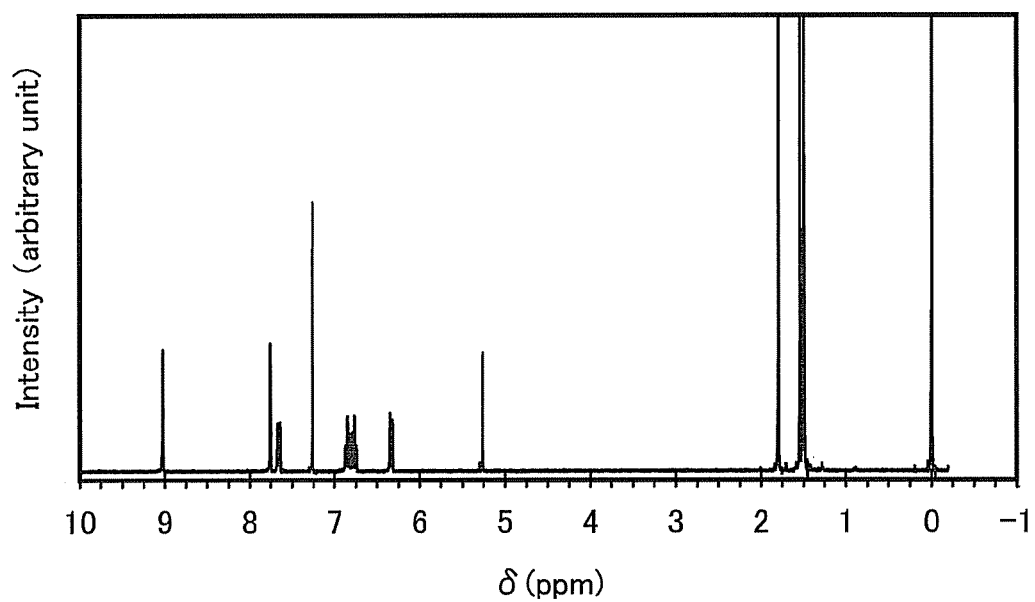
FIG. 28 shows a $^1$H NMR chart of a phosphorescent organometallic iridium complex represented by Structural Formula (105)

An analysis result by nuclear magnetic resonance spectrometry (¹H NMR) of the yellow powder obtained in Step 3 is described below. FIG. 28 shows the ¹H NMR chart. These results revealed that the phosphorescent organometallic iridium complex [Ir(tBuppm)₂(acac)] represented by Structural Formula (105), was obtained in Synthesis Example 5.

¹H NMR. δ (CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

Synthesis Example 6

In Synthesis Example 6, a synthesis example of N,N'-bis(3-methylphenyl)-N,N'-bis[3-(9-phenyl-9H-fluoren-9-yl)phenyl]pyrene-1,6-diamine (abbreviation: 1,6mMemFLPAPrn)] used in Example 4 is specifically described. A structure of 1,6mMemFLPAPrn (abbreviation) is shown below.

1,6mMemFLPAPrn

Step 1: Synthesis of 3-methylphenyl-3-(9-phenyl-9H-fluoren-9-yl)phenylamine (abbreviation: mMemFLPA)

Into a 200-mL three-neck flask were put 3.2 g (8.1 mmol) of 9-(3-bromophenyl)-9-phenylfluorene and 2.3 g (24.1 mmol) of sodium tert-butoxide, and the air in the flask was replaced with nitrogen. To this mixture were added 40.0 mL of toluene, 0.9 mL (8.3 mmol) of m-toluidine, and 0.2 mL of a 10% hexane solution of tri(tert-butyl)phosphine. The temperature of this mixture was set to 60° C., and 44.5 mg (0.1 mmol) of bis(dibenzylideneacetone)palladium(0) was added to the mixture. The temperature of the mixture was raised to 80° C., followed by stirring for 2.0 hours. After the stirring, suction filtration was carried out through Florisil (produced by Wako Pure Chemical Industries, Ltd., Catalog No. 540-00135), Celite (produced by Wako Pure Chemical Industries, Ltd., Catalog No. 531-16855), and alumina to obtain a filtrate. The filtrate was concentrated to give a solid, which was then purified by silica gel column chromatography using hexane and toluene as a developing solvent in a ratio of 1:1, and recrystallization with a mixed solvent of toluene and hexane was performed, so that 2.8 g of a white solid was obtained in 82% yield. A synthesis scheme (f-1) of Step 1 is shown below.

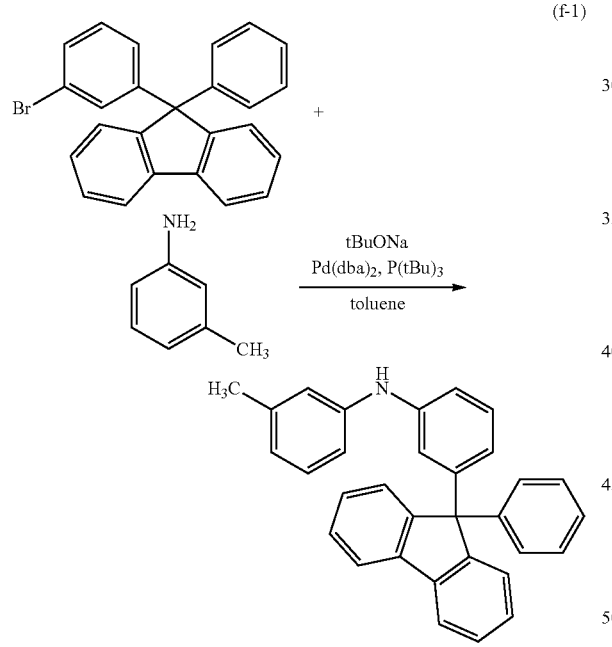

(f-1)

Step 2: Synthesis of N,N'-bis(3-methylphenyl)-N,N'-bis[3-(9-phenyl-9H-fluoren-9-yl)phenyl]pyrene-1,6-diamine (abbreviation: 1,6mMemFLPAPrn)

Into a 100-mL three-neck flask were put 0.6 g (1.7 mmol) of 1,6-dibromopyrene, 1.4 g (3.4 mmol) of 3-methylphenyl-3-(9-phenyl-9H-fluoren-9-yl)phenylamine, and 0.5 g (5.1 mmol) of sodium tert-butoxide, and the air in the flask was replaced with nitrogen. To this mixture were added 21.0 mL of toluene and 0.2 mL of a 10% hexane solution of tri(tert-butyl)phosphine. The temperature of this mixture was set to 60° C., and 34.9 mg (0.1 mmol) of bis(dibenzylideneacetone)palladium(0) was added to the mixture. The temperature of this mixture was raised to 80° C., followed by stirring for 3.0 hours. After the stirring, 400 mL of toluene was added to the mixture, and the mixture was heated. While the mixture was kept hot, it was suction-filtered through Florisil, Celite, and alumina to give a filtrate. The obtained filtrate was concentrated to give a solid, which was then purified by silica gel column chromatography using hexane and toluene as a developing solvent in a ratio of 3:2 to give a yellow solid. The obtained yellow solid was recrystallized with a mixed solvent of toluene and hexane, so that 1.2 g of a yellow solid, which was an objective substance, was obtained in 67% yield.

By a train sublimation method, 1.0 g of the obtained yellow solid was purified. In the purification, the yellow solid was heated at 317° C. under a pressure of 2.2 Pa with a flow rate of an argon gas of 5.0 mL/min. After the purification, 1.0 g of a yellow solid, which was the objective substance, was obtained in 93% yield. A synthesis scheme (f-2) of Step 2 is shown below.

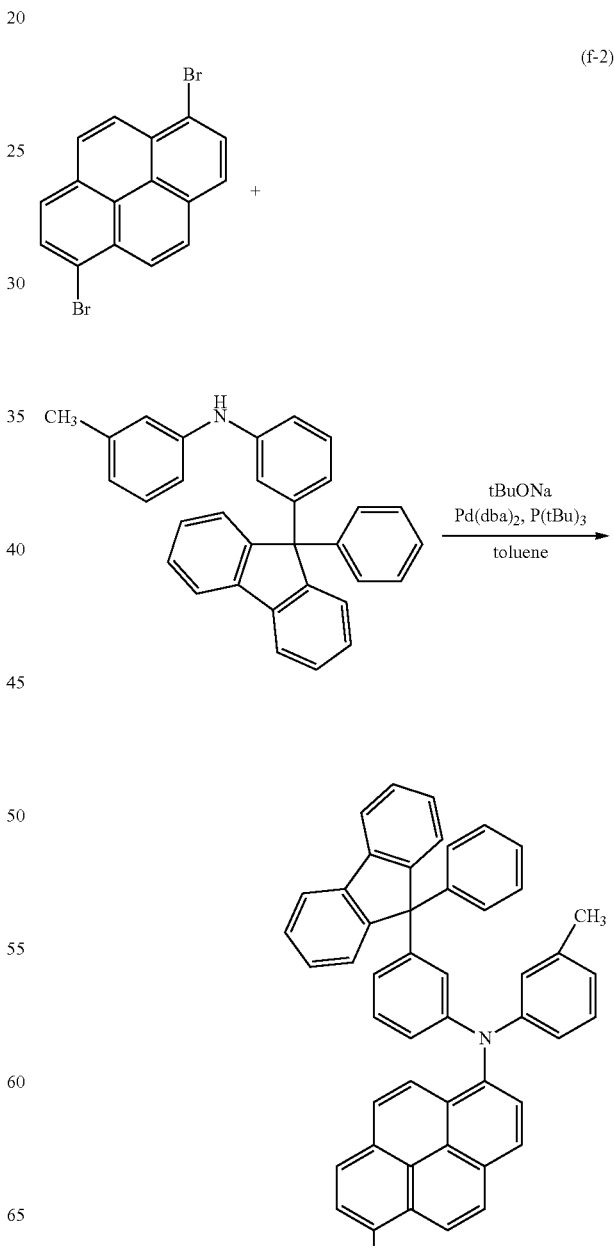

(f-2)

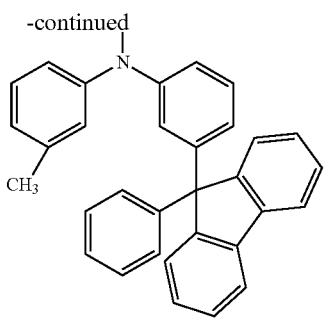

1,6mMemFLPAPrn

Figure 29A:
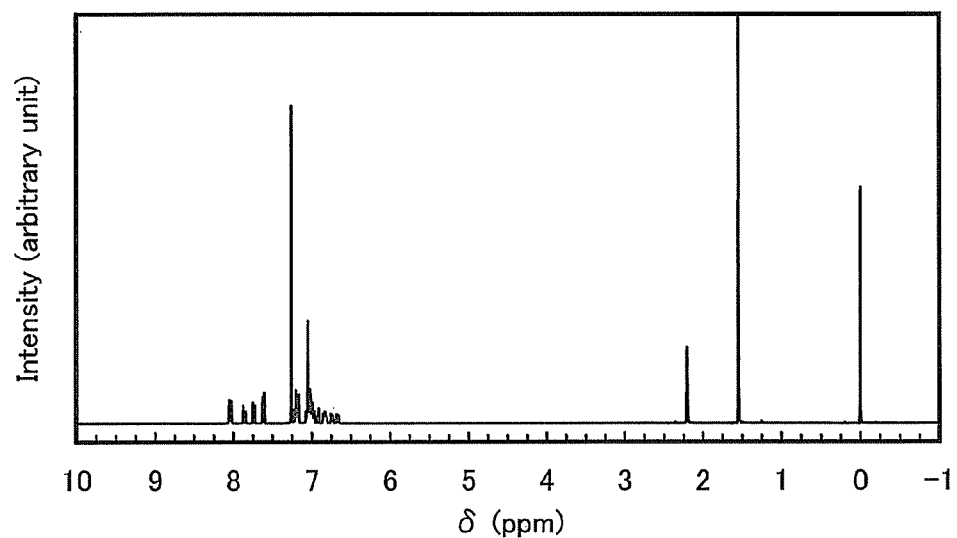
FIGS. 29A and 29B show $^1$H NMR charts of 1,6mMem-FLPAPrn (abbreviation)
Figure 29B:
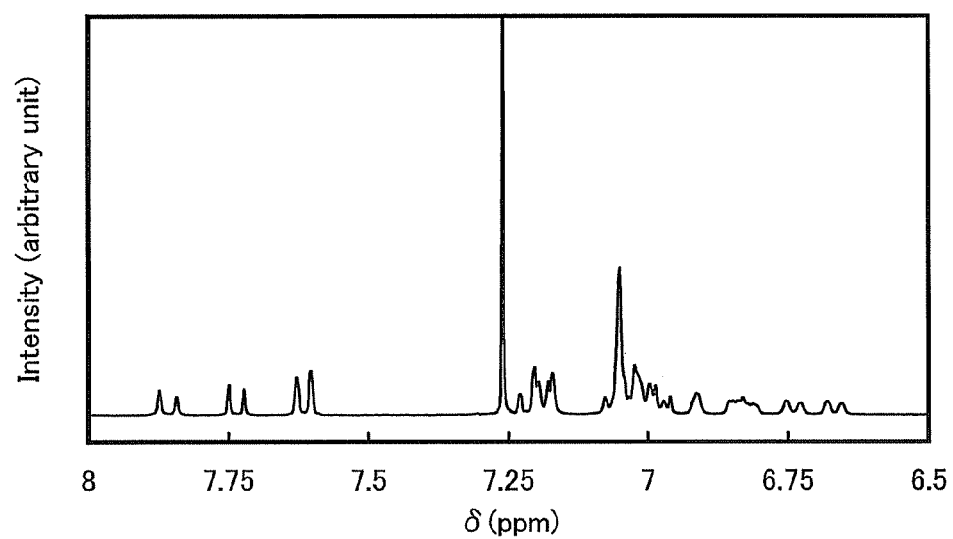

An analysis result by nuclear magnetic resonance spectrometry ($^1$H NMR) of the yellow powder obtained in Step 2 is described below. FIGS. 29A and 29B show the $^1$H NMR charts. These results confirmed that this compound was N,N'-bis(3-methylphenyl)-N,N'-bis[3-(9-phenyl-9H-fluoren-9-yl)phenyl]pyrene-1,6-diamine (abbreviation: 1,6mMemFLPAPrn), which was the objective substance.

$^1$H NMR (CDCl$_3$, 300 MHz): δ=2.21 (s, 6H), 6.67 (d, J=7.2 Hz, 2H), 6.74 (d, J=7.2 Hz, 2H), 7.17-7.23 (m, 34H), 7.62 (d, J=7.8 Hz, 4H), 7.74 (d, J=7.8 Hz, 2H), 7.86 (d, J=9.0 Hz, 2H), 8.04 (d, J=8.7 Hz, 4H).

Example 5

In Example 5, a synthesis example of (3-ethyl-2,4-pentanedionato)bis(4,6-diphenylpyrimidinato)iridium(III) (abbreviation: [Ir(dppm)$_2$(eacac)]), which is the phosphorescent organometallic iridium complex represented by Structural Formula (106) in Embodiment 1, is specifically described. A structure of [Ir(dppm)$_2$(eacac)] (abbreviation) is shown below.

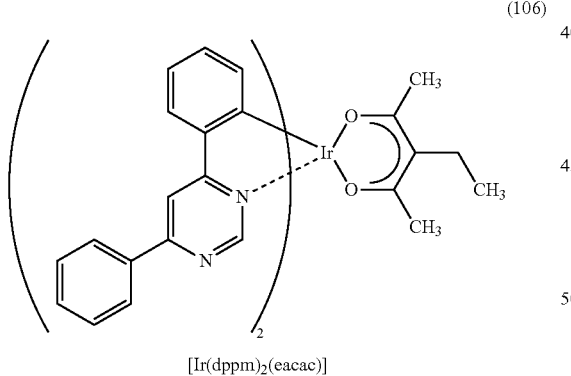

(106)

[Ir(dppm)$_2$(eacac)]

Step 1: Synthesis of (3-Ethyl-2,4-pentanedionato)bis(4,6-diphenylpyrimidinato)iridium(III) (abbreviation: [Ir(dppm)$_2$(eacac)])

First, into a recovery flask equipped with a reflux pipe were put 30 mL of 2-ethoxyethanol, 2.16 g of the dinuclear complex [Ir(dppm)$_2$Cl]$_2$, 2.00 g of 3-ethyl-2,4-pentanedione, and 3.40 g of sodium carbonate, and the air in the flask was replaced with nitrogen. This solution was stirred at room temperature for 48 hours and then heated at 100° C. for 13 hours. The solvent was distilled off, and ethanol was added to the obtained residue and suction filtration was carried out. The obtained solid was washed with water and then with ethanol, and recrystallized twice with a mixed solvent of dichloromethane and ethanol. The obtained solid was purified by flash column chromatography using dichloromethane as a developing solvent. After that, recrystallization was carried out with a mixed solvent of dichloromethane and ethanol, so that the phosphorescent organometallic iridium complex [Ir(dppm)$_2$(eacac)] (abbreviation) was obtained as orange powder (1% in yield). A synthesis scheme (g-1) of Step 1 is shown below.

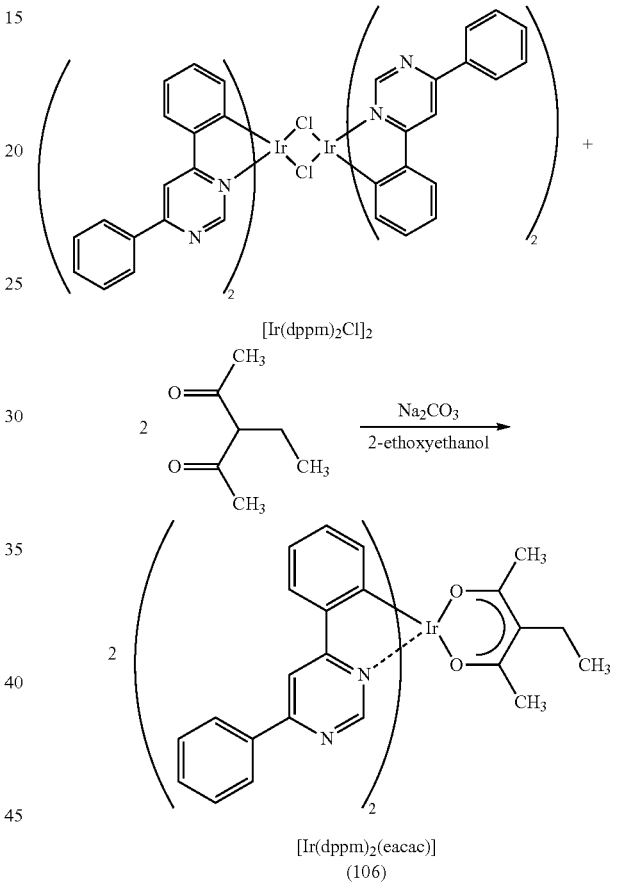

(g-1)

[Ir(dppm)$_2$(eacac)]
(106)

An analysis result by nuclear magnetic resonance spectrometry ($^1$H NMR) of the orange powder obtained in Step 1 is described below. The result revealed that the phosphorescent organometallic iridium complex [Ir(dppm)$_2$(eacac)] represented by Structural Formula (106), was obtained in Example 5.

$^1$H NMR. δ (CDCl$_3$): 1.04 (t, 3H), 1.95 (s, 6H), 2.27-2.30 (m, 2H), 6.46 (d, 2H), 6.79 (t, 2H), 6.89 (t, 2H), 7.56-7.62 (m, 6H), 7.78 (d, 2H), 8.18 (s, 2H), 8.24 (d, 4H), 9.18 (s, 2H).

Figure 31:
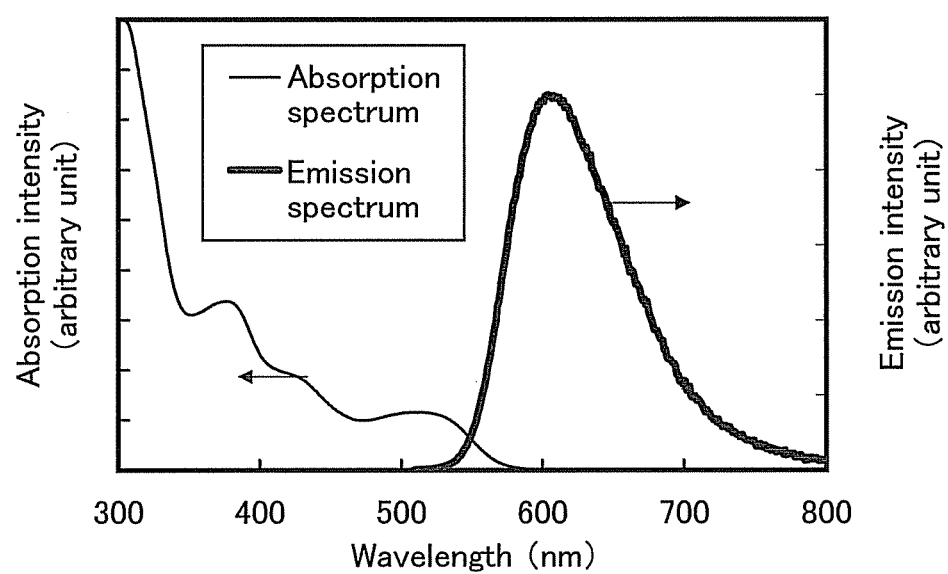
FIG. 31 shows an ultraviolet-visible absorption spectrum and an emission spectrum of a phosphorescent organometallic iridium complex represented by Structural Formula (106).

Next, [Ir(dppm)$_2$(eacac)] (abbreviation) was analyzed by ultraviolet-visible (UV) absorption spectroscopy. The UV spectrum was measured with an ultraviolet-visible spectrophotometer (V-550, produced by JASCO Corporation) using a dichloromethane solution (0.085 mmol/L) at room temperature. Further, an emission spectrum of [Ir(dppm)$_2$(eacac)] (abbreviation) was measured. The emission spectrum was measured by a fluorescence spectrophotometer (FS920, produced by Hamamatsu Photonics Corporation) using a degassed dichloromethane solution (0.085 mmol/L) at room temperature. FIG. 31 shows the measurement results. The horizontal axis represents wavelength and the vertical axes represent absorption intensity and emission intensity.

As shown in FIG. 31, the phosphorescent organometallic iridium complex [Ir(dppm)$_2$(eacac)] (abbreviation) has a peak of emission at 604 nm, and orange light was observed from the dichloromethane solution.

This application is based on Japanese Patent Application serial no. 2011-102566 filed with Japan Patent Office on Apr. 29, 2011, the entire contents of which are hereby incorporated by reference.

What is claimed is:

1. A light-emitting device comprising:
    a light-emitting layer comprising an iridium complex having a pyrimidine ligand, a first organic compound, and a second organic compound,
    wherein:
    the pyrimidine ligand has an aryl group at a 4-position,
    nitrogen at a 3-position of the pyrimidine ligand is coordinated to iridium;
    the pyrimidine ligand has an alkyl group or an aryl group at any one of a 2-position, a 5-position, and a 6-position;
    an ortho position of the aryl group which is bonded to the 4-position of the pyrimidine ligand is bonded to the iridium, and
    the first organic compound and the second organic compound are selected so as to form an exciplex.

2. The light-emitting device according to claim 1, wherein:
    the iridium complex is represented by any one of the following formulae:

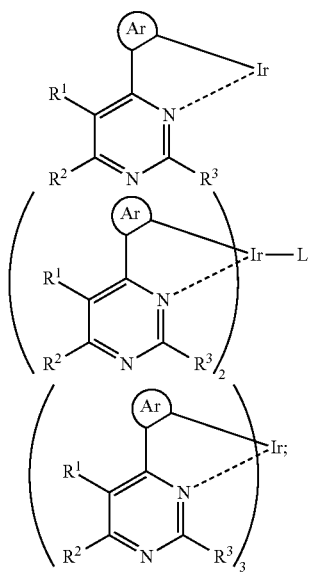

L represents a monoanionic ligand;
Ar represents a substituted or unsubstituted aryl group;
$R^1$ to $R^3$ separately represent any of hydrogen, a substituted or unsubstituted alkyl group having 1 to 4 carbon atoms, and a substituted or unsubstituted aryl group having 6 to 10 carbon atoms; and
at least one of $R^1$ to $R^3$ represents a substituted or unsubstituted alkyl group having 1 to 4 carbon atoms or a substituted or unsubstituted aryl group having 6 to 10 carbon atoms.

3. The light-emitting device according to claim 2, wherein:
    the monoanionic ligand is represented by any of the formulae (L1) to (L7):

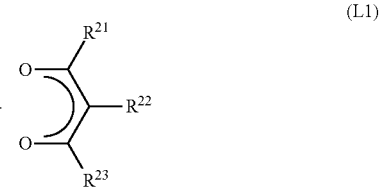
(L1)

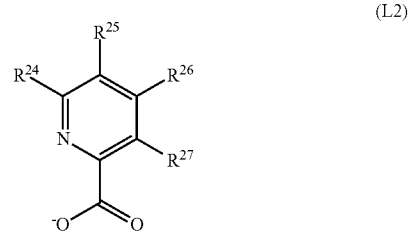
(L2)

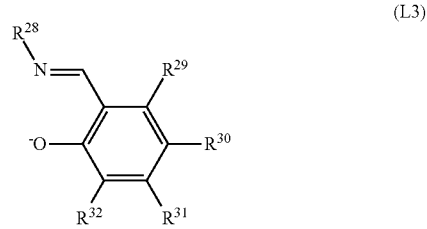
(L3)

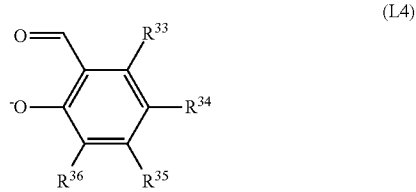
(L4)

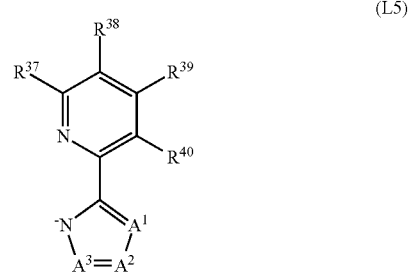
(L5)

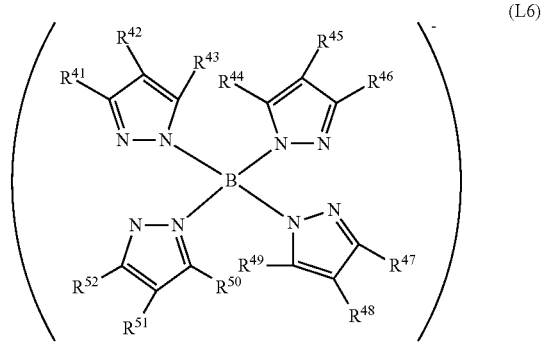
(L6)

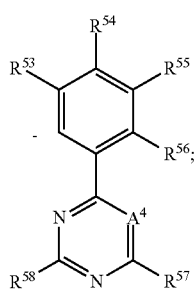

R²¹ to R⁵⁸ separately represent any of hydrogen, a substituted or unsubstituted alkyl group having 1 to 4 carbon atoms, a halogen group, a vinyl group, a substituted or unsubstituted haloalkyl group having 1 to 4 carbon atoms, a substituted or unsubstituted alkoxy group having 1 to 4 carbon atoms, and a substituted or unsubstituted alkylthio group having 1 to 4 carbon atoms; and A¹ to A⁴ separately represent any of nitrogen, sp² hybridized carbon bonded to hydrogen, and sp² hybridized carbon bonded to any of an alkyl group having 1 to 4 carbon atoms, a halogen group, a haloalkyl group having 1 to 4 carbon atoms, and a phenyl group.

4. The light-emitting device according to claim 1, wherein the iridium complex is represented by any one of the following formulae:

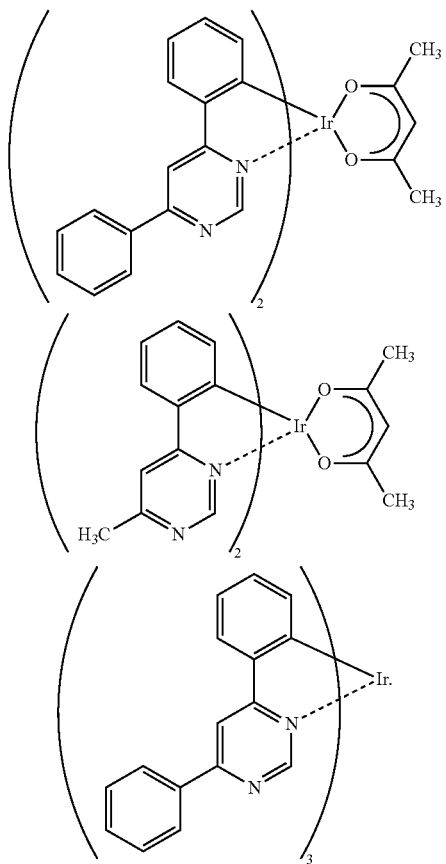

5. The light-emitting device according to claim 1, further comprising a second light-emitting layer.

6. The light-emitting device according to claim 1, further comprising:
a reflective electrode;
a transparent conductive layer over and in contact with the reflective electrode; and
a semi-transmissive and semi-reflective electrode over the transparent conductive layer,
wherein the light-emitting layer is located between the transparent conductive layer and the semi-transmissive and semi-reflective electrode.

7. The light-emitting device according to claim 6, further comprising a second light-emitting layer,
wherein the second light-emitting layer is located between the transparent conductive layer and the light-emitting layer or between the light-emitting layer and the semi-transmissive and semi-reflective electrode.

8. The light-emitting device according to claim 1, further comprising:
a first electrode;
a second light-emitting layer over the first electrode;
a charge-generation layer over the second light-emitting layer; and
a second electrode over the charge-generation layer,
wherein the light-emitting layer is located between the charge-generation layer and the second electrode.

9. An electronic device comprising the light-emitting device according to claim 1.

10. A lighting device comprising the light-emitting device according to claim 1.

11. A light-emitting device comprising:
a light-emitting layer comprising an iridium complex having a 1,3,5-triazine ligand, a first organic compound, and a second organic compound,
wherein:
the 1,3,5-triazine ligand has an aryl group at a 2-position;
nitrogen at a 1-position of the 1,3,5-triazine ligand is coordinated to iridium;
the 1,3,5-triazine ligand has a substituent at a 4-position or a 6-position;
an ortho position of the aryl group which is bonded to the 2-position of the 1,3,5-triazine ligand is bonded to the iridium, and
the first organic compound and the second organic compound are selected so as to form an exciplex.

12. The light-emitting device according to claim 11, wherein:
the iridium complex is represented by any one of the following formulae:

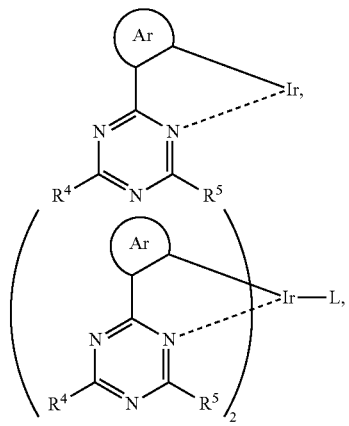

-continued

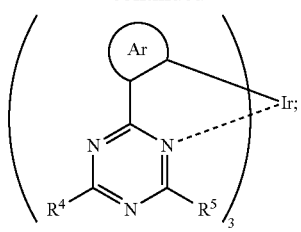

L represents a monoanionic ligand;

Ar represents a substituted or unsubstituted aryl group;

$R^4$ and $R^5$ separately represent any of hydrogen, a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms; and at least one of $R^4$ and $R^5$ represents any of a substituted or unsubstituted alkyl group having 1 to 4 carbon atoms, a substituted or unsubstituted alkoxy group having 1 to 4 carbon atoms, a substituted or unsubstituted alkylthio group having 1 to 4 carbon atoms, a halogen group, a substituted or unsubstituted haloalkyl group having 1 to 4 carbon atoms, and a substituted or unsubstituted aryl group having 6 to 10 carbon atoms.

13. The light-emitting device according to claim 12, wherein:

the monoanionic ligand is represented by any of the formulae (L1) to (L7):

(L1)

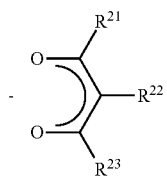

(L2)

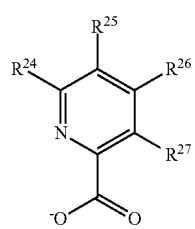

(L3)

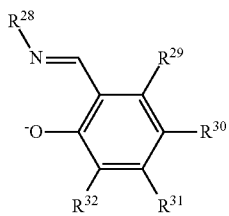

(L4)

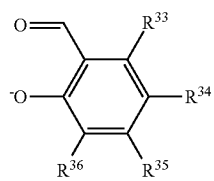

(L5)

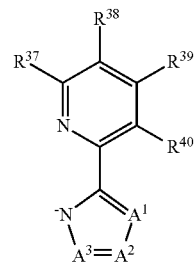

(L6)

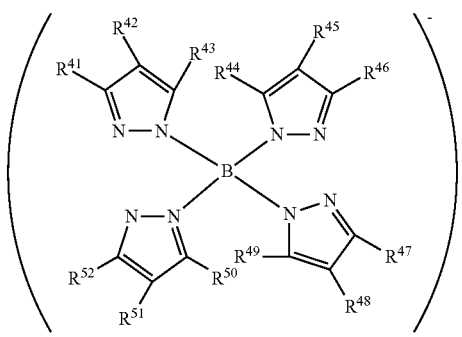

(L7)

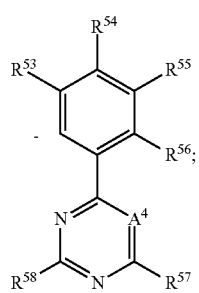

$R^{21}$ to $R^{58}$ separately represent any of hydrogen, a substituted or unsubstituted alkyl group having 1 to 4 carbon atoms, a halogen group, a vinyl group, a substituted or unsubstituted haloalkyl group having 1 to 4 carbon atoms, a substituted or unsubstituted alkoxy group having 1 to 4 carbon atoms, and a substituted or unsubstituted alkylthio group having 1 to 4 carbon atoms; and $A^1$ to $A^4$ separately represent any of nitrogen, $sp^2$ hybridized carbon bonded to hydrogen, and $sp^2$ hybridized carbon bonded to any of an alkyl group having 1 to 4 carbon atoms, a halogen group, a haloalkyl group having 1 to 4 carbon atoms, and a phenyl group.

14. The light-emitting device according to claim 11, wherein the iridium complex is represented by any of the following formulae:

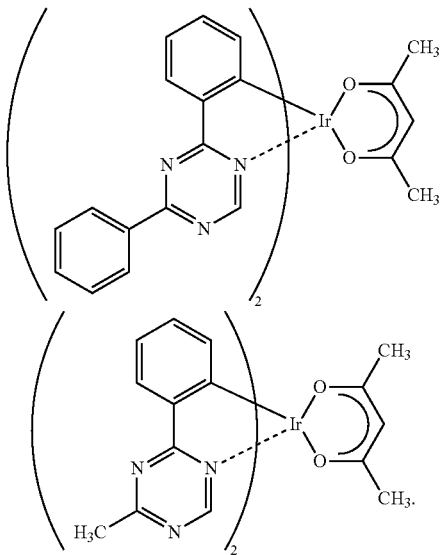

15. The light-emitting device according to claim 11, further comprising a second light-emitting layer.

16. The light-emitting device according to claim 11, further comprising:
    a reflective electrode;
    a transparent conductive layer over and in contact with the reflective electrode;
    a semi-transmissive and semi-reflective electrode over the transparent conductive layer,
    wherein the light-emitting layer is located between the transparent conductive layer and the semi-transmissive and semi-reflective electrode.

17. The light-emitting device according to claim 16, further comprising a second light-emitting layer,
    wherein the second light-emitting layer is located between the transparent conductive layer and the light-emitting layer or between the light-emitting layer and the semi-transmissive and semi-reflective electrode.

18. The light-emitting device according to claim 11, further comprising:
    a first electrode;
    a second light-emitting layer over the first electrode;
    a charge-generation layer over the second light-emitting layer; and
    a second electrode over the charge-generation layer,
    wherein the light-emitting layer is located between the charge-generation layer and the second electrode.

19. An electronic device comprising the light-emitting device according to claim 11.

20. A lighting device comprising the light-emitting device according to claim claim 11.

* * * * *

UNITED STATES PATENT AND TRADEMARK OFFICE
CERTIFICATE OF CORRECTION

PATENT NO. : 9,130,184 B2  
APPLICATION NO. : 13/457877  
DATED : September 8, 2015  
INVENTOR(S) : Satoshi Seo et al.

Page 1 of 2

It is certified that error appears in the above-identified patent and that said Letters Patent is hereby corrected as shown below:

In the Specification:

Column 3, Line 31; Change "below:" to --below.--.

Column 24, Line 43; Change "2[N" to --2-[N--.

Column 24, Line 47; Change "N,N-diphenyl" to --N,N'-diphenyl--.

Column 24, Line 54; Change "3[N" to --3-[N--.

Column 24, Line 60; Change "{4-[N-(" to --{4-[N'-(--.

Column 24, Line 60; Change ")-N-phenylamino]" to --)-N'-phenylamino]--.

Column 24, Line 62; Change "(4-diphenylaminophenye-N" to --(4-diphenylaminophenyl)-N--.

Column 26, Line 49; Change "(Spiro-" to --(spiro- --.

Column 30, Line 7; Change "((2m'+1))" to --((2m'+1)--.

Column 48, Line 11; Change "faulted." to --formed.--.

Column 51, Line 22; Change "549 μm," to --549 nm,--.

Column 51, Line 63; Change "iridium(II)" to --iridium(III)--.

Column 53, Line 22; Change "(IrCl$_3$.H$_2$O)" to --(IrCl$_3$ • H$_2$O)--.

Column 56, Line 21; Change "(IrCl$_3$.H$_2$O)" to --(IrCl$_3$ • H$_2$O)--.

Column 60, Line 23; Change "(IrCl$_3$.H$_2$O)" to --(IrCl$_3$ • H$_2$O)--.

Column 62, Line 63; Change "(IrCl$_3$.H$_2$O)" to --(IrCl$_3$ • H$_2$O)--.

Signed and Sealed this  
Ninth Day of August, 2016

Michelle K. Lee  
*Director of the United States Patent and Trademark Office*

CERTIFICATE OF CORRECTION (continued)
U.S. Pat. No. 9,130,184 B2

In the Claims:

Column 72, Lines 50 to 67, Claim 12;
Change

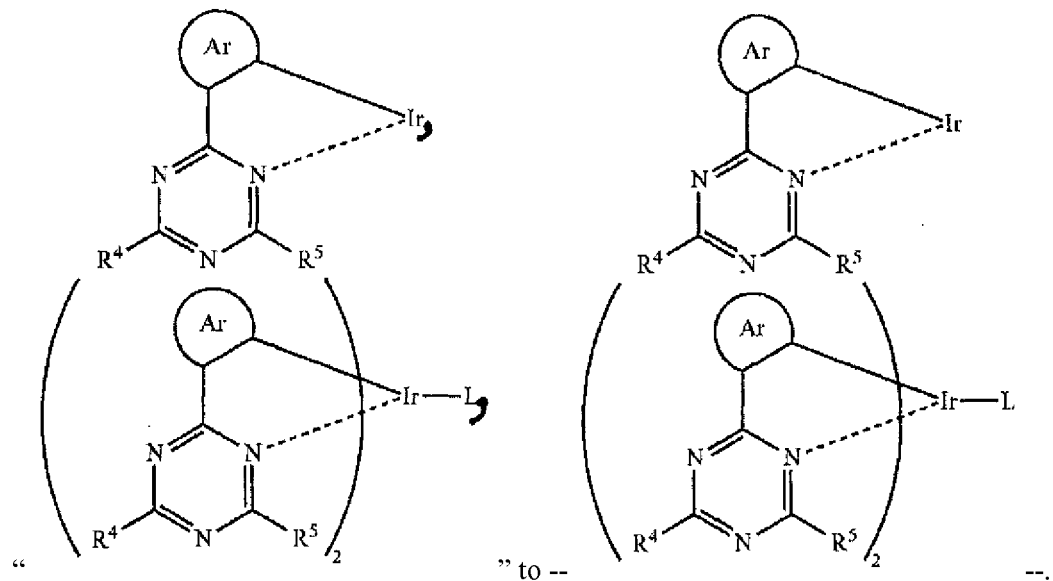

" to --                         --.